United States Patent
Tajalli et al.

(10) Patent No.: US 10,686,584 B2
(45) Date of Patent: *Jun. 16, 2020

(54) QUADRATURE AND DUTY CYCLE ERROR CORRECTION IN MATRIX PHASE LOCK LOOP

(71) Applicant: Kandou Labs, S.A., Lausanne (CH)

(72) Inventors: Armin Tajalli, Salt Lake City, UT (US); Amin Shokrollahi, Préverenges (CH)

(73) Assignee: Kandou Labs, S.A., Lausanne (CH)

( * ) Notice: Subject to any disclaimer, the term of this patent is extended or adjusted under 35 U.S.C. 154(b) by 0 days.

This patent is subject to a terminal disclaimer.

(21) Appl. No.: 16/268,307

(22) Filed: Feb. 5, 2019

(65) Prior Publication Data

US 2019/0182024 A1 Jun. 13, 2019

Related U.S. Application Data

(63) Continuation of application No. 15/791,373, filed on Oct. 23, 2017, now Pat. No. 10,200,188.

(Continued)

(51) Int. Cl.
*H04L 7/033* (2006.01)
*H03L 7/093* (2006.01)
(Continued)

(52) U.S. Cl.
CPC .............. *H04L 7/033* (2013.01); *H03L 7/083* (2013.01); *H03L 7/093* (2013.01); *H03L 7/0996* (2013.01); *H03L 7/0998* (2013.01)

(58) Field of Classification Search
CPC ......... H04L 7/033; H03L 7/033; H03L 7/083; H03L 7/093; H03L 7/0996; H03L 7/0998
See application file for complete search history.

(56) References Cited

U.S. PATENT DOCUMENTS 4,839,907 A 6/1989 Saneski
5,266,907 A 11/1993 Dacus
(Continued)

FOREIGN PATENT DOCUMENTS

CN 203675093 U 6/2014
EP 0740423 A2 10/1996

OTHER PUBLICATIONS

Loh, Mattew, et al., "A 3×9 Gb/s Shared, All-Digital CDR for High-Speed, High-Density I/O", IEEE Journal of Solid-State Circuits, vol. 47, No. 3, Mar. 2012, 641-651 (11 pages).

(Continued)

*Primary Examiner* — Janice N Tieu
(74) *Attorney, Agent, or Firm* — Invention Mine LLC

(57) ABSTRACT

Generating, at a plurality of delay stages of a local oscillator, a plurality of phases of a local oscillator signal, generating a loop error signal based on a comparison of one or more phases of the local oscillator signal to one or more phases of a received reference clock, generating a plurality of phase-specific quadrature error signals, each phase-specific quadrature error signal associated with a respective phase of the plurality of phases of the local oscillator signal, each phase-specific quadrature error signal based on a comparison of the respective phase to two or more other phases of the local oscillator signal, and adjusting each delay stage according to a corresponding phase-specific quadrature error signal of the plurality of phase-specific quadrature error signals and the loop error signal.

20 Claims, 33 Drawing Sheets

Related U.S. Application Data

(60) Provisional application No. 62/411,528, filed on Oct. 21, 2016.

(51) Int. Cl.
*H03L 7/083* (2006.01)
*H03L 7/099* (2006.01)

(56) References Cited

U.S. PATENT DOCUMENTS

| | | | |
|---|---|---|---|
| 5,528,198 | A | 6/1996 | Baba et al. |
| 5,602,884 | A | 2/1997 | Wieczorkiewicz et al. |
| 5,629,651 | A | 5/1997 | Mizuno |
| 5,802,356 | A | 9/1998 | Gaskins et al. |
| 6,026,134 | A | 2/2000 | Duffy et al. |
| 6,307,906 | B1 | 10/2001 | Tanji et al. |
| 6,316,987 | B1 | 11/2001 | Dally et al. |
| 6,380,783 | B1 | 4/2002 | Chao et al. |
| 6,389,091 | B1 * | 5/2002 | Yamaguchi ............ H03K 5/133 327/158 |
| 6,509,773 | B2 | 1/2003 | Buchwald et al. |
| 6,717,478 | B1 | 4/2004 | Kim et al. |
| 7,199,728 | B2 | 4/2007 | Dally et al. |
| 7,336,112 | B1 | 2/2008 | Sha et al. |
| 7,535,957 | B2 | 5/2009 | Ozawa et al. |
| 7,616,075 | B2 | 11/2009 | Kushiyama |
| 7,650,525 | B1 | 1/2010 | Chang et al. |
| 7,688,929 | B2 | 3/2010 | Co |
| 7,860,190 | B2 | 12/2010 | Feller |
| 8,036,300 | B2 | 10/2011 | Evans et al. |
| 8,253,454 | B2 | 8/2012 | Lin |
| 8,791,735 | B1 | 7/2014 | Shibasaki |
| 9,036,764 | B1 | 5/2015 | Hossain et al. |
| 9,059,816 | B1 | 6/2015 | Simpson et al. |
| 9,306,621 | B2 | 4/2016 | Zhang et al. |
| 9,374,250 | B1 | 6/2016 | Musah et al. |
| 9,397,868 | B1 | 7/2016 | Hossain et al. |
| 9,438,409 | B1 | 9/2016 | Liao et al. |
| 9,520,883 | B2 | 12/2016 | Shibasaki |
| 9,565,036 | B2 | 2/2017 | Zerbe et al. |
| 9,577,815 | B1 | 2/2017 | Simpson et al. |
| 9,602,111 | B1 | 3/2017 | Shen et al. |
| 9,906,358 | B1 | 2/2018 | Tajalli |
| 9,960,902 | B1 | 5/2018 | Lin et al. |
| 10,055,372 | B2 | 8/2018 | Shokrollahi |
| 2003/0001557 | A1 * | 1/2003 | Pisipaty ................. H03L 7/085 324/76.53 |
| 2003/0146783 | A1 | 8/2003 | Bandy et al. |
| 2004/0092240 | A1 | 5/2004 | Hayashi |
| 2005/0024117 | A1 | 2/2005 | Kubo et al. |
| 2005/0084050 | A1 | 4/2005 | Cheung et al. |
| 2005/0117404 | A1 | 6/2005 | Savoj |
| 2005/0128018 | A1 | 6/2005 | Meltzer |
| 2005/0201491 | A1 | 9/2005 | Wei |
| 2005/0220182 | A1 | 10/2005 | Kuwata |
| 2005/0275470 | A1 | 12/2005 | Choi |
| 2006/0140324 | A1 | 6/2006 | Casper et al. |
| 2006/0232461 | A1 | 10/2006 | Felder |
| 2007/0001713 | A1 | 1/2007 | Lin |
| 2007/0001723 | A1 | 1/2007 | Lin |
| 2007/0047689 | A1 | 3/2007 | Menolfi et al. |
| 2007/0147559 | A1 | 6/2007 | Lapointe |
| 2007/0201597 | A1 | 8/2007 | He et al. |
| 2008/0007367 | A1 | 1/2008 | Kim |
| 2008/0165841 | A1 | 7/2008 | Wall et al. |
| 2008/0181289 | A1 | 7/2008 | Moll |
| 2008/0317188 | A1 | 12/2008 | Staszewski et al. |
| 2009/0103675 | A1 | 4/2009 | Yousefi et al. |
| 2009/0167389 | A1 | 7/2009 | Reis |
| 2009/0195281 | A1 | 8/2009 | Tamura et al. |
| 2009/0231006 | A1 | 9/2009 | Jang et al. |
| 2009/0262876 | A1 | 10/2009 | Arima et al. |
| 2010/0156543 | A1 | 6/2010 | Dubey |
| 2010/0180143 | A1 | 7/2010 | Ware et al. |
| 2010/0220828 | A1 | 9/2010 | Fuller et al. |
| 2011/0002181 | A1 | 1/2011 | Wang et al. |
| 2011/0025392 | A1 | 2/2011 | Wu et al. |
| 2011/0156757 | A1 * | 6/2011 | Hayashi ............ G01R 31/31726 327/3 |
| 2011/0311008 | A1 | 12/2011 | Slezak et al. |
| 2012/0206177 | A1 | 8/2012 | Colinet et al. |
| 2012/0327993 | A1 | 12/2012 | Palmer |
| 2013/0088274 | A1 | 4/2013 | Gu |
| 2013/0091392 | A1 | 4/2013 | Valliappan et al. |
| 2013/0207706 | A1 | 8/2013 | Yanagisawa |
| 2013/0243127 | A1 | 9/2013 | Ito et al. |
| 2013/0271194 | A1 | 10/2013 | Madoglio et al. |
| 2013/0285720 | A1 | 10/2013 | Jibry |
| 2013/0314142 | A1 | 11/2013 | Tamura et al. |
| 2014/0286381 | A1 | 9/2014 | Shibasaki |
| 2015/0078495 | A1 | 3/2015 | Hossain et al. |
| 2015/0117579 | A1 | 4/2015 | Shibasaki |
| 2015/0180642 | A1 | 6/2015 | Hsieh et al. |
| 2015/0220472 | A1 | 8/2015 | Sengoku |
| 2015/0256326 | A1 | 9/2015 | Simpson et al. |
| 2016/0056980 | A1 | 2/2016 | Wang et al. |
| 2016/0134267 | A1 | 5/2016 | Adachi |
| 2017/0310456 | A1 | 10/2017 | Tajalli |
| 2018/0083763 | A1 | 3/2018 | Black et al. |
| 2018/0375693 | A1 | 12/2018 | Zhou et al. |

OTHER PUBLICATIONS

Riley, M. W., et al., "Cell Broadband Engine Processor: Design and Implementation", IBM Journal of Research and Development, vol. 51, No. 5, Sep. 2007, 545-557 (13 pages).

* cited by examiner

QUADRATURE AND DUTY CYCLE ERROR CORRECTION IN MATRIX PHASE LOCK LOOP

CROSS-REFERENCE TO RELATED APPLICATIONS

This application is a continuation of U.S. application Ser. No. 15/791,373, filed Oct. 23, 2017, entitled "Quadrature and Duty Cycle Error Correction in Matrix Phase Lock Loop", which claims the benefit of U.S. Provisional Application No. 62/411,528, entitled "Quadrature and Duty Cycle Error Correction in Matrix Phase Lock Loop," filed Oct. 21, 2016, all of which are herein incorporated by reference in their entirety for all purposes.

REFERENCES

The following prior applications are herein incorporated by reference in their entirety for all purposes:

U.S. Patent Publication 2011/0268225 of application Ser. No. 12/784,414, filed May 20, 2010, naming Harm Cronie and Amin Shokrollahi, entitled "Orthogonal Differential Vector Signaling" (hereinafter "Cronie I").

U.S. Patent Publication 2011/0302478 of application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II").

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III").

U.S. patent application Ser. No. 13/176,657, filed Jul. 5, 2011, naming Harm Cronie and Amin Shokrollahi, entitled "Methods and Systems for Low-power and Pin-efficient Communications with Superposition Signaling Codes" (hereinafter "Cronie IV").

U.S. patent application Ser. No. 13/542,599, filed Jul. 5, 2012, naming Armin Tajalli, Harm Cronie, and Amin Shokrollahi entitled "Methods and Circuits for Efficient Processing and Detection of Balanced Codes" (hereafter called "Tajalli I".)

U.S. patent application Ser. No. 13/842,740, filed Mar. 15, 2013, naming Brian Holden, Amin Shokrollahi and Anant Singh, entitled "Methods and Systems for Skew Tolerance in and Advanced Detectors for Vector Signaling Codes for Chip-to-Chip Communication", hereinafter identified as [Holden I];

U.S. Provisional Patent Application No. 61/946,574, filed Feb. 28, 2014, naming Amin Shokrollahi, Brian Holden, and Richard Simpson, entitled "Clock Embedded Vector Signaling Codes", hereinafter identified as [Shokrollahi I].

U.S. patent application Ser. No. 14/612,241, filed Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi II].

U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences", hereinafter identified as [Ulrich I].

U.S. patent application Ser. No. 14/816,896, filed Aug. 3, 2015, naming Brian Holden and Amin Shokrollahi, entitled "Orthogonal Differential Vector Signaling Codes with Embedded Clock", hereinafter identified as [Holden II].

U.S. patent application Ser. No. 14/926,958, filed Oct. 29, 2015, naming Richard Simpson, Andrew Stewart, and Ali Hormati, entitled "Clock Data Alignment System for Vector Signaling Code Communications Link", hereinafter identified as [Stewart I].

U.S. patent application Ser. No. 14/925,686, filed Oct. 28, 2015, naming Armin Tajalli, entitled "Advanced Phase Interpolator", hereinafter identified as [Tajalli II].

U.S. Provisional Patent Application No. 62/286,717, filed Jan. 25, 2016, naming Armin Tajalli, entitled "Voltage Sampler Driver with Enhanced High-Frequency Gain", hereinafter identified as [Tajalli III].

U.S. Provisional Patent Application No. 62/288,717, filed Apr. 22, 2016, naming Armin Tajalli, entitled "High Performance Phase Locked Loop", hereinafter identified as [Tajalli IV].

The following additional references to prior art have been cited in this application:

U.S. Pat. No. 6,509,773, filed Apr. 30, 2001 by Buchwald et al., entitled "Phase interpolator device and method" (hereafter called [Buchwald].

"Linear phase detection using two-phase latch", A. Tajalli, et al., IEE Electronic Letters, 2003, (hereafter called [Tajalli V].)

"A Low-Jitter Low-Phase-Noise 10-GHz Sub-Harmonically Injection-Locked PLL With Self-Aligned DLL in 65-nm CMOS Technology", Hong-Yeh Chang, Yen-Liang Yeh, Yu-Cheng Liu, Meng-Han Li, and Kevin Chen, IEEE Transactions on Microwave Theory and Techniques, Vol 62, No. 3, March 2014 pp. 543-555, (hereafter called [Chang et al.])

"Low Phase Noise 77-GHz Fractional-N PLL with DLL-based Reference Frequency Multiplier for FMCW Radars", Herman Jalli Ng, Rainer Stuhlberger, Linus Maurer, Thomas Sailer, and Andreas Stelzer, Proceedings of the 6th European Microwave Integrated Circuits Conference, 10-11 Oct. 2011, pp. 196-199, (hereafter called [Ng et al.])

"Design of Noise-Robust Clock and Data Recovery using an Adaptive-Bandwidth Mixed PLL/DLL", Han-Yuan Tan, Doctoral Thesis, Harvard University November 2006, (hereafter called [Tan]).

U.S. Pat. No. 7,492,850, filed Aug. 31, 2005 by Christian Ivo Menolfi and Thomas Helmut Toifl, entitled "Phase locked loop apparatus with adjustable phase shift" (hereafter called [Menolfi].)

"A Calibration-Free Fractional-N Ring PLL Using Hybrid Phase/Current-Mode Phase Interpolation Method", by Romesh Kumar Nandwana et al, IEEE Journal of Solid-State Circuits Vol. 50, No. 4, April 2015, ppg. 882-895, (hereafter called [Nandwana].)

FIELD OF THE INVENTION

The present invention relates to communications systems circuits generally, and more particularly to obtaining a stable, correctly phased receiver clock signal from a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device must be sampled (or their signal value otherwise recorded) at intervals best representing the original transmitted values, regardless of transmission channel delays, interference, and noise. This Clock and Data Recovery (CDR) not only must determine the appropriate sample timing, but must continue to do so continuously, providing dynamic compensation for varying signal propagation conditions.

Many known CDR systems utilize a Phase-Locked Loop (PLL) or Delay-Locked Loop (DLL) to synthesize a local receive clock having an appropriate frequency and phase for accurate receive data sampling.

BRIEF DESCRIPTION

Methods and systems are described for generating, at a plurality of delay stages of a local oscillator, a plurality of phases of a local oscillator signal, providing the plurality of phases of the local oscillator signal to a loop error matrix phase comparator and responsively generating a loop error signal based on a comparison of one or more phases of the local oscillator signal to one or more phases of a received reference clock, providing the plurality of phases of the local oscillator signal to an interphase matrix phase comparator and responsively generating a plurality of phase-specific quadrature error signals, each phase-specific quadrature error signal associated with a respective phase of the plurality of phases of the local oscillator signal, each phase-specific quadrature error signal based on a comparison of the respective phase to two or more other phases of the local oscillator signal, and adjusting each delay stage according to a corresponding phase-specific quadrature error signal of the plurality of phase-specific quadrature error signals and the loop error signal.

To reliably detect the data values transmitted over a communications system, a receiver must accurately measure the received signal value amplitudes at carefully selected times. Various methods are known to facilitate such receive measurements, including reception of one or more dedicated clock signals associated with the transmitted data stream, extraction of clock signals embedded within the transmitted data stream, and synthesis of a local receive clock from known attributes of the communicated data stream.

In general, the receiver embodiments of such timing methods are described as Clock-Data Recovery (CDR), often based on Phase-Lock Loop (PLL) or Delay-Locked Loop (DLL) synthesis of a local receive clock having the desired frequency and phase characteristics.

In both PLL and DLL embodiments, a Phase Detector compares the relative phase (and in some variations, the relative frequency) of a received reference signal and a local clock signal to produce an error signal, which is subsequently used to correct the phase and/or frequency of the local clock source and thus minimize the error. As this feedback loop behavior will lead to a given PLL embodiment producing a fixed phase relationship (as examples, 0 degrees or 90 degrees of phase offset) between the reference signal and the local clock, an additional fixed or variable phase adjustment is often introduced to permit the phase offset to be set to a different desired value (as one example, 45 degrees of phase offset) to facilitate receiver data detection.

Embodiments are described in which the Phase Detection and phase adjustment elements are combined, leading to lower circuit node capacitance and reduced circuit delays, these improvements in turn enabling increased loop stability and improved PLL lock characteristics, including increased loop lock bandwidth leading to lower clock jitter and improved power supply noise rejection.

Embodiments are also described in which a Delay-Locked Loop is used to convert the received reference clock signal into multiple reference clock phases, converting the PLL phase comparison operation into multiple comparisons made between a reference clock phase and a local clock phase. A summation or weighted summation of the multiple comparison results is then used as the error feedback signal for the PLL. A further embodiment is described in which multiple comparisons are made between a single received reference clock phase and multiple local clock phases, with the weighted sum of the multiple comparison results used as the error feedback term for the PLL. In at least one such further embodiment, said weighted sums comprise a two dimensional time domain filter.

DETAILED DESCRIPTION

Figure 1:
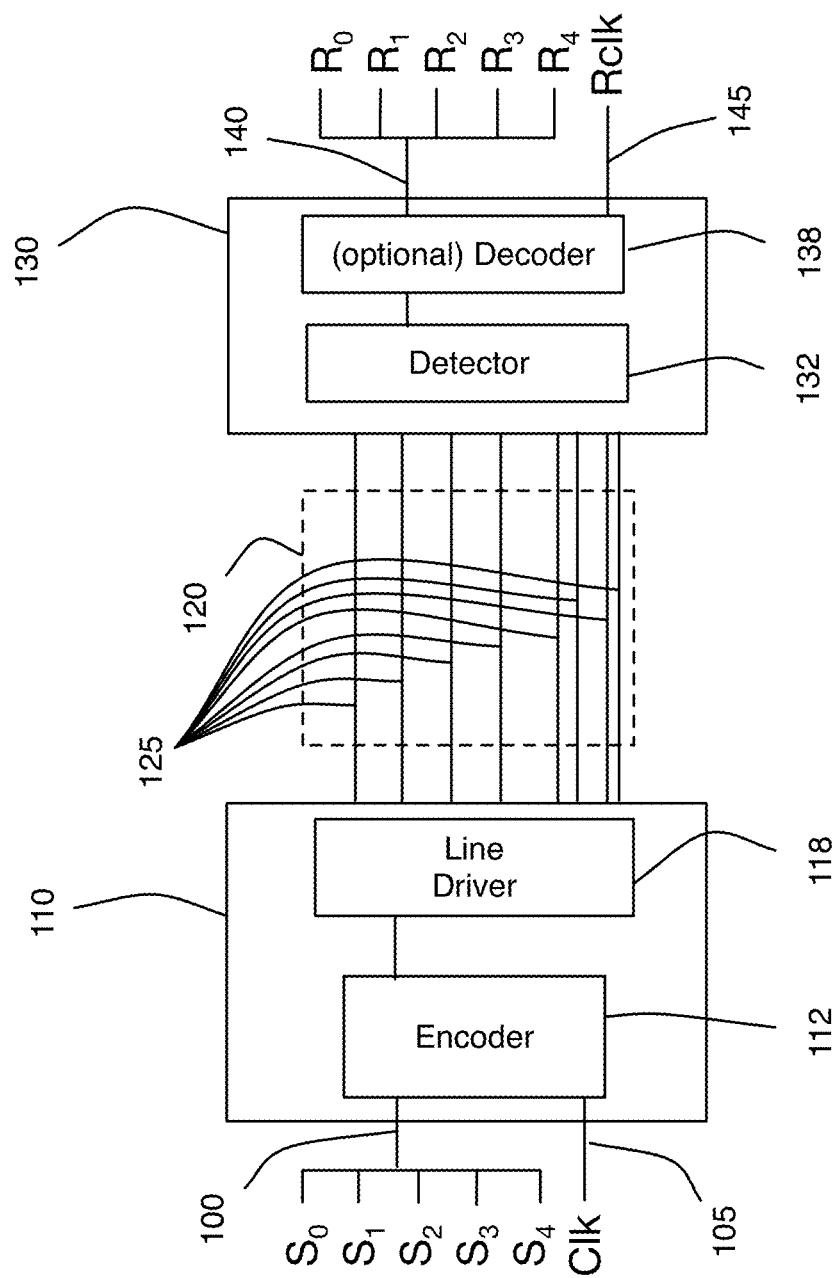
FIG. 1 is a block diagram of one embodiment capable of encoding and transmitting five data bits and a clock on an eight wire communications channel.

As described in [Cronie I], [Cronie II], [Cronie III] and [Cronie IV], vector signaling codes may be used to produce extremely high bandwidth data communications links, such as between two integrated circuit devices in a system. As illustrated by the embodiment of FIG. 1, multiple data communications channels transmit symbols of the vector signaling code, acting together to communicate codewords of the vector signaling code. Depending on the particular vector signaling code used, the number of channels comprising a communications link may range from two to eight or more, and may also communicate one or more clock signals on separate communications channels or as subchannel components of the vector signaling code. In the example of FIG. 1, communication link 120 is illustrated as being composed of eight wires 125, collectively communicating five data values 100 and one clock 105 between transmitter 110 and receiver 130. The input data values 100 are encoded using an encoder 112, and driven onto the communication link 120 by line driver 118. The symbols of the codeword are detected using a detector 132 within receiver 130, and in some embodiments decoded 138 to produce received data 140 and receive clock 145.

Individual symbols, e.g. transmissions on any single communications channel, may utilize multiple signal levels, often three or more. Operation at channel rates exceeding 10 Gbps may further complicate receive behavior by requiring deeply pipelined or parallelized signal processing, precluding reception methods that include the previous received value to be known as the current value is being received.

Embodiments described herein can also be applied to prior art permutation sorting methods not covered by the vector processing methods of [Cronie II], [Cronie III], [Cronie IV], and/or [Tajalli I]. More generally, embodiments may apply to any communication or storage methods requiring coordination of multiple channels or elements of the channel to produce a coherent aggregate result.

Receiver Data Detection

To provide context for the following examples, one typical high-speed receiver embodiment [Stewart I] is used for illustrative purposes, without limitation.

Figure 2:
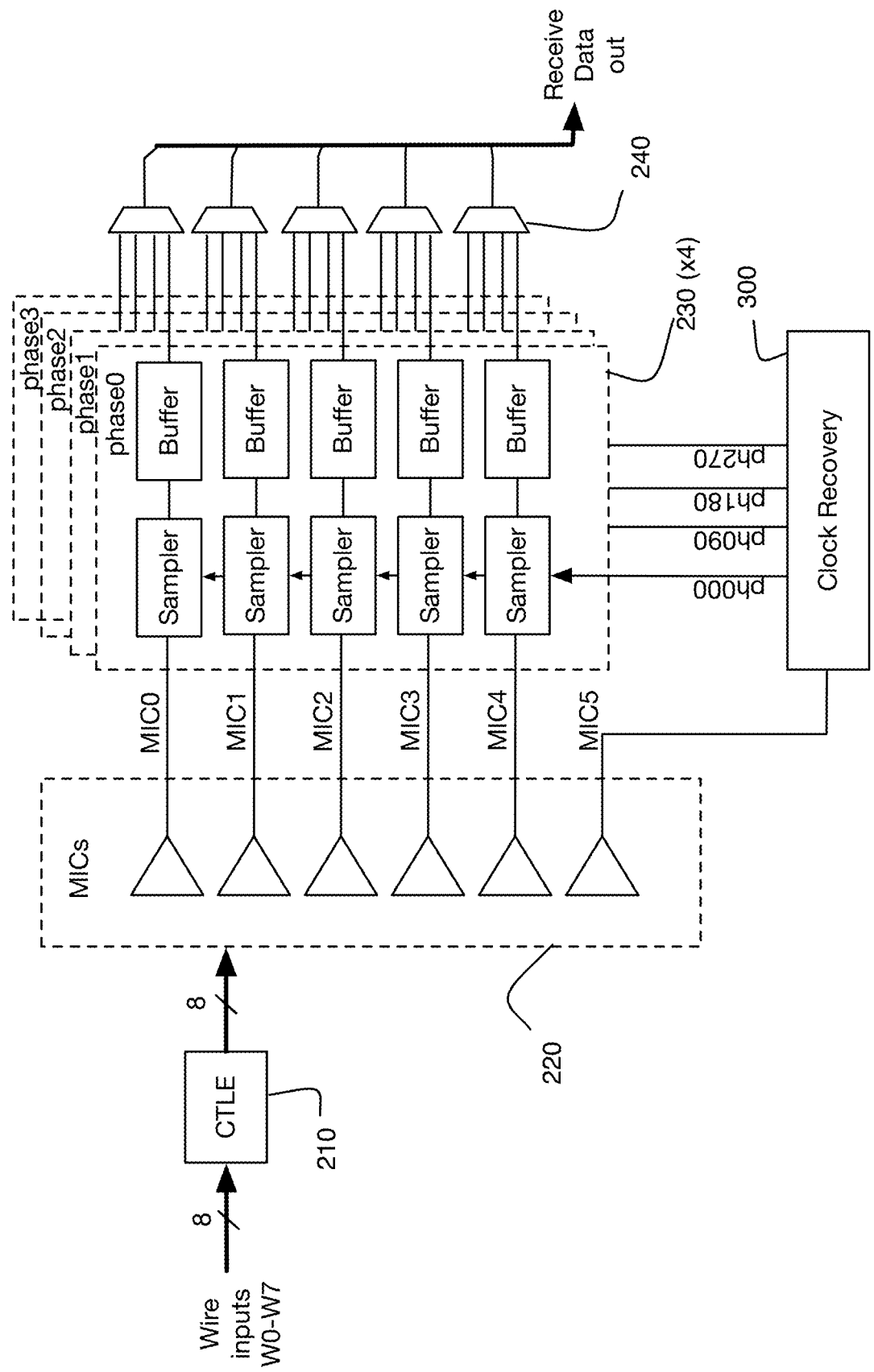
FIG. 2 is a block diagram of one embodiment of a receiver compatible with the transmitter of FIG. 1.

As illustrated in FIG. 2, the example data receiver includes eight identical Continuous Time Linear Equalization (CTLE) stages 210 operating on the signals received on the eight wires, previously shown as 120 in FIG. 1.

As described in [Tajalli I], [Holden I] and [Ulrich I], vector signaling codes may be efficiently detected by linearly combining sets of input signals using Multi-Input comparators or mixers (MIC). For the 5b6w code used by the example receiver, five such mixers acting on weighted subsets of the six received data input signals will detect the five data bits without need of further decoding. One additional mixer acting on combinations of the two received clock signals will similarly detect the clock signal. In FIG. 2, this set of six MIC mixers 220 operate on the received and equalized signals to produce detected signals MIC0-MIC5.

Because of the high data rates involved, multiple parallel phases of receive processing are shown in the example receiver. In one embodiment, the five detected data signals MIC0-MIC4 are processed in four parallel phases of receive data processing, each phase 230 including five data samplers and subsequent buffering, followed by recombination of the four phase outputs into a received data stream, shown in FIG. 2 as being performed by multiplexers 240.

Clock Recovery circuits (also known in the art as Clock Data Recovery or CDR) support such sampling measurements by extracting timing information, either from the data lines themselves or from dedicated clock signal inputs, and utilize that extracted information to generate clock signals to control the time interval used by the data line sampling device(s). The actual clock extraction may be performed using well known circuits such as a Phase Locked Loop (PLL) or Delay Locked Loop (DLL), which in their operation may also generate higher frequency internal clocks, multiple clock phases, etc. in support of receiver operation. In the embodiment of FIG. 2, the detected clock signal is obtained at MIC5 and processed 300 to extract properly timed sampling clocks for the four data phases.

PLL Overview

Phase Locked Loops are well represented in the literature. A typical PLL is composed of a phase detector that compares an external reference signal to an internal clock signal, a low pass filter that smooths the resulting error value to produce a clock control signal, and a variable frequency clock source (typically, a Voltage Controlled Oscillator or VCO) controlled by the smoothed error value, producing the internal clock signal presented to the phase detector. In a well-know variation, such a PLL design may incorporate a clock frequency divider between the VCO and the phase detector, allowing a higher-frequency clock output to be phase locked to a lower-frequency reference signal.

In an alternative embodiment, the variable frequency clock source is replaced by a variable delay element, its (optionally multiple tapped) outputs thus representing one or more successive time-delayed versions of the original input signal rather than successive cycles of an oscillator to be phase compared to the reference input signal. For the purposes of this document, such Delay Locked Loops (DLL) are considered functionally equivalent to a PLL in such an application, particularly in regard to composed elements of phase detector, phase interpolator, and charge pump.

Numerous forms of phase detectors are known to the art. A simple XOR gate as in FIG. 4A may be used to compare, as a non-limiting example, two square wave signals. One familiar with the art will observe that such a digital XOR output will be a variable-duty-cycle waveform which, when low pass filtered into an analog error signal, results in a proportional error signal centered in its analog signal range when the two input signals have a 90 degree phase offset relationship.

Figure 4A:
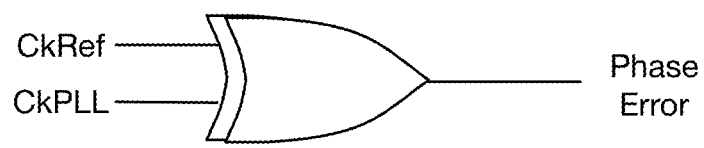
FIGS. 4A, 4B, and 4C show three Phase Detector embodiments suitable for use in a Phase Locked Loop element of a clock recovery circuit.
Figure 4B:
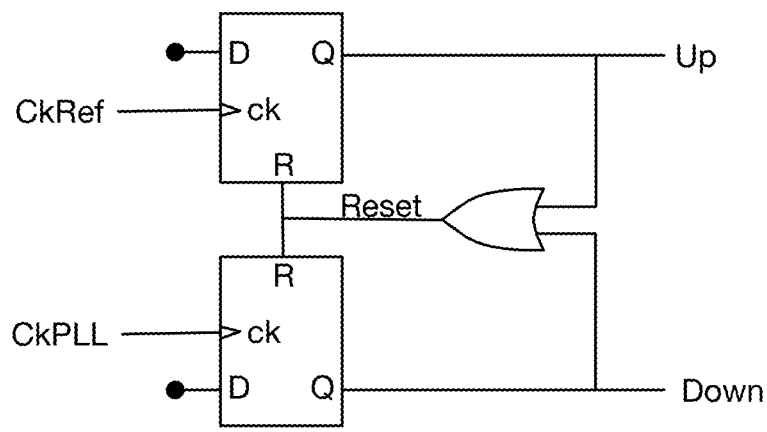

The more complex state machine phase detector of FIG. 4B is composed of two edge-triggered latches clocked respectively by the reference and internal clock signals, with the first received clock edge initiating an output signal on one of the "early" or "late" outputs. Either output becoming active will subsequently cause the latches to reset in anticipation of the next comparison interval. Alternative embodiments may incorporate a timing delay in this reset path to provide additional control of the reset pulse timing. The "late" and "early" phase comparison outputs are typically accepted as "pump up" and "pump down" inputs to a charge pump, the output of which is the analog error value. That is, a pump up signal may turn on a first transistor circuit that provides charge to capacitor thereby increasing the analog voltage, while a pump down signal may turn on a second transistor circuit that removes charge from a capacitor, thereby reducing the voltage. A zero degree phase offset between the two input clock signals will thus leave the analog error value unchanged and the PLL in a stable locked condition. A number of equivalent state machine phase detector embodiments are known in the art, and are equally applicable in this application, without implication of limitation. Some state machine embodiments may be sensitive to both phase and frequency differences between the input signals, facilitating more rapid PLL lock acquisition on startup.

Figure 4C:
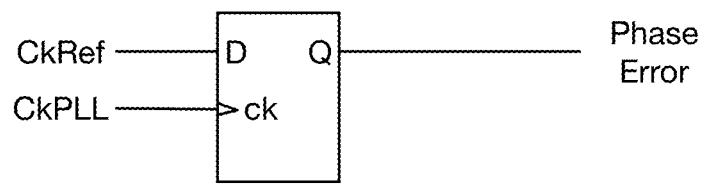

As shown in FIG. 4C, a simple edge-clocked "D" flip-flop may also be used as a phase detector. At each rising local clock edge (CkPLL), the D input samples the state of the (in this example, square wave) reference input (CkRef); if it is high (e.g. it has already transitioned,) the Q output is high indicating the reference is "early", if it is low (e.g. it has not yet transitioned,) Q is low indicating the reference is "late". This so-called "bang/bang" phase detector provides a less nuanced error result than the previous example, thus may utilize more sophisticated filtering to obtain loop stability.

As will be recognized by those familiar with the art, comparable functional operation may be obtained regardless of the phase detector type incorporated in a PLL design, thus to first approximation phase detector choice is not limiting. Secondary design behaviors, including lock time, stability, power consumption, etc. must also be considered as part of the design process.

Receiver Clock Recovery

Figure 3:
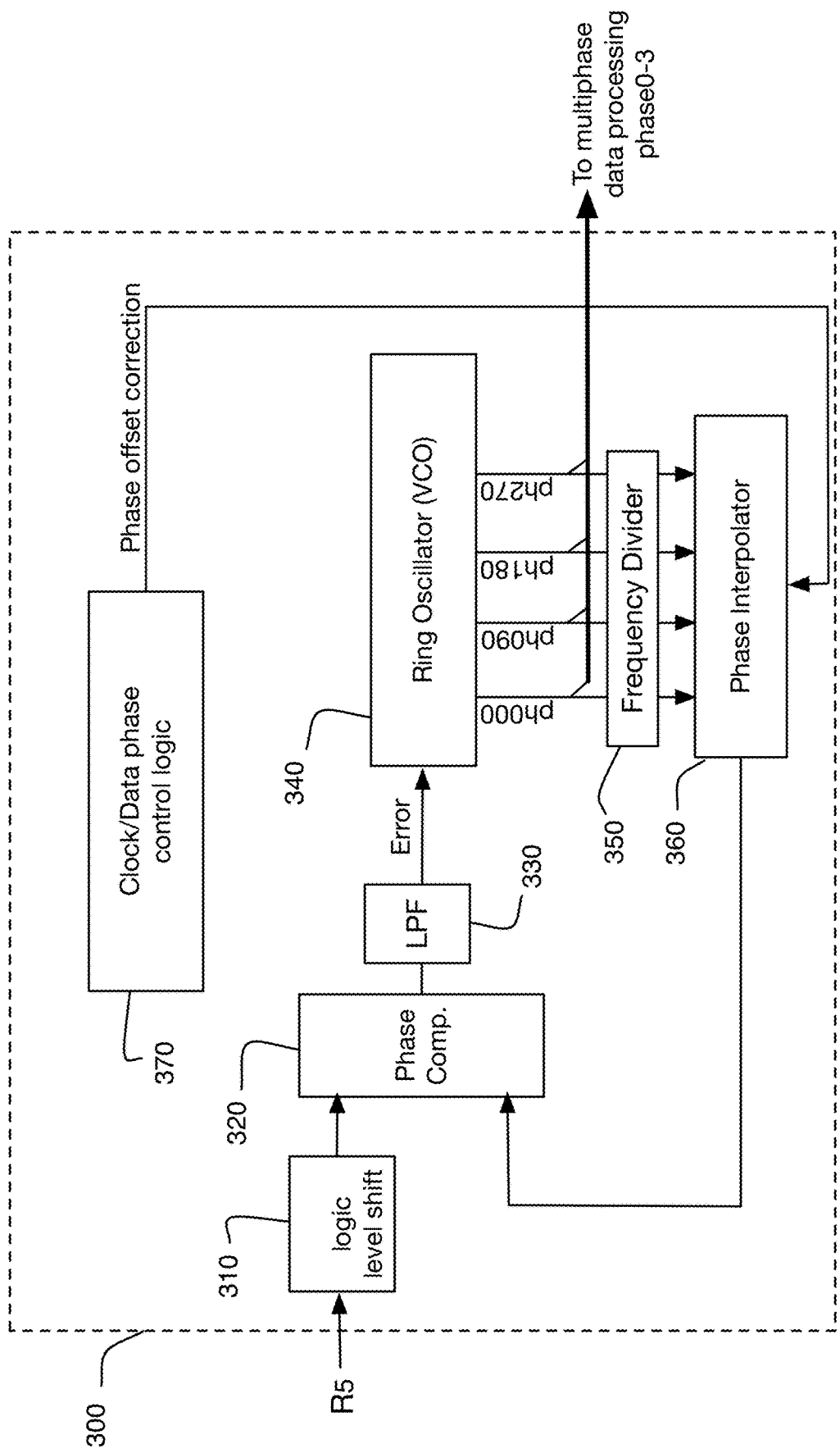
FIG. 3 is a block diagram detailing one embodiment of the clock recovery circuit used by the receiver of FIG. 2.

The example receiver utilizes a PLL embodiment as shown in FIG. 3. This PLL accepts the received clock signal R5 as the reference to which its clocks will be phased locked. In some embodiments, logic level shift 310 is used if appropriate to interface between the signal levels provided by the detecting MIC and the preferred phase comparator input levels. Phase Comparator 320 compares the reference clock to an internal clock derived from the VCO, producing an output which is low pass filtered to provide an Error value which subsequently corrects the operating frequency of VCO 340. In some embodiments, the outputs of Phase Comparator 320 is a digital waveform requiring conversion to an analog error signal, either through implicit or explicit digital to analog conversion, or by use of an interface element such as a charge pump. Some embodiments may combine such conversion with all or part of the low pass filtering operation, as one example offered without limitation, by the digital filtering behavior shown by the switching action of a charge pump directed by digital control signals generating an analog signal output.

In one embodiment, a ring oscillator 340 composed of a sequence of identical gates in a closed loop is used as the internal Voltage Controlled Oscillator (VCO) timing source for the PLL. The VCO frequency is varied by analog adjustment of at least one of: gate propagation delay, inter-gate rise and fall time, and gate switching threshold within the ring oscillator. This may be implemented via switched capacitor banks, where a digital control signal is applied to selective place capacitive elements in parallel and/or series combinations to alter an RC time constant, as one non-limiting example. Still further, a current source that drives a gate of the ring oscillator may be increased or decreased to alter the output switching rise-time/fall-time, and thereby adjust the effective delay. Outputs taken at equal intervals (i.e. separated by equal numbers of ring oscillator gates) along the sequence of gates comprising the ring oscillator provide the four data phase sampling clocks, herein identified as the 0, 90, 180, and 270 degree clocks.

In one embodiment, the ring oscillator is composed of eight identical sets of logic gates (e.g., a set of inverter circuits), thus the phase difference from one such set to the next is 45 degrees. In this embodiment, the 0, 90, 180, and 270 degree outputs may be obtained, as examples, from the second, fourth, sixth, and eighth outputs. As these clocks are cyclical, the final tap may be considered as logically adjacent to the initial tap, a 0 degree and a 360 degree phase offset being equivalent. As many variations of such designs are known in the art, neither the number of elements in the ring oscillator nor the specific taps at which particular outputs are made should be construed as implying a limitation. As one example, the location of the 0 degree tap is arbitrary, as one familiar with the art will recognize that normal PLL behavior will phase align the ring oscillator with the external phase reference regardless of its initial phase. Similarly, equivalent designs may be obtained in which the output clock phases do not have square wave duty cycles; as one example being produced by the action of AND or OR gates with inputs from different tap locations. In the example receiver, it is desired that the VCO operate at a multiple of the received reference clock frequency, thus Frequency Divider 350 divides the VCO outputs by a comparable amount prior to the Phase Detector. In one embodiment, binary (factor of two) dividers are used at 350 to obtain the correct sampling clock rate. In another embodiment, no divider is utilized and the VCO outputs are presented to the phase interpolator directly.

Each of the four phases of sampling clocks is appropriately timed to sample received data for one of the four parallel processing phases. In particular, internal clock ph000 is aligned to optimally trigger data samplers in the phase0 phase of processing, clock ph090 in phase1, clock ph180 in phase2, and clock ph270 in phase3.

To allow the overall phase of the locked PLL signals to be offset from the reference clock input phase, the local clock output presented to the phase comparator is obtained from phase interpolator 360, the output phase of which is controllably intermediate between its input clock phases. Thus, the PLL may lock with its fixed phase relationship, while the internal clock signals obtained from ring oscillator 340 will be offset from that fixed phase by the phase delay amount introduced by phase interpolator 360, as controlled by signal Phase offset correction provided by clock/data phase control logic 370. Phase interpolators are known in the art, examples being provided by [Buchwald I] and [Tajalli II].

In one embodiment, phase interpolator 360 receives multiple clock phases from the ring oscillator 340 having 90 degree phase differences. Said phase interpolator may be controlled to select two adjacent clock input phases and then to interpolate between them so as to produce an output at a chosen phase offset between those selected two values. For purposes of description, it may be assumed that a phase detector design is used which drives the PLL to lock with a zero phase differential between the two phase detector inputs. Thus, continuing the example, applying the 0 and 90 degree clock phases as inputs to the phase interpolator allows adjustment such that the PLL leads the reference clock input by between 0 and 90 degrees.

It will be apparent that equivalent results with comparable phase offsets may be obtained using other pairs of degree clocks and/or other phase detector designs, which as previously described may lock with different phase differentials than that of the present example. Thus neither the particular phase clocks chosen nor the particular phase detector design described herein are limiting.

In the known art, [Nandwana] describes a Fractional-N clock multiplying PLL in which a single reference clock is phase compared to two local clocks derived using different integer divisor ratios, with interpolation between the two phase error results dynamically chosen to cancel the phase quantization error.

Phase Detector with Interpolator

Figure 5:
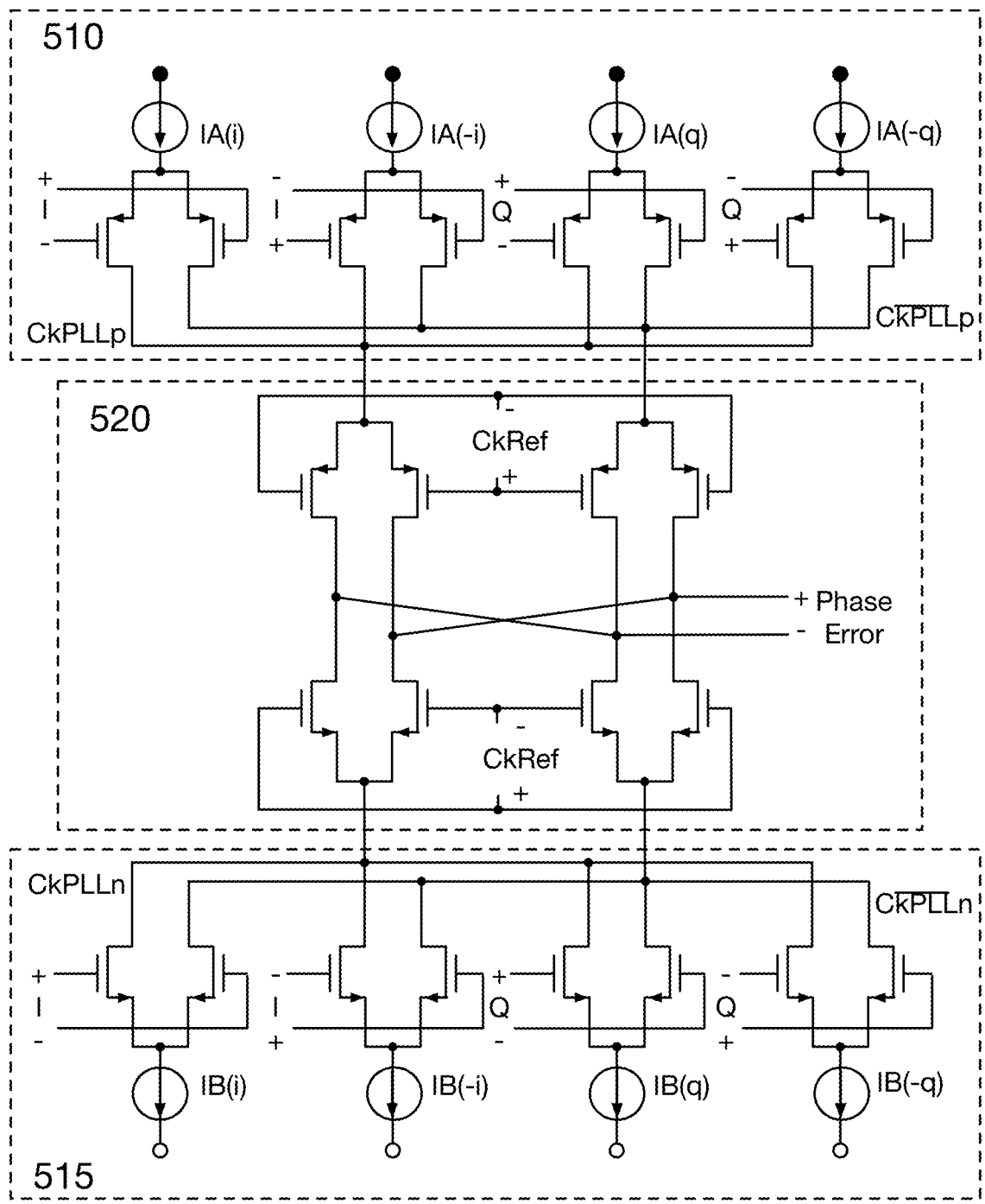
FIG. 5 is a schematic diagram of one embodiment integrating an XOR phase detector and clock phase interpolator.

As communication channel data rates increase, it becomes increasingly difficult to maintain acceptable PLL lock range and accuracy, as inherent and parasitic circuit node capacitances introduce circuit delays and constrain the effective loop response bandwidth. An embodiment providing improved response characteristics suitable for such high speed operation is illustrated in FIG. 5. As one familiar with the art will observe, this is a CMOS design providing symmetrical operation for both positive and negative output excursions, integrating elements of both phase interpolator and phase detector designs. This tight integration results in reduced node capacitances, facilitating the desirable high speed operation, and the balanced differential structure simplifies the control of charge and discharge currents.

As with conventional designs, the PLL VCO (or a clock divider driven by said VCO) provides the local oscillator inputs to phase interpolator elements 510 and 515, which together set the effective local clock phase. Four local oscillator phases with 90 degree offset are shown i.e. equivalent to two phases in quadrature relationship and their complimentary signals and thus identified as +I, +Q, and −I, −Q, permitting a full 360 degree or "four quadrant" phase adjustment. Other embodiments may utilize as few as two local oscillator phases, may use oscillator phases having other than 90 degree phase differences, or may select clock phases from an input set of more than four; as one non-limiting example, choosing at least two clock phases to be interpolated between from an input set of eight clock phases.

In a first embodiment, phase interpolator element 510 includes four mixing elements, each mixing element comprising a differential transistor pair and a controlled current source, with a common differential output driven by the four mixing elements in parallel. Thus, configuration of current source IA(i) controls the amount of local oscillator phase +I presented to the common output ckp; similarly, current source IA(−i) controls the amount of complimentary output phase −I in the output, IA(q) controls the amount of +Q, and IA(−q) controls the amount of −Q. It will be readily apparent to one familiar with the art that configuration of the four current sources can produce an output clock at Ckp having any desired phase relationship to the PLL local clock input.

Similarly, phase interpolator element 515 current sources IB(i), IB(−i), IB(q), and IB(−q) may be configured to obtain an output clock at Ckn having any desired phase relationship to the PLL local clock input. Typically, CkPLLp and CkPLLn will be configured to have complimentary relationships so as to provide phase detector 520 with balanced and complimentary positive- and negative-going current amplitudes. However, configuration with non-complimentary IA and IB values may be performed to obtain particular results. As one example offered without limitation, an embodiment separately adjusting IA and IB values might obtain higher resolution phase adjustment, compared to an embodiment maintaining perfectly complimentary IA and IB values.

The second input to the Phase Detector 520 is external reference clock CkRef+/CkRef−, producing the phase error output currents VCOctl+/VCOctl−. In one advanced embodiment, the two external reference clocks are of opposing polarity but not necessarily complementary phase, thus the positive polarity comparison and negative polarity comparison represent different phase comparisons. Such an advanced embodiment may be combined with non-complimentary IA and IB bias configurations, providing independent adjustment of local clock phase during those different phase comparisons. That is, in one embodiment, the CkRef input at the top of PD 520 is a first phase selected from the reference clock phases available in the circuit, and the IA currents are adjusted to provide a corresponding interpolated phase offset from the first selected phase, and the CkRef input at the bottom of PD 520 is a second phase selected from the reference clock phases available in the circuit, and the IB currents are adjusted to provide a corresponding interpolated phase offset from the second selected phase, wherein the amount of the relative phase offsets are the same.

Configuration of phase interpolator current source values may be performed by external control logic, including without limitation, a hardware configuration register, control processor output register, and hardware CDR adjustment logic.

Alternative Phase Detector Embodiments

Figure 12A:
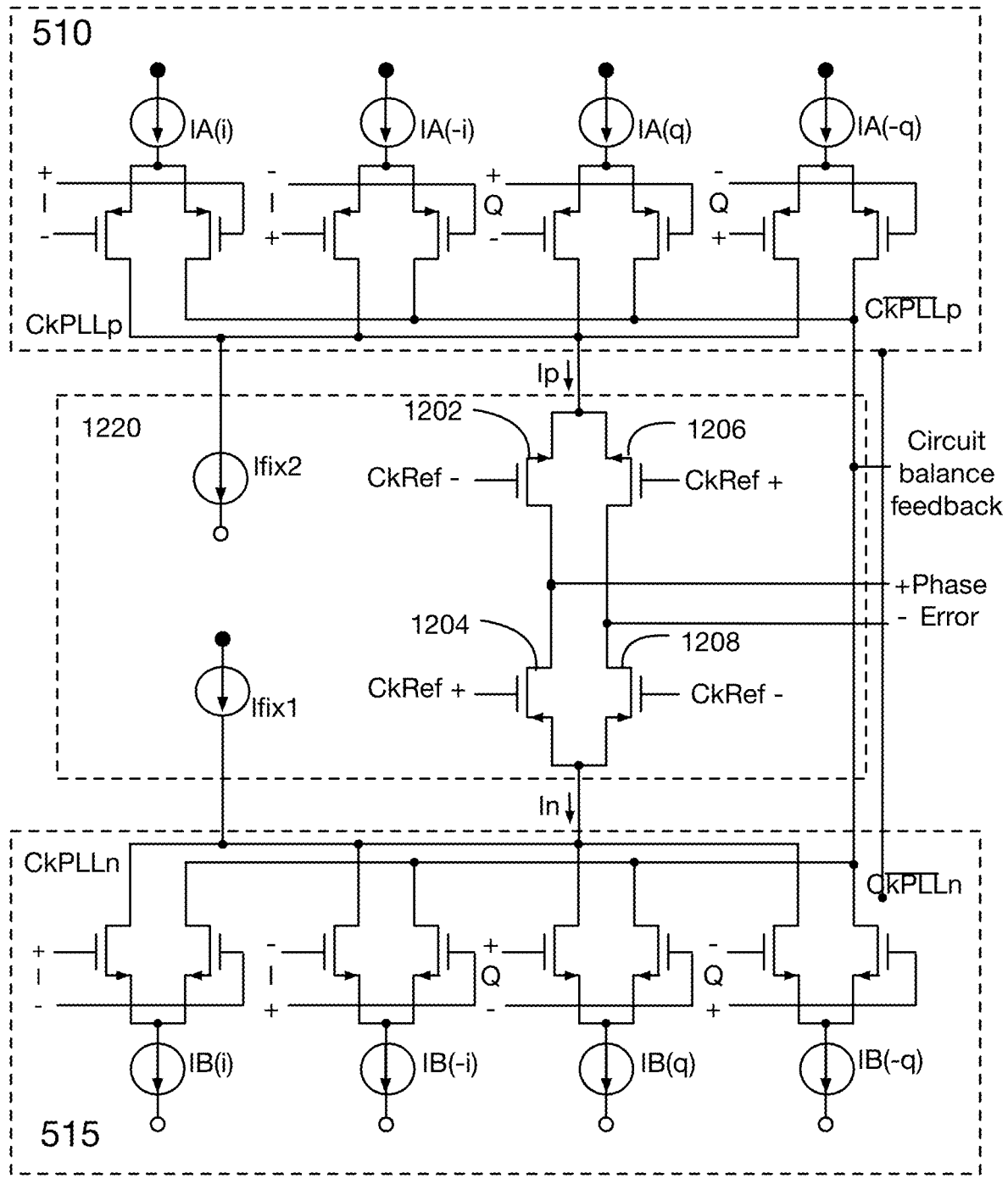
FIGS. 12A and 12B are block diagrams of an alternate embodiment of the integrated phase detector and phase interpolator of FIG. 5.

Phase Detector 520 in the embodiment of FIG. 5 is shown as an XOR-style device as in FIG. 4A, mixing local clock CkPLL and external reference clock CkRef to produce phase error output VCOctl. In the alternative embodiment of FIG. 12A, a folded phase detector is used at 1220, driven by currents produced by the combination of phase interpolator 510 and current sink Ifix2, and the combination of phase interpolator 520 and current source Ifix1. The folded phase detector embodiment shown in FIG. 12A is described in further detail below. As with the previously-described embodiment, current sources IA(i), IA(−i), IA(q), and IA(−q) are configured to produce the desired interpolation of PLL clocks i, −i, q, and −q in interpolator outputs CkPLLp and CkPLLp, while current sources IB(i), IB(−i), IB(q), and IB(−q) are configured to produce the desired interpolation of PLL clocks i, −i, q, and −q in interpolator outputs CkPLLn and CkPLLn. Phase comparator 1220 is also driven by received reference clocks CkRef+ and CkRef−, producing phase comparison results Phase Error (+) and Phase Error (−). In some embodiments, the circuit node labeled Circuit Balance Feedback may be monitored to determine the relative DC component of the interpolated clock signals, which may then be modified by adjustment of the configured current source values in 510 and 515. In some embodiments, each current source IA and IB receives seven control bits. It should be noted that embodiments are not limited to receiving seven control bits, and that any number of control bits may be implemented according to design constraints for PI resolution, for example. In some embodiments, current sources IA and IB are equal (e.g., IA=IB for +/−i, q). In such embodiments, the PIs 510 and 515 have 7 bits of resolution. In alternative embodiments, additional resolution may be implemented by introducing a shift in IB with respect to IA, or vice versa. In an exemplary embodiment, IA=IB+8, where 8 is a decimal shift added to the control bits of each current source IA to obtain the control bits of each current source IB. In such embodiments, the P-side PI 510 and N-side PI 515 are looking into two different VCO phases, and the phase detector collects information from different phases of the VCO. Since the PIs 510 and 515 combine information from different phases of VCO, the PLL has more detailed information about phases of PLL and the bandwidth of the PLL is higher than a conventional PLL.

Embodiments for which IA=IB+shift are a special case of a matrix phase comparator in which there are two phase comparators. The first phase comparator (N-side XOR) compares the phase of reference with one set of VCO feedback phases, and a second phase comparator (P-side XOR) that compares the reference clock phase with a second set of VCO feedback phases. Unlike the [Nandwana] phase comparator, the sets of VCO feedback phases here are of the same frequency, differing only in phase, and the current source values chosen to interpolate between the phase comparison results will typically be static rather than dynamically chosen on a cycle-by-cycle basis. Matrix phase comparator embodiments are described in further detail below.

Figure 13A:
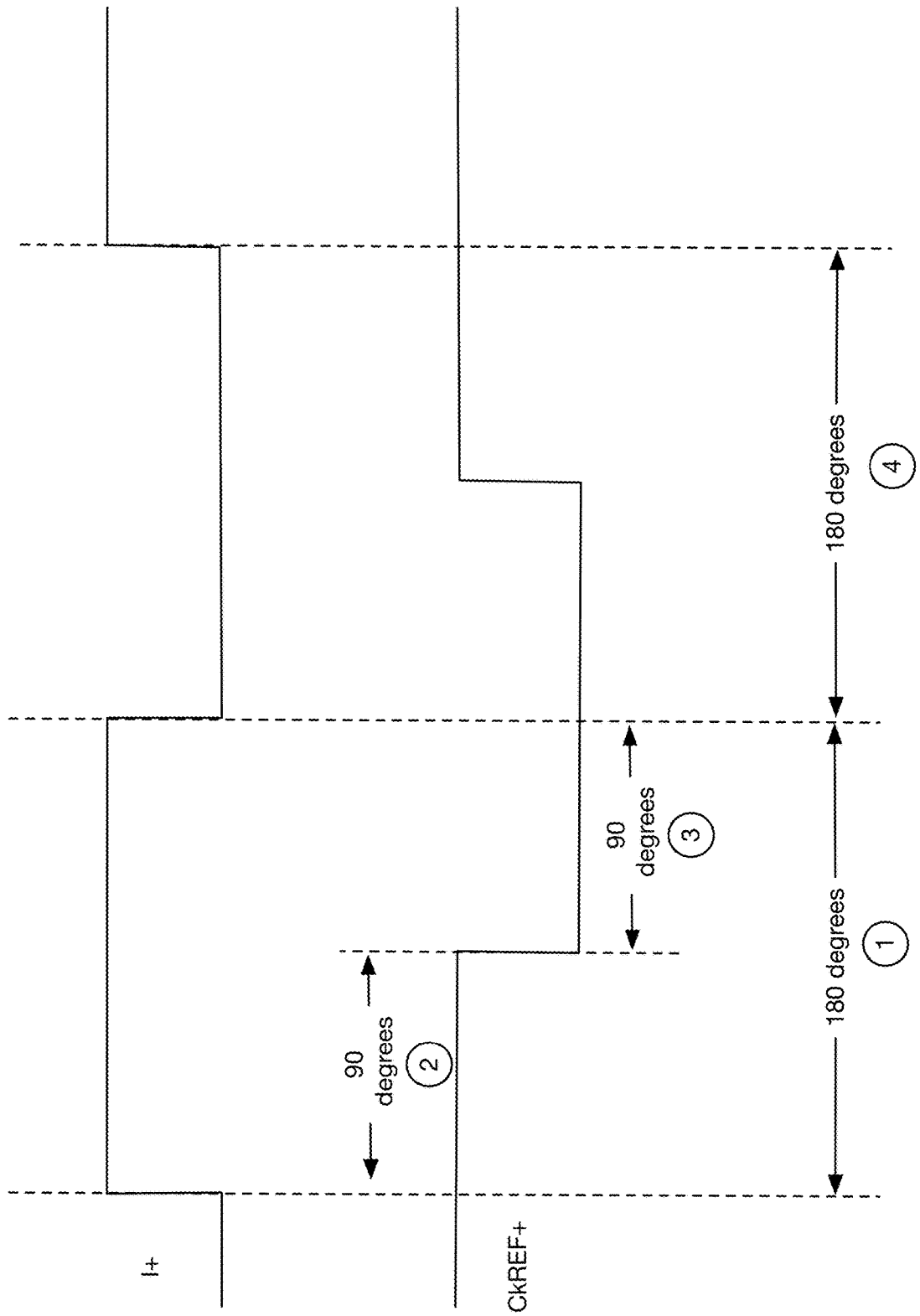
FIG. 13A is a timing diagram for a folded phase detector, in accordance with some embodiments.

In some embodiments, a folded structure as shown in FIG. 12A may be used. FIG. 12A is similar to the embodiment shown in FIG. 5, however the phase detector 520 is replaced with a folded phase detector 1220. As shown, folded phase detector 1220 includes current sources Ifix1 and Ifix2, which may be configured to provide more voltage headroom to the PMOS PI current sources IA and the NMOS PI current sources IB. Further, phase detector 1220 includes a pair of transistor branches connected to CkPLLp and CkPLLn. For purposes of illustration, consider PI 510 and 515 only having IA(i) and IB(i) turned on respectively, representing phase ph0000 from the VCO. In the case where CkRef is offset 90 degrees from ph0000, the folded phase detector 1220 will be in lock condition. As shown in FIG. 13A, during the first 180 degrees (1) of a period, for a first 90 degrees (2), current Ip is charged to the (−) terminal of the Phase Error signal through transistor 1206 using PMOS PI 510. At the same time, current In is discharged from the (−) terminal of the Phase Error signal through transistor 1208 using NMOS PI 515. Similarly, during the second 90 degrees (3), current Ip is charged from the (+) terminal of the Phase error signal through transistor 1202, while current In is discharged from the (+) terminal through transistor 1204. As shown, Ifix2 will sink a fixed amount of current being provided from PMOS PI 510, while Ifix 1 sources some current to NMOS PI 515 to prevent the current sources in the NMOS PI from sinking too much current from the Phase Error signal. Such a technique provides a reverse clipping effect. One of skill in the art may notice that equally adjusting the Ifix current magnitudes may have an effect on the range of the Phase Error signal. In some embodiments, increasing the Ifix magnitudes will lower the magnitude range of the Phase Error signal, while decreasing the Ifix magnitudes will increase the magnitude range of the Phase Error signal. This relationship can be found in FIG. 13B.

Figure 13B:
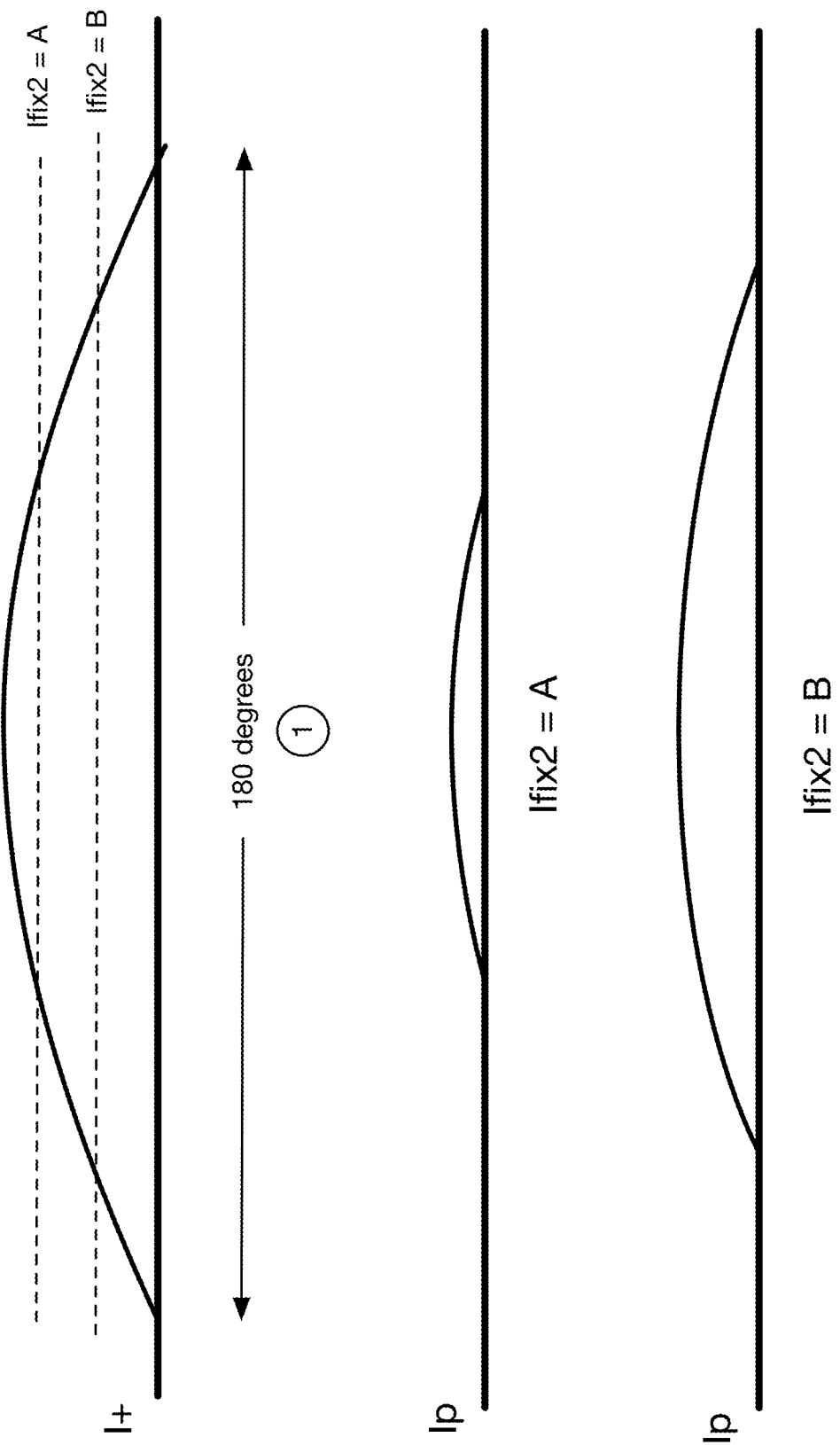
FIG. 13B is timing diagram illustrating a reverse clipping effect, in accordance with some embodiments.

FIG. 13B is a timing diagram illustrating the reverse clipping feature described above. FIG. 13B depicts the magnitude of current Ip in the first 180 degrees (1) for two values of Ifix2: A and B, where A>B. As shown, the magnitude of Ip is less in the case of Ifix2=A. When Ifix2=B, the magnitude range of Ip is relatively higher. One of skill in the art would notice a similar effect occurs in the case of In being discharged from the folded phase detector 1220.

Figure 12B:
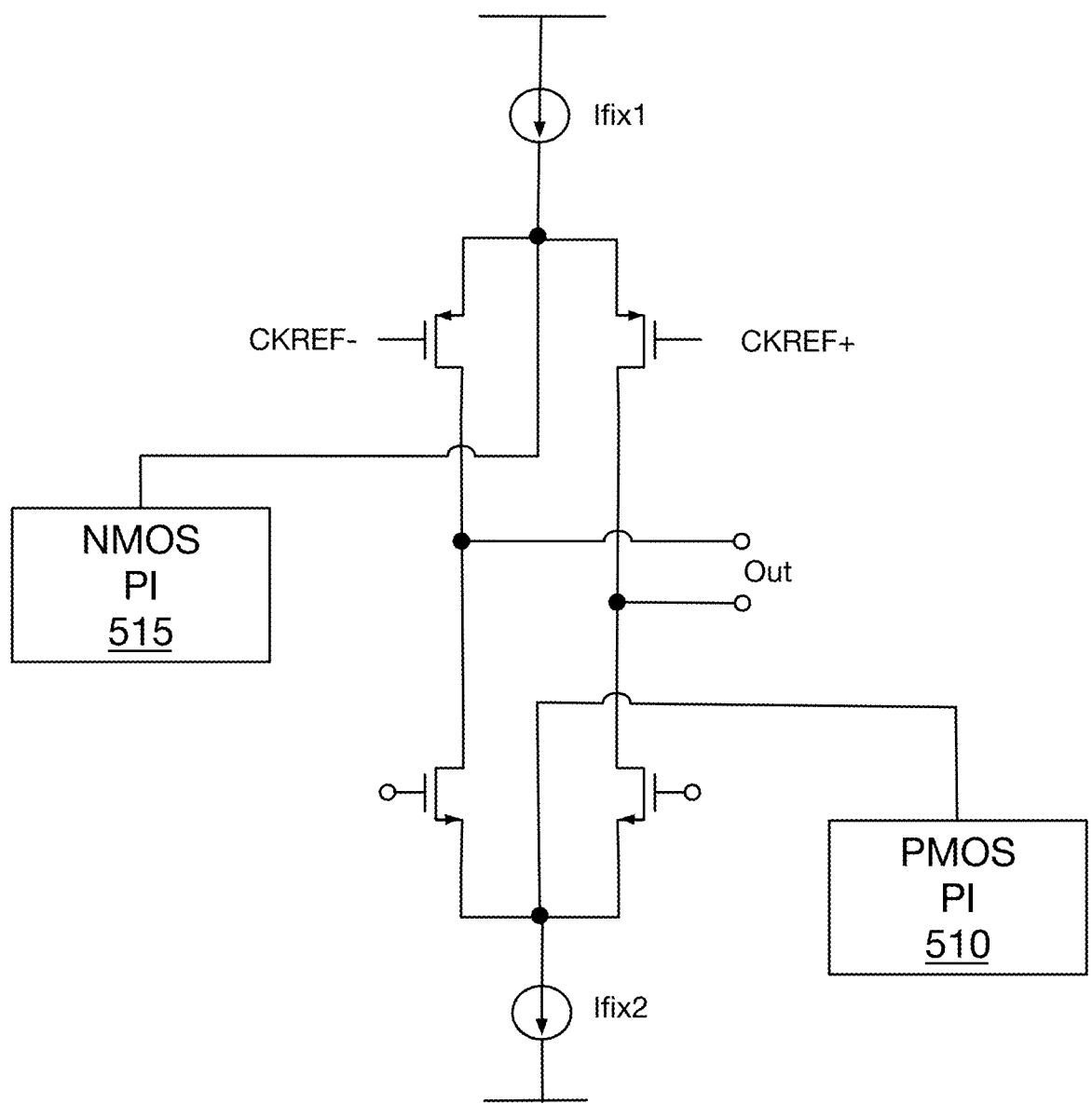

In some embodiments, the second 180 degrees (4) may be used to provide circuit balance feedback, as shown in FIG. 12A. During the circuit balance feedback phase (4), current may be charged via the PMOS PI 510 while current is discharged via the NMOS PI 515. If there is an imbalance of charge/discharge currents, a non-zero circuit balance feedback signal may indicate this imbalance, which may occur due to transistor mismatches, for example. The circuit balance feedback signal may then be used to adjust either Ifix1 or Ifix2 to balance the charge/discharge currents so that the balance feedback signal is zero. In some embodiments, the voltages of the charge-pump circuit may be monitored, and if equal, the circuit is properly balanced, i.e., Ip=In. A simplified schematic of the phase comparator circuit of FIG. 12A is shown in FIG. 12B.

The phase detector of [Tajalli V] may alternatively be used at 520 or 1220, providing equivalent phase detection with enhanced signal headroom in embodiments utilizing low power supply voltages. Other phase detectors, including all variations shown in FIGS. 4A, 4B, and 4C, may also be substituted at 520 in that embodiment.

As one example of such alternative embodiment, the State Machine Phase/Frequency Detector of FIG. 4B may be combined with the Phase Interpolator design of FIG. 5.

Figure 6A:
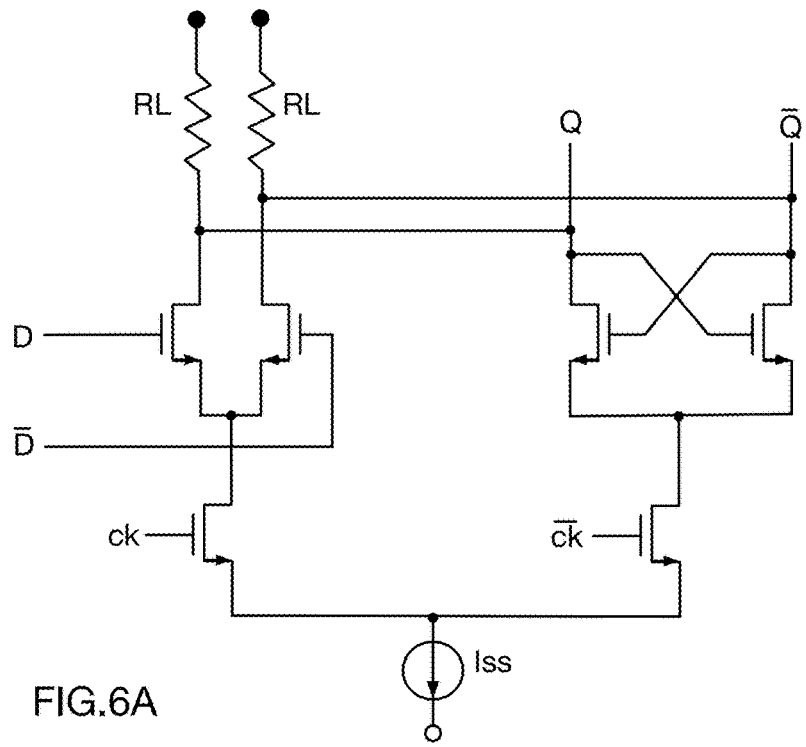
FIG. 6A is a schematic diagram of a clocked data latch and FIG. 6B is a schematic diagram of a further embodiment of a clocked data latch integrating a clock phase interpolator.
Figure 6B:
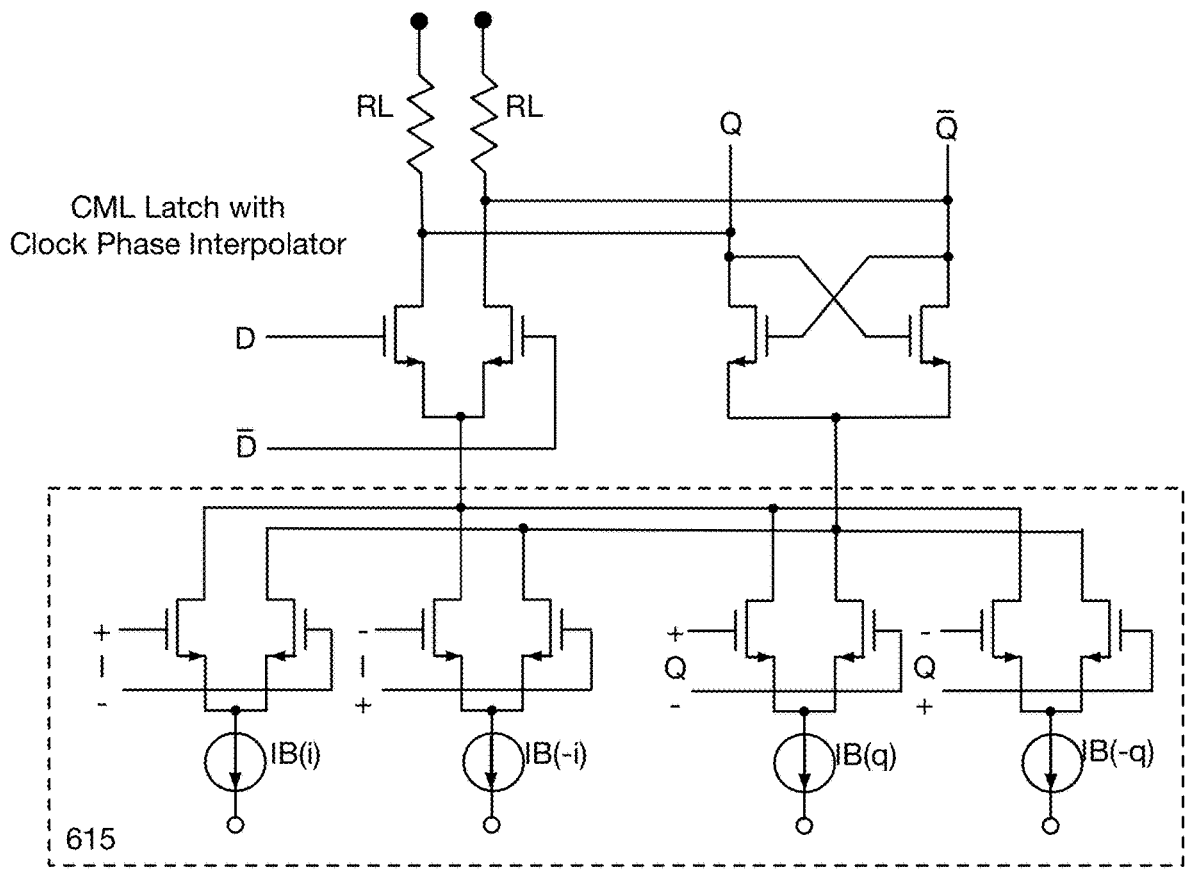

FIG. 6A shows a schematic of one embodiment of a conventional CML clocked latch, composed of a clocked feedback latch outputting results Q and $\bar{Q}$ the state of which is initialized by clocked differential inputs D and $\bar{D}$. FIG. 6B shows the same circuit in which the clock source phase is modified by phase interpolator 615, operation of which is as previously described for FIG. 5.

Figure 7A:
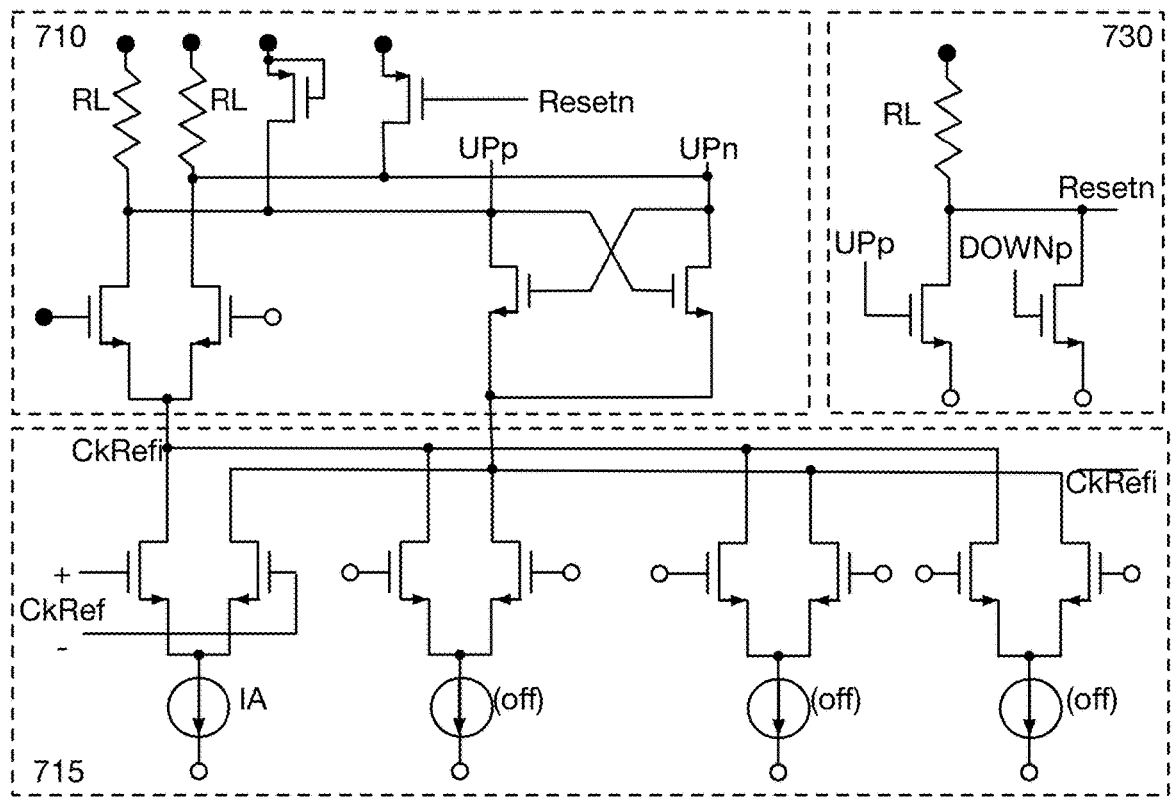
FIGS. 7A and 7B are schematic diagrams of an embodiment integrating a state machine phase detector and clock phase interpolators.
Figure 7B:
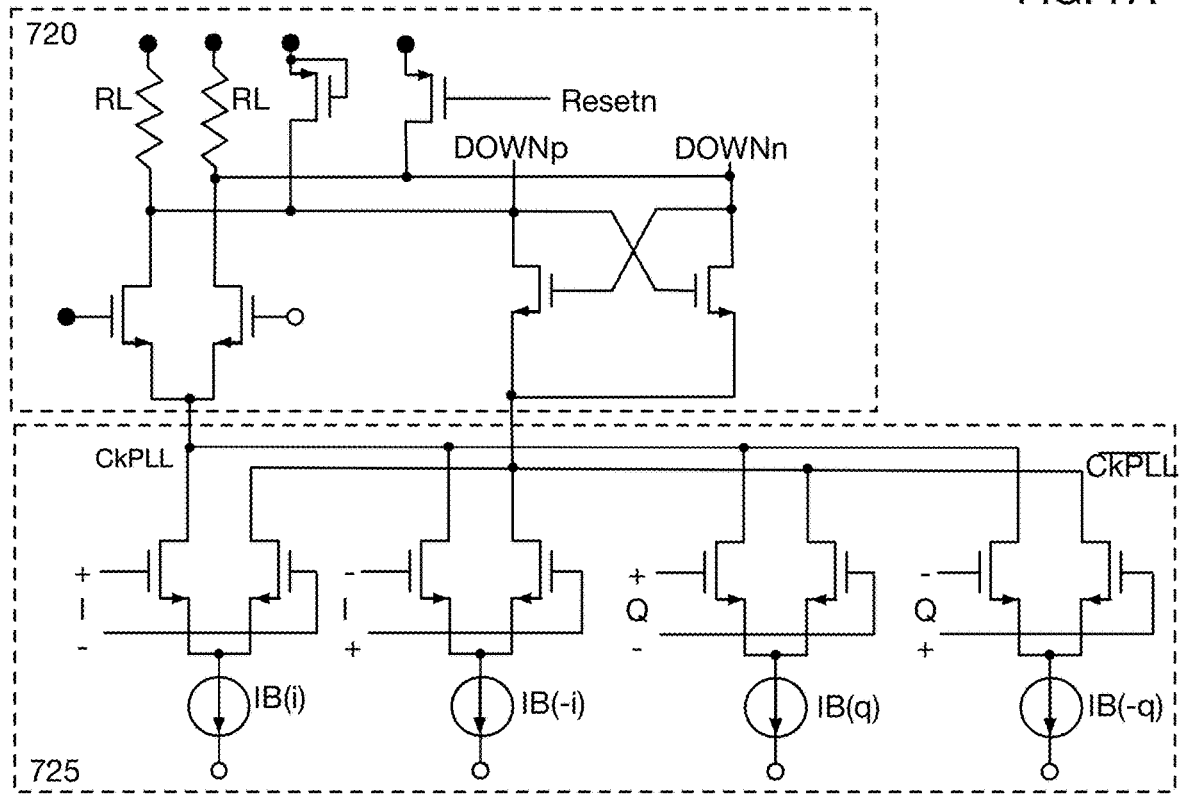

Substituting the clocked latch circuit of FIG. 6B into each D flip-flop instance of FIG. 4B produces the alternative embodiment shown in FIGS. 7A and 7B. D flip-flop 710 is clocked by the received clock CkRef, which is passed through phase interpolator 715. As an example and for purposes of explanation, without a configured phase offset (or a desired offset of 0 degrees), current source IA would be set to "mix" input CkRef at 100% proportion, and the other three current sources set to zero current. D flip-flop 720 is clocked by local clock CkPLL, which is obtained by configuration of phase interpolator 725 current sources IB(i), IB(-i), IB(q), and IB(-q), which in turn controls the relative proportions and polarities of I and Q clocks being combined. In one embodiment, I is obtained from ph000, -I from ph180, Q from ph090, and -Q from ph270, as seen in FIG. 3. A simple CIVIL OR gate 730 drives the reset function for flip-flops 710 and 720.

It should be noted that in this one embodiment the majority of phase interpolator 715 is functionally disabled and retained only to preserve the same parasitic load characteristics as are presented by active phase interpolator 725, to maximize circuit symmetry and maintain balanced loading characteristics to minimize secondary effects such as detection bias and drift.

Integrated Phase Detector, Interpolation, and Charge Pump

As previously described, PLL phase detector outputs are typically used to drive a charge pump circuit, the output of which is an analog error signal used to control the VCO. The described improvement from reduced capacitance and resulting higher circuit speed in integrating the PLL phase detector and clock adjustment phase interpolator may be further extended by also integrating elements of the charge pump in the same manner.

Figure 8:
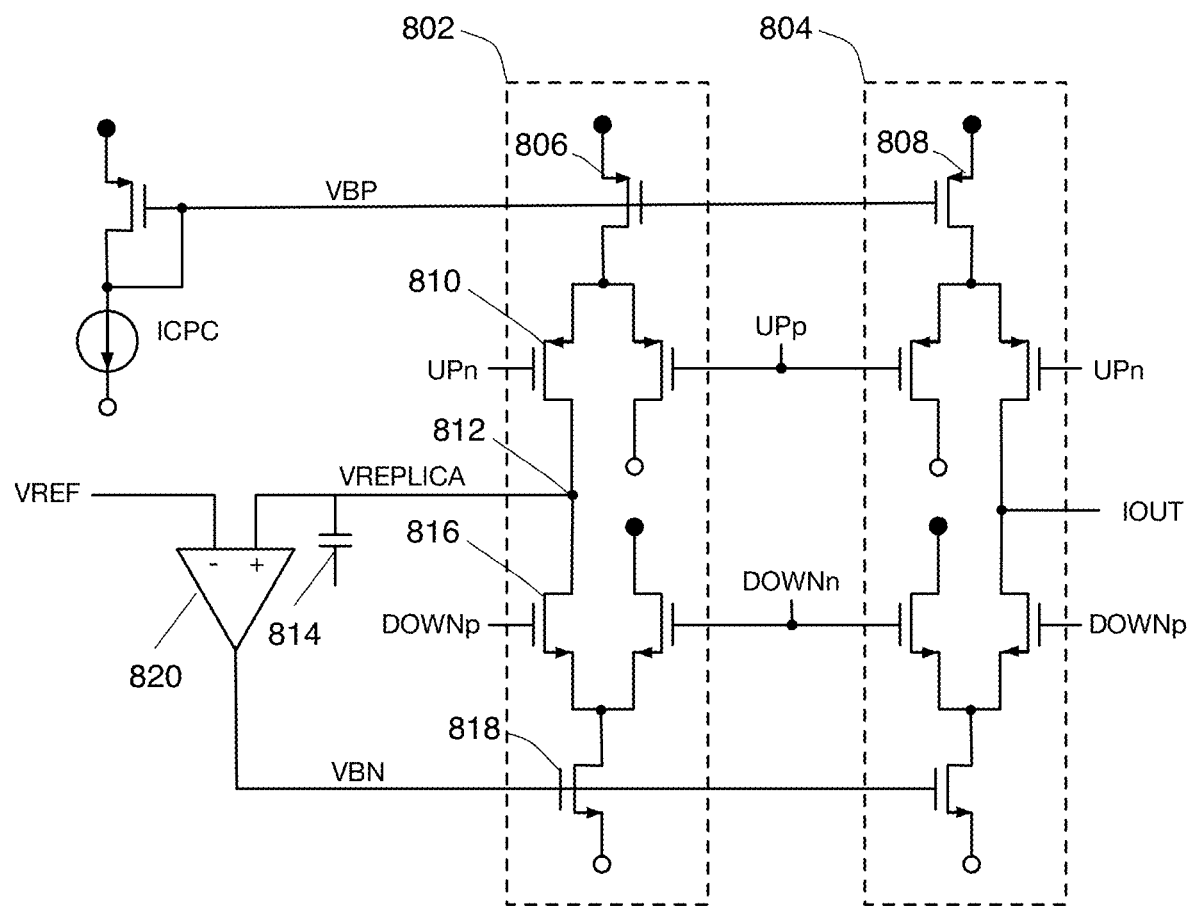
FIG. 8 is a schematic diagram of one embodiment of a charge pump suitable for further integration with a phase comparator embodiment.

In this combined embodiment, the charge pump control signals UPp, UPn, DOWNp, and DOWNn provided by the embodiment shown in FIGS. 7A and 7B directly control the charge pump embodiment of FIG. 8 to produce output IOUT. Current source ICPC and voltage reference VREF may be configured to scale and adjust the IOUT range. One familiar with the art will note the significant symmetry in the circuit of FIG. 8, allowing accurate tracking between generation of VREPLICA and IOUT signals.

FIG. 8 is a schematic of a charge pump circuit with improved charge/discharge current balancing, in accordance with some embodiments. The circuit 800 includes two parallel charge pumps 802, 804: the two differential pairs within charge pump 804 generate an output current representing a phase error in response to the up and down pulses, and the two differential pairs of charge pump 802 are used to set the discharge current to be equal to the charge current as described below. Specifically, the current source ICPC sets a charging current level by providing a corresponding bias voltage VBP through a current mirroring circuit to drive the top current sources 806, 808 of the two charge pumps so as to also provide ICPC to each charge pump 802, 804. When UPn goes low and turns on FET 810, the node 812 is charged (capacitive element 814 is either a discrete cap or a parasitic cap) by the charging current ICPC provided by FETs 806, 810. In a balanced condition (i.e., in the absence of a phase error), the amount of current that is then discharged during a high DOWNp signal through the bottom FET 816 should bring the node 812 back to the VREF value. If the discharge current is too low and the voltage VREPLICA increases above VREF, then the amplifier 820 will increase the bias voltage VBN to the discharge-current FET 818 to increase the amount of discharge current so that it equals the charge current ICPC and the voltage VREPLICA at node 812 is brought back to VREF. On the other hand, if the discharge current set by VBN on FET 818 is too high, the VREPLICA voltage drops too low, and the amplifier 820 responsively reduces the bias voltage VBN on discharge-FET 818 to bring the charge pump currents into equilibrium.

Figure 24:
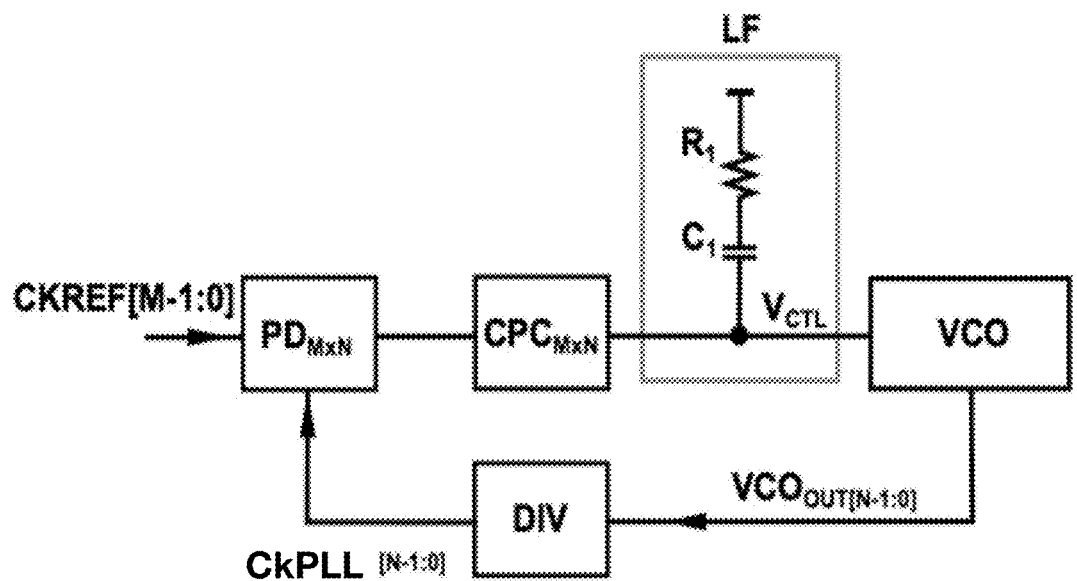
FIG. 24 is a block diagram of an oversampled multi-phase feedback phase-locked loop (MPLL) in accordance with some embodiments.

Second order PLLs (called also charge pump PLLs) have been widely used to implement low noise and high performance synthesizers, clock generators, and clock and data recovery systems. A phase detector (PD), or a phase-frequency detector (PFD) produces a signal proportional to the phase difference between the reference clock (CkRef) and the feedback clock (CkPLL). The resulting error is integrated by charge-pump circuit (CPC) and loop filter (LF) to produce the proper control voltage for the voltage (or sometimes current) controlled oscillator (VCO). An exemplary LF is an RC circuit as shown in FIG. 24. Many modern integrated VCOs are based on differential topology that can provide two complementary outputs. A differential architecture provides more resistivity against supply and substrate noise. LC tank based VCOs and ring oscillators are two main categories of controlled oscillators that have been very widely used in high speed communication systems. Both topologies can be configured to provide two or more output phases, which is essential for multiphase systems and facilitates the enhancements described below.

Other embodiments may be obtained by equivalent combination of phase comparator, phase interpolator, and charge pump elements.

Oversampling of Input Reference Signal

The asymmetric use of the phase interpolators in, as one example, FIGS. 7A and 7B, stems from the different nature of the local clock and reference clock sources. The former is obtained from a multiphase clock source (e.g. an oscillator or divider) inherently capable of providing the multiphase inputs utilized by a phase interpolation element. The latter is generally single phased, obtained from (typically) one received clock source.

In the known art, [Tan] described a combined DLL/PLL structure, in which the voltage controlled delay line incorporated in the PLL VCO is duplicated as an input delay line acting on the reference clock input, and controlled by a single feedback error signal. [Ng] and [Chang] also describe use of a front-end DLL to serve as a frequency multiplier to facilitate generation of very high frequency clocks.

However, if such a controlled delay line is tapped, and so configured that the differential delay between taps is proportional to the time between received clock edges, a received clock passing through such a delay line produces a resulting set of outputs which take on some of the characteristics of a multiphase clock. As one example offered without limitation, the equal-interval outputs of a four tap delay line having an overall delay comparable to the reference clock period will provide outputs having similar characteristic to quadrature phased clock signals. Continuing this example, if each such output is phase compared to an appropriately-selected local clock phase, a series of phase error results will be produced which may be combined to produce a more accurate aggregate clock error signal for the PLL VCO. The delayed versions of the receive clock represent additional opportunities for phase comparison with a clock derived from the VCO, thus providing a higher update rate for the controlled loop, and thus improved PLL loop bandwidth leading to reduced jitter and better noise immunity. That is, using this technique, the update rate of the loop will be increased, which in turn enables the circuit to track and correct the effects of noise and jitter at higher frequencies.

For the delayed phase comparisons to provide meaningful information to the PLL, the delay intervals provided by the delay line must be coordinated with the period between local clock phases, with such controls giving the delay element many of the aspects of a Delay-Locked Loop (DLL.) As seen in the block diagram of FIG. 9, the external clock reference input to the previous PLL embodiment 300 is provided by DLL 910. The received clock signal R5 is presented to tapped delay line 916, producing a series of received clock phases 918. The DLL control loop is provided by phase comparator 912 comparing the received clock with a delayed clock, producing an error value that is Low Pass Filtered 915, producing a Delay Adjust signal controlling the delay line timing.

Within PLL 300, the previous simple phase comparison (320 of FIG. 3) is now performed by multi-phase comparison 920. In one embodiment, XOR gates compare the phase of each received reference clock phase on the N lines (e.g., N=2, 4, 8, etc., and possibly including odd integers as well to obtain other phases such as 60, 120, 180, 240, 300) 918 with a different clock phase from the N lines 965 from phase interpolator 360. Each XOR gate output is converted to an analog signal value, all such analog signal values being summed to produce a composite analog Error result controlling ring oscillator 340, as previously described. In a further embodiment, summation 935 is performed by a weighted summation node comparable to the previously-described MIC mixer, the different selected weights of said summation allowing further control of PLL static and dynamic operational characteristics. Alternatively, each XOR output can be used to drive a separate transistor circuit for injecting or removing charge from a capacitive element to achieve the summation. In a further embodiment, each XOR phase comparator may provide a current output to a common summation node, the magnitude of each current being configurable so as to provide a weighting function. In addition, the PLL 340 of FIG. 9 may be configured to provide a desired phase offset, where the interpolated phases each have the same offset relative the tap delay line signal to which it will be XOR compared.

In some system environments, the described multi-phase reference clock may be directly available from the receiver, as one example where the communications protocol incorporates multiple clock signals.

Figure 10:
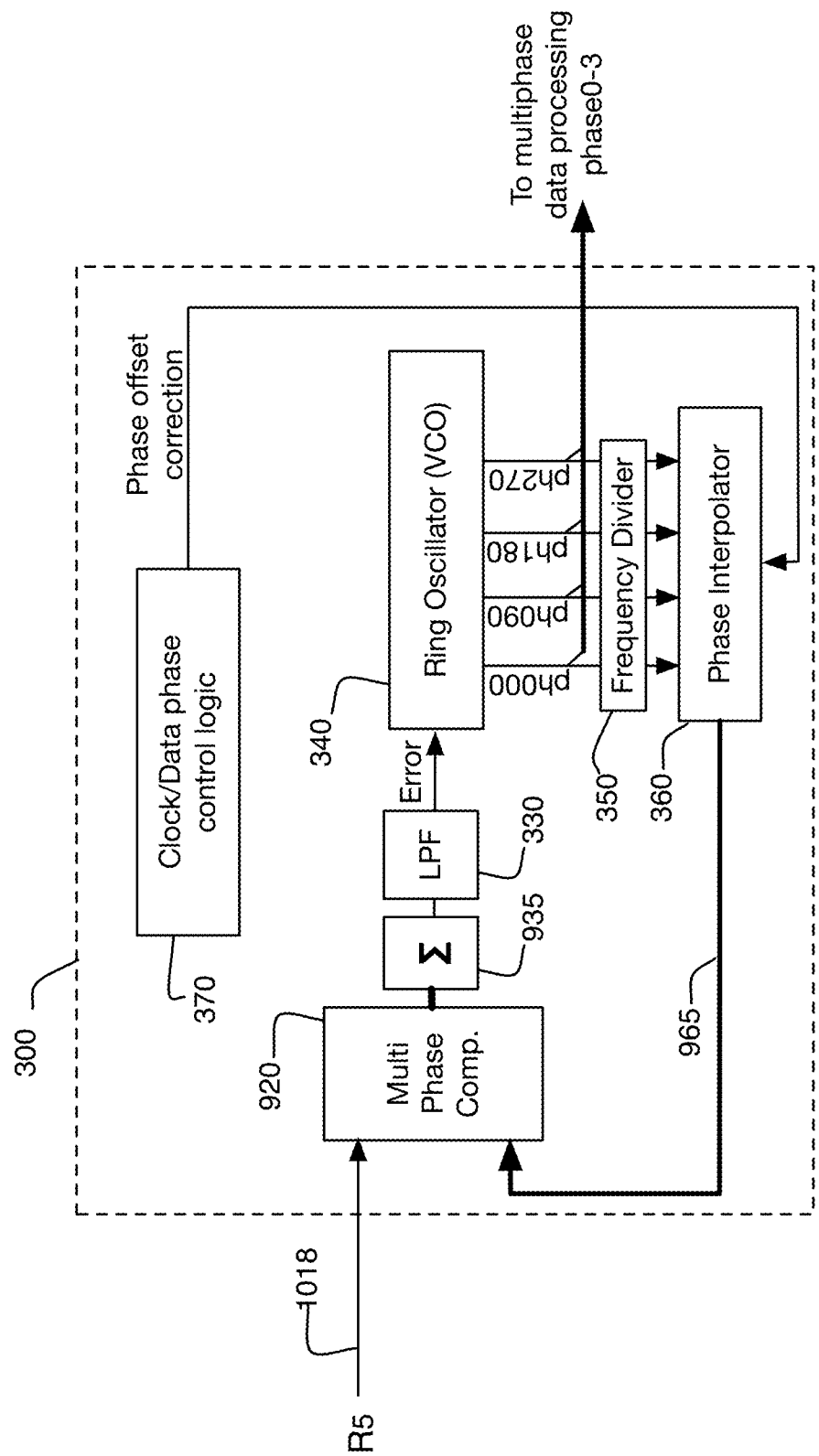
FIG. 10 is a block diagram of a further embodiment in which multiple comparisons are made between a single reference clock and multiple local clock phases.

The additional feedback information provided by the multiple comparison operations may also be obtained without the previously-described DLL front end. FIG. 10 shows an embodiment in which the single received reference signal 1018 enters multi-phase comparator 920 in which the single received reference signal is compared to each of two or more local clock phases 965. As in the previous example, this multiple phase comparison is distinct from that of [Nandwana] in that all of the local clock phases used for comparison are of the same frequency, differing only in phase. In one embodiment, XOR gates compare the phase of the single received reference clock phase 918 with a different clock phase 965 from phase interpolator 360. Each XOR gate output is converted to an analog signal value, all such analog signal values being summed to produce a composite analog Error result controlling ring oscillator 340, as previously described. In a further embodiment, summation 935 is performed by a weighted summation node comparable to the previously described MIC mixer, the different selected weights of said summation allowing further control of PLL static and dynamic operational characteristics. In another embodiment, each XOR phase comparator provides a current output to a common summation node, the magnitude of each current being configurable so as to provide a weighting function. In particular, such weight adjustments may be used to produce additional closed-loop poles and/or zeroes in the PLL time domain transfer function, providing additional control of loop stability.

Figure 14A:
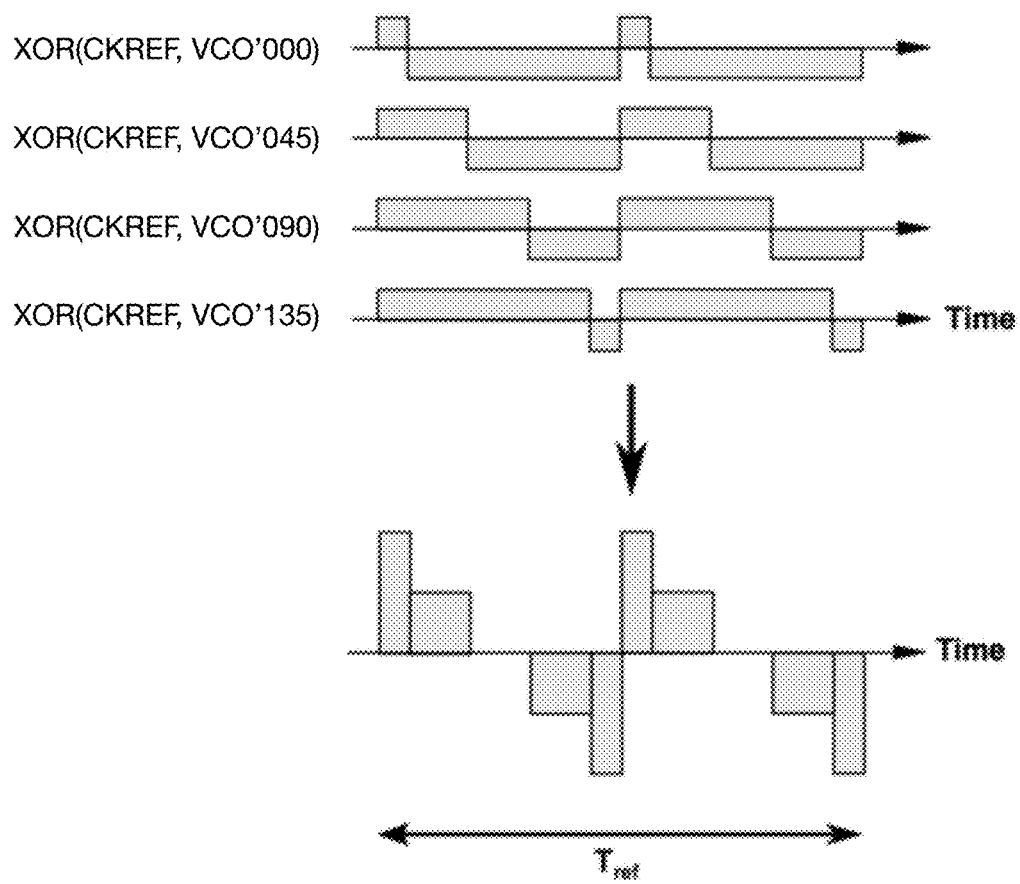
FIGS. 14A and 14B are timing diagrams for an array-XOR phase detector and single-XOR phase detector, respectively, in accordance with some embodiments.

FIG. 14A is a timing diagram of a reference signal CKREF being compared with four phases of the VCO (feedback from the PLL):

XOR(CKREF, VCO'000)
XOR(CKREF, VCO'045)
XOR(CKREF, VCO'090)
XOR(CKREF, VCO'135)

Figure 14B:
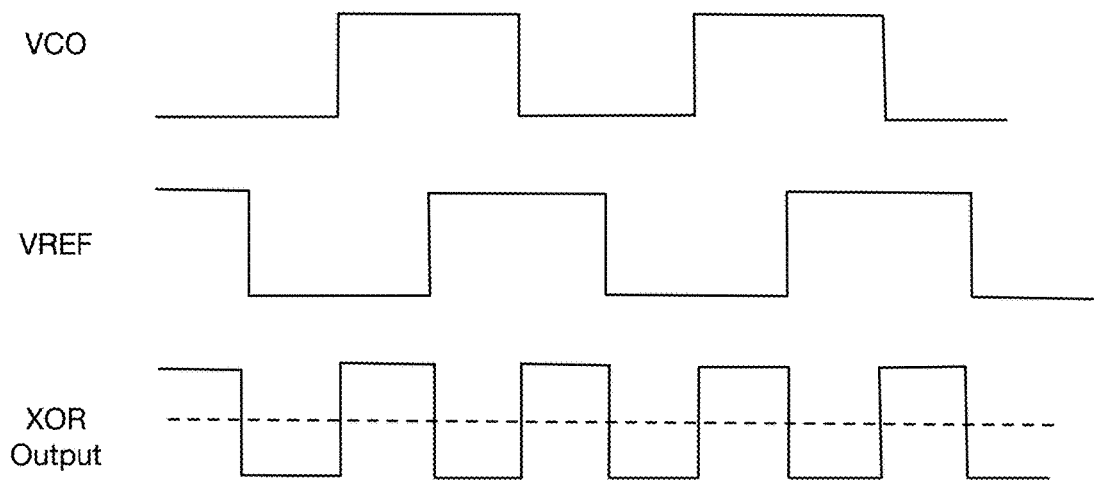

As shown in FIG. 14A, it is assumed all weights are equal, however this is purely for illustrative purposes, and should not be considered limiting in any way. FIG. 14A further includes a summation of the four XOR outputs. As can be seen, in lock condition, the integral of the bottom waveform is zero, and the PLL will lock properly. For convenience, FIG. 14B has been included to illustrate a conventional XOR based phase detectors in which the reference is compared to only one VCO phase. In lock position, the reference and VCO are 90-degree phase shifted, and the output of XOR is a rectangular waveform with an average value equal to zero. One may observe how the two waveforms (simple XOR in the FIG. 14B and array-XOR in FIG. 14A) differ from each other; however in both cases the average value for a given period is zero, and the PLL locks. In embodiments utilizing an array phase detector, a larger number of transitions occur with respect to a single XOR phase detector. As each transition carries information about an edge, a larger number of transitions means that phase comparator has been able to collect more information from VCO and CKREF.

It should be noted that in array-XOR embodiments, some comparisons might be done using XNORs. As such, an XOR or XNOR for different phase comparisons may be selected carefully to ensure system stability.

In at least one embodiment, the weights of said summation are configured such that they decline in proportion to the timing difference of the comparison clock phase relative to the PLL "normal lock" phase. As one example offered without limitation, if ph090 is the normal lock phase of the PLL, the comparison of ph090 and the received reference signal is weighted 1; comparisons of ph045 and ph135 (e.g. a half tap offset from the normal lock phase) are weighted ½; comparison of the received reference signal and ph000 and 180 (one tap offsets from the normal lock phase) are weighed ¼; etc. These various weighted comparison results are then summed to produce a composite signal which when low pass filtered 330, is the Error value controlling PLL VCO 340.

In one embodiment utilizing multiple phase comparators, the deterministic jitter produced by the multiple phase comparisons was seen to occur at a 12.5 GHz rate with equal phase detector weights. Even though the amount of jitter was very small and the jitter rate was well above the loop filter cutoff frequency, the deterministic jitter was significantly reduced with the described weight adjustments, in which weight magnitudes decline in proportion to their offset distance from the primary reference signal sample. In some embodiments, different weighted values are used in a comparator circuit to construct a discrete time domain filter. This property can be used to simplify the design of analog filter 330. For example, with proper weighting values one might construct a discrete time domain zero in the transfer function that provides conditions to make the loop robust.

As with previously described examples, other embodiments may be obtained by equivalent combination of phase comparator, phase interpolator, and charge pump elements.

Matrix Phase Comparisons

In some embodiments, BW of a PLL is limited by the update rate of the loop, which is determined by the frequency of the reference clock. Certainly, using all the available sources of information in system can substantially enhance the efficiency of the correction loop. For example, every phase of the VCO provides a single sample of the oscillator phase during each cycle of the reference clock period, while looking into all the phases of the VCO can provide more detailed information in the time span of Tref shown in FIG. 14B. In conventional PLLs, only one of the VCO phases is fed back into the phase detector. Hence, the phase detector has only part of the available information regarding instantaneous phase of oscillator. The following embodiments utilize different ways of improving loop update rate using a two dimensional phase comparator.

Figure 11A:
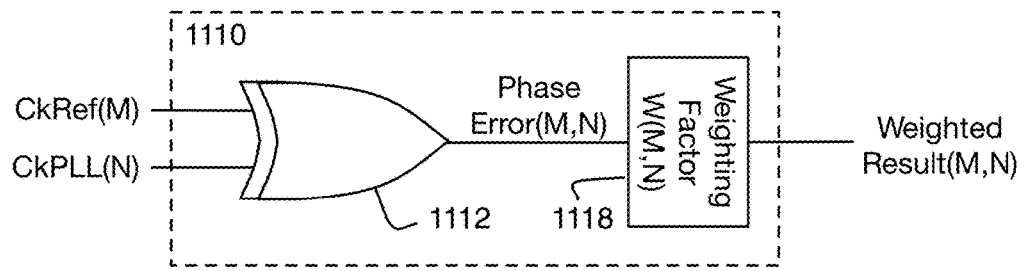
FIG. 11A is a weighted XOR phase detector, in accordance with some embodiments.
Figure 11B:
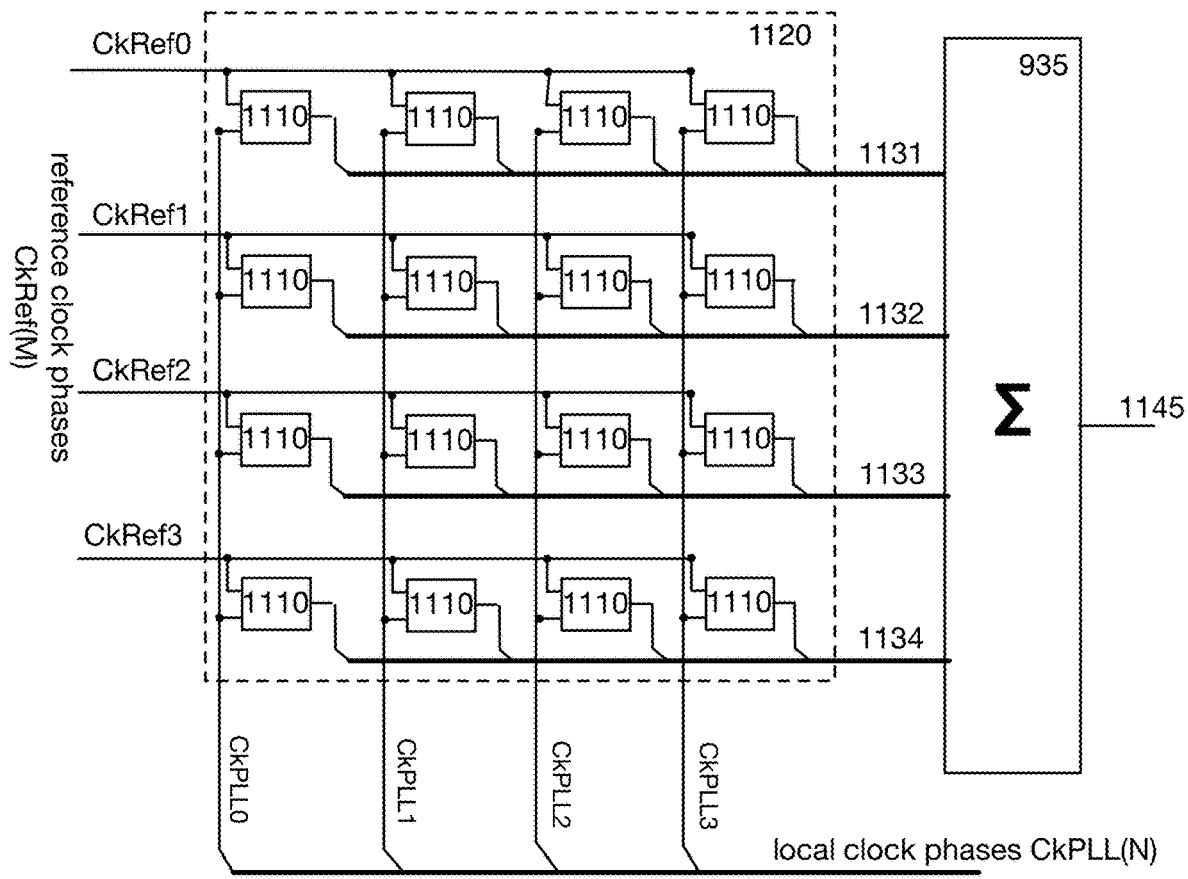
FIG. 11B is a block diagram of one embodiment of a matrix phase comparison of M reference phases and N local clock phases.

The multi-phase comparison of multiple phases derived from a received reference signal and multiple phases derived from the local PLL clock may be generalized into a matrix phase comparator, one embodiment of which is shown in FIG. 11B, with one embodiment of each individual phase comparator in the matrix shown in FIG. 11A. For descriptive purposes, XOR partial phase comparators arranged in a four by four matrix are illustrated, with no limitation implied by those illustrative choices. Embodiments may be organized into rectangular, square, or sparse matrices of any dimensions M and N, with elements of the matrix being composed of any phase comparator described herein and optionally any weighting factor computation described herein. As the local clock phases repeat cyclically, the leftmost and rightmost columns of the matrix should be considered as being logically adjacent in their local clock phase relationship (e.g. clock phase 360 being identical to clock phase 0) if, (as is the usual case) the local clock phases associated with the matrix columns represent evenly distributed time intervals over one complete clock cycle. As used herein, a sparse matrix is any embodiment in which at least one of the described element weights is zero. In some embodiments, one or more number of reference clock phases can be compared to one or more than one phases of the feedback clock. Every extra feedback clock phase (CkPLL$_N$) provides more detailed information about the phase noise of VCO in time domain. Hence, such a phase comparator may more often provide correction signals to the loop filter. In other words, a multi-phase feedback system enables the loop to increase its update rate and correct for phase deviation of VCO at higher rates. Similarly, if there are more number of reference clock phases available, higher resolution phase comparison can be made, and correspondingly correction signals may be applied more often in time. If there is only one reference phase, still a controlled chain of delay line (CDL) can be employed to replicate the reference clock. The bandwidth of control loop for such a delay line needs to be either very high, or very low in order to guarantee that all the phases of the replicated clock phases carry similar jitter characteristics within the frequency range of interest. A generalized two-dimensional phase comparator is depicted in FIG. 11B, in which every phase of the feedback signal can be compared with every phase of the reference clock.

In a full matrix comparison, each of M phases derived from the received reference signal is separately phase compared with each of the N phases derived from the local PLL clock. Each resulting phase error signal is weighted by a configured or predetermined amount, with all (M*N) weighted results summed to produce an aggregate error result. An example of one partial phase comparator is shown in FIG. 11A as 1110, composed of XOR phase detector 1112 feeding to result weighting factor 1118. As shown, each partial phase comparator 1110 receiving CKRef(m) and CkPLL(n) may have a corresponding weighting factor W(m, n) for 0≤m<M−1 and 0≤n<N−1. An embodiment of the complete matrix phase comparator 1120 in FIG. 11B is composed of M*N instances of 1110, each accepting one of the M reference phases, herein identified as CkRef0, CkRef1, CkRef2, CkRef3, and one of the N local phase inputs herein identified as CkPLL0, CkPLL1, CkPLL2, CkPLL3, and producing a weighted result e.g. multiple results 1131, 1132, 1133, 1134 as input to summation 935, which produces an aggregate result 1145.

Figure 9:
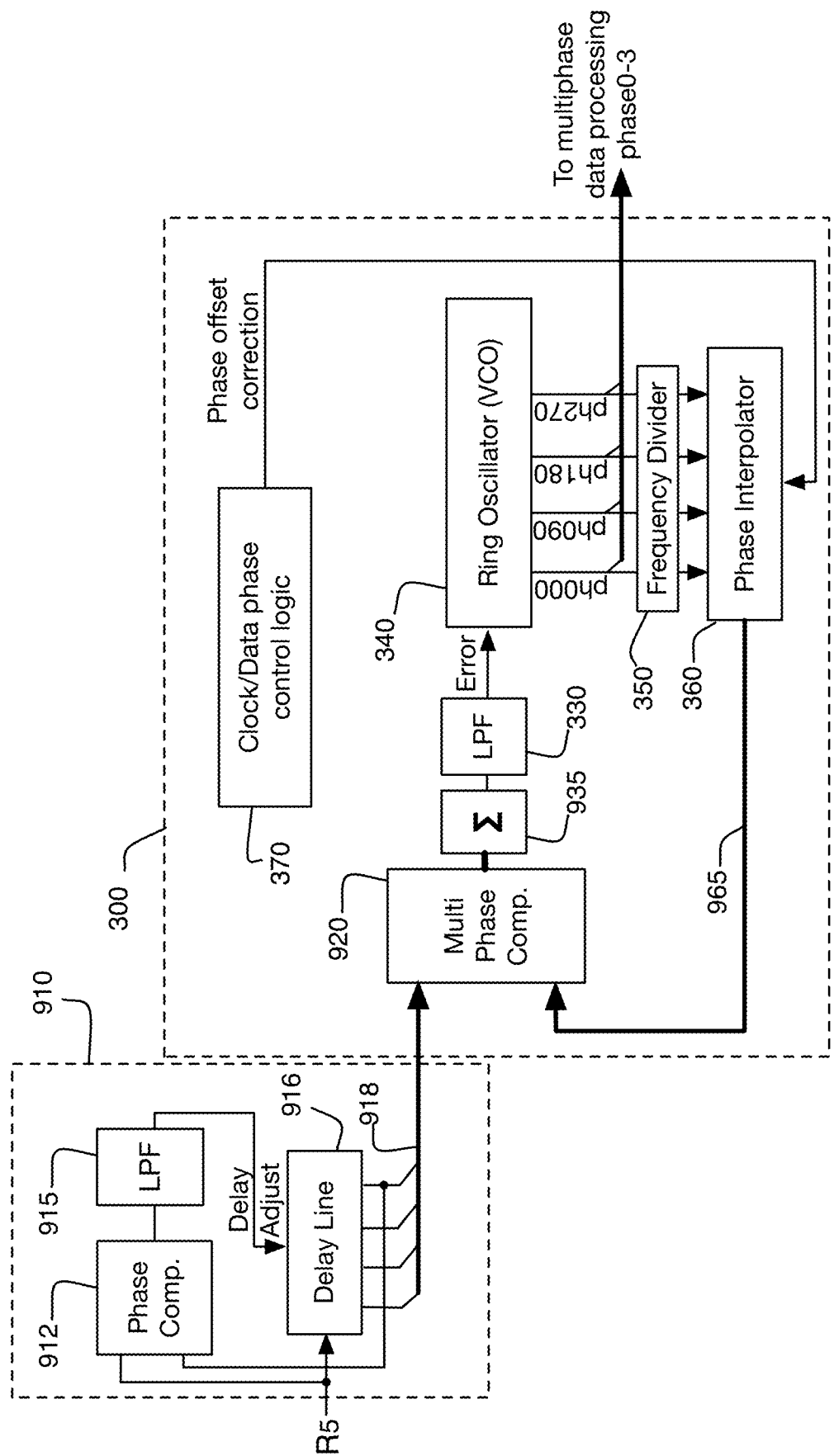
FIG. 9 is a block diagram of a further embodiment in which multiple phases of a reference clock are compared with multiple local clock phases.

One familiar with the art will observe that the previously-described multi-phase comparator 920 of FIG. 9 is equivalent to a partially-populated instance of the present matrix comparator, i.e. having comparators instantiated across a diagonal of the matrix. Functionally, an identical result may be obtained from a full matrix by setting the weights along such a diagonal to a nonzero value, and all other comparator weights to zero. It thus follows that other described behaviors including simulation of phase offsets, introduction of loop time domain zeroes, etc. may be similarly be obtained by selective configuration of matrix weighting factors. In such embodiments, each reference clock phase will be compared with its corresponding feedback clock phase, i.e. CkRef,m versus CkPLL,n. The dynamics of such a diagonal comparator are similar to a conventional PLL (CPLL) except that the update rate is N times faster. Higher loop update rate will allow a diagonal PLL to track input jitter and correct jitter of VCO up to higher frequencies. In summary, signal (reference) transfer characteristics, (STF), and VCO noise (jitter) transfer characteristics, (NTF or JTF), of such a system will be N times wider compared with the conventional PLLs.

In at least one embodiment, the matrix comparator of FIG. 11B may be simplified such that different phases of feedback signal (CkPLL) are compared against only one reference clock phase. Such embodiments are especially interesting as generally there is only one single reference clock phase available. In such an implementation W(m,n) are zero unless m=0.

Figure 15:
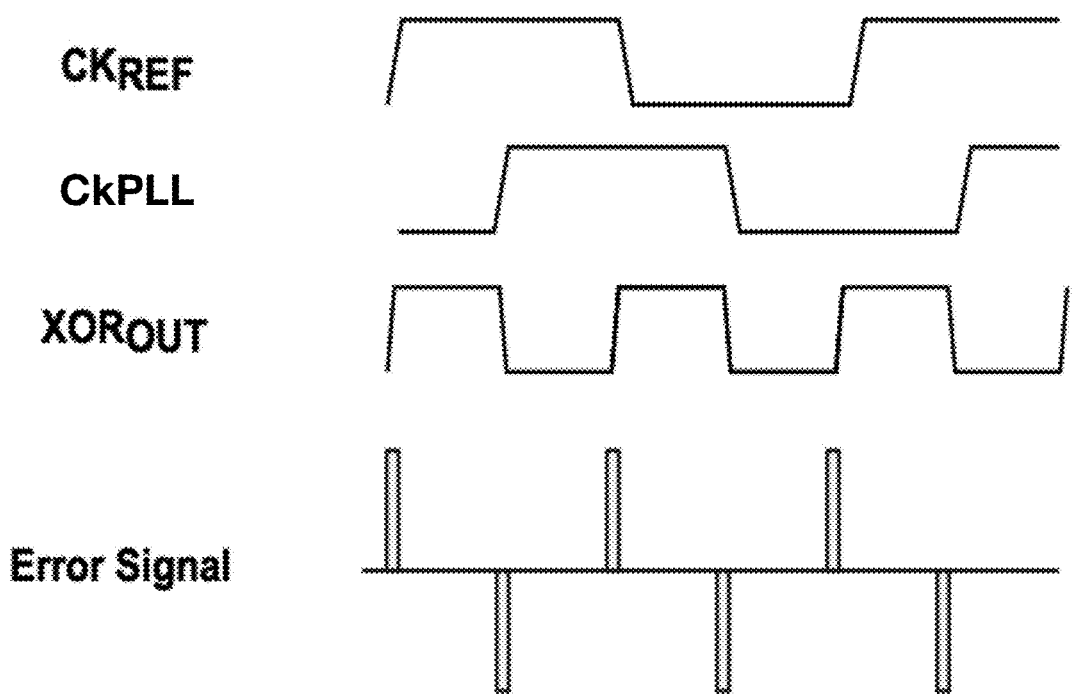
FIG. 15 illustrates XOR-based phase comparator and correction signals applied to a loop filter, in accordance with some embodiments.
Figure 16:
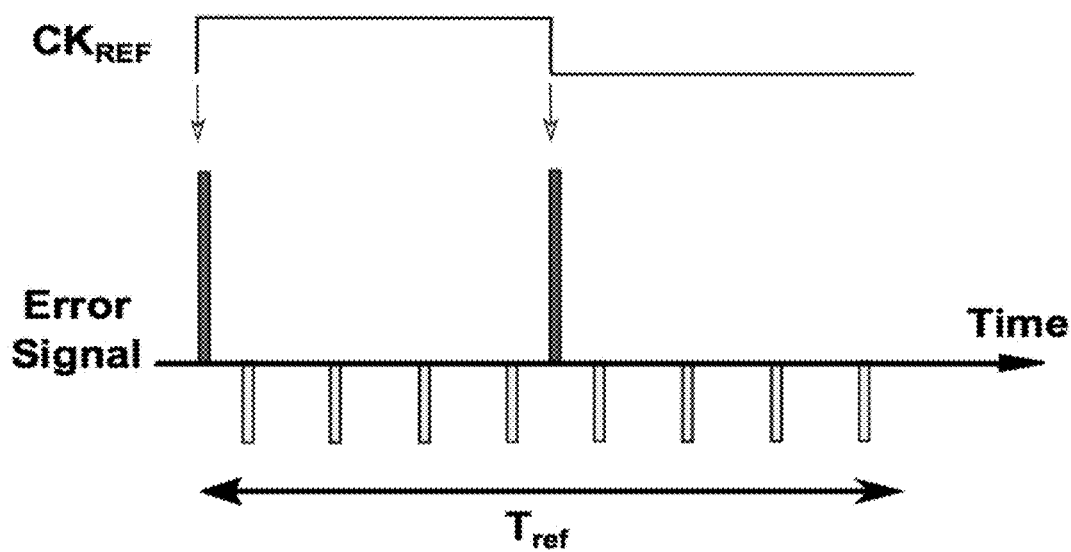
FIG. 16 illustrates time-domain error signals produced by a row-based phase comparator in accordance with some embodiments.

Assuming a four phase feedback, each phase comparator produces a correction signal which eventually will be accumulated onto the capacitor of the loop filter. While under lock condition the integral of the correction signal illustrated in the bottom waveform of FIG. 14A is zero, this signal has its main harmonic at $2f_{ref}$. Any jitter on the reference clock or feedback divider phase will cause some deviations at different edges of the bottom waveform shown in FIG. 14A. The bottom waveform in FIG. 14A shows the correction signal injected into the loop filter. Comparing the waveform depicted in the bottom waveform of FIG. 14A with the waveform of a simple XOR phase comparator shown in FIG. 15, it is evident that the number of transitions happening at the output of comparator during a single reference clock period has been increased by more than a factor of two. While in both waveforms there are two jumps created by the rising and falling edges of CkRef, the number of transitions due to feedback signal has been increased from two in FIG. 15 to eight in FIG. 14A (also shown in FIG. 16). Based on this, the feedback transfer function in a multi-phase diagonal PD will be different form a conventional PD. Due to more number of samples provided by the feedback path in this case, the noise of VCO can be corrected more often, and hence over a wider frequency bandwidth.

A multi-phase or array phase comparator as described above opens new doors to design low noise and wide-band PLLs. Described below are different examples of improving performance of PLLs using array phase comparators.

In some embodiments, array phase comparators provide double edge phase comparison: Using double edges (rising and falling edges) of the reference clock provides the possibility to make two separate phase corrections at every cycle. Hence, the BW of PLL can be potentially increased by a factor of two. In case the duty-cycle of the input reference is not 50%, it will create some ripples at 2·Fref and can increase deterministic jitter (DJ) of the oscillator. Indeed, as the ripple frequency is fairly high, with proper loop filter design it will be possible to reject major part of this DJ.

In some embodiments, array phase comparators provide Inter-VCO-phase comparison. To detect and correct duty-cycle and quadrature mismatch errors (QME), generally designers make comparison between different phases of a VCO. For such correction, the error signal resulted from inter-VCO-phase comparison is heavily filtered and a very low frequency correction signal is applied in a proper point of the system in order to correct for duty-cycle distortion or quadrature mismatch. Embodiments described above may be expanded to detect and correct random jitter of VCO.

Some embodiments of the two-dimensional discrete-time phase comparator provide the possibility to implement a discrete-time filter in front of PLL. This opportunity can be used to implement special transfer functions in order to improve the performance of system. For example, by proper choice of digital filter coefficients (e.g., the weights described above), one may detect and suppress phase noise at special frequencies in order to improve tolerance of system against supply or substrate noise. Some embodiments provide Phase Interpolation: There are different approaches for rotating phase of oscillator in a PLL and adjusting the exact timing of recovered clock based on system requirements. In some embodiments, a diagonal comparator array structure provides the possibility to rotate a phase of the oscillator with respect to the phase of reference clock.

Figure 17:
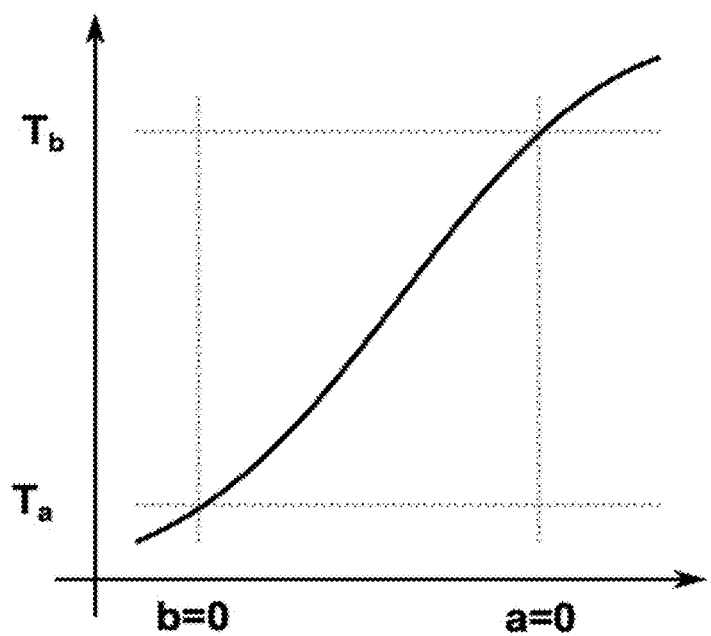
FIG. 17 illustrates phase interpolation based on interpolation a lock point between two consecutive diagonals of a two dimensional phase comparator array, in accordance with some embodiments.

Suppose for a given reference clock CkRefm and a given local oscillator phase CkPLLn, W(m,n)=a for (m−n)=0, W(m,n)=b for |m−n|=1, and zero for the rest of m and n values (noting that n must be considered modulo the width of the overall matrix, if the previously-described cyclic nature of the local clock phases applies.) Assuming that a+b=c, and c has a fixed value. In this case, by changing a, and b=c−a, it is possible to rotate the phase of VCO. If lock points corresponding to [a,b]=[c,0] and [a,b]=[0,c] are Ta and Tb, respectively, then as depicted in FIG. 17, by changing a (and inversely changing b=c−a) the lock point of oscillator can be adjusted between Ta and Tb.

Figure 18:
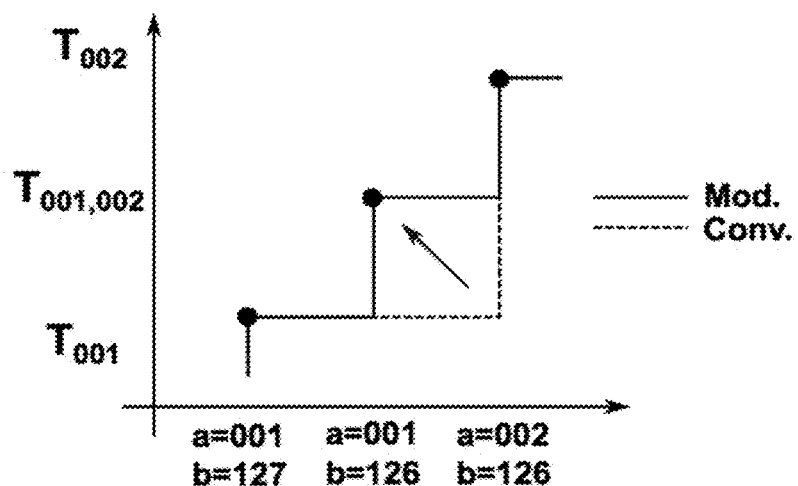
FIG. 18 illustrates improved resolution of a phase interpolator in a diagonal multi-phase detector structure, in accordance with some embodiments.

The same argument is valid for any other combination of the two consecutive sets of |m−n|=k and |m−n|=k+1 (k is an integer number smaller than the height of the phase comparator matrices, and n is modulo the width of the overall matrix, if the previously-described cyclic nature of the local clock phases applies.). Suppose a and b are the weights for two consecutive sets of diagonal comparators k and k+1. If a and b are controlled digitally with two independent sets of $N_b$ bits, then the resulted phase interpolator can exhibit $N_b+1$ bits of resolution. Illustrated in FIG. 18, it can be observed that by proper jogging between n(a) and n(b) (control bits corresponding to a and b, respectively), it is possible to add one extra phase point between every two phase steps of the original phase interpolator.

Phase Comparator Architecture

The flexibility and architectural simplicity of a matrix comparator may be offset by the potential complexity of its embodiment, in both the number of comparators used to fill an array of M×N elements, and in the implementation of the required weighting or scaling factor for each of those elements.

Figure 19A:
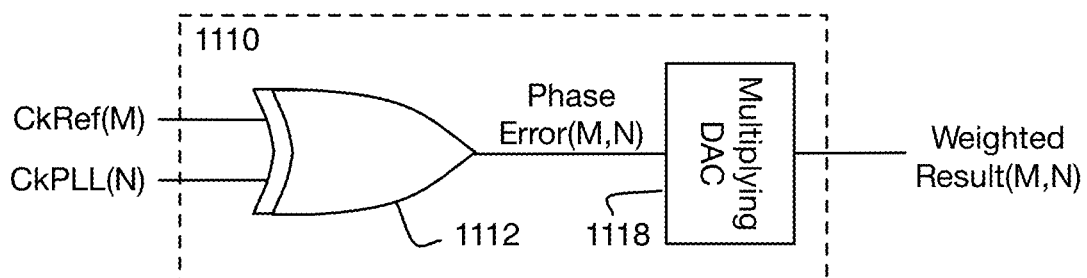
FIGS. 19A-19D illustrate various partial phase comparator architectures, in accordance with some embodiments.

As a non-limiting example, a PLL utilizing a matrix comparison of each of eight VCO clock phases against a single reference clock input includes eight comparator elements, each associated with a configurable or adjustable scaling factor, and one summation node to produce a combined error result. In one such embodiment shown in FIG. 19A, each partial phase comparator 1110 incorporates a multiplying DAC structure to implement the weighting factor as in 1118. In some embodiments, the weighting signal selectively enables one or more switching elements, which may include a transistor switch and a current source, for example. Thus the more switching elements are enabled, a higher weight will be applied to the partial phase-error signal.

Figure 19B:
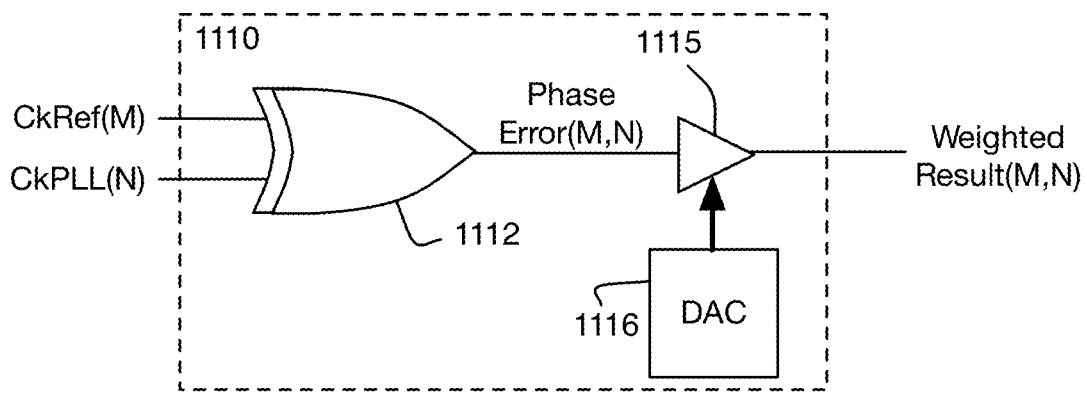

As the distributed capacitance of the DAC structure in the signal path may unreasonably degrade signal integrity, an alternative embodiment moves the DAC out of the signal path. In this second embodiment, a DAC element 1116 is used to scale or adjust supply voltages to a digital buffer element 1115 as in FIG. 19B, resulting in a scaled or weighted signal output.

Figure 19C:
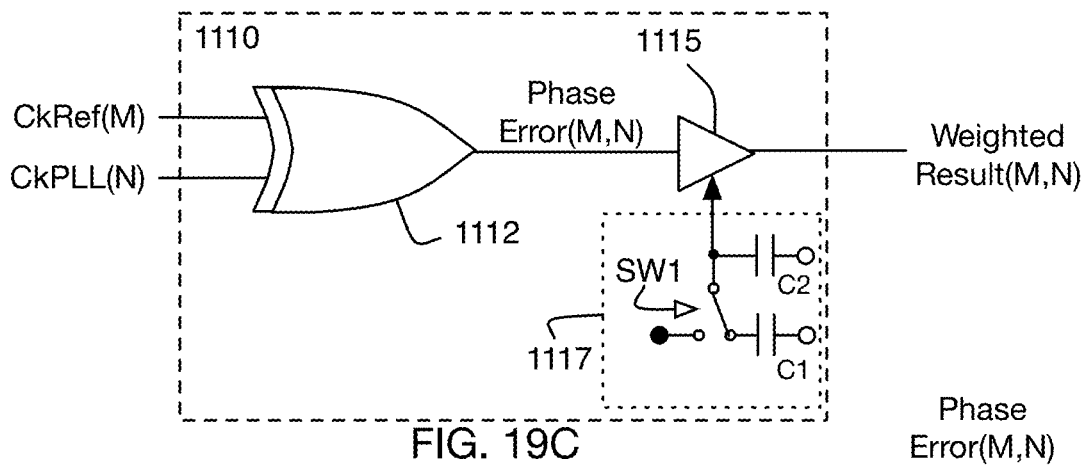

Circuit applications requiring low power operation may be incompatible with resistive DAC usage, thus a further embodiment utilizes switched capacitor technology. In this third embodiment of FIG. 19C, the scaled or adjusted supply voltages for buffer 1115 are produced dynamically 1117, by dumping measured amounts of charge from one or more source capacitances C1 into the buffering device's power rail capacitance C2. In this illustrative example switch SW1 is shown performing this charge transfer; switching transistors would be used in a practical embodiment, as well understood in the art, and either or both of C1 and C2 may be composed of discrete as well as parasitic or distributed capacitances.

Figure 19D:
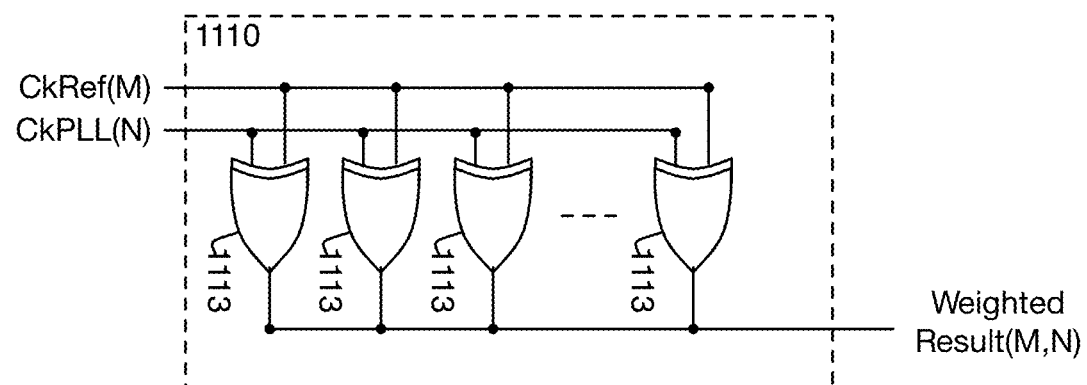

An alternative fourth embodiment shown as FIG. 19D does not attempt to adjust or modify the signal output of a single phase comparator, but instead utilizes a parallel set of phase comparators 1113 which collectively produce an aggregate output signal. In such an embodiment, the output drive capability of an individual phase comparator 1113 is constrained, e.g. by the transistor dimensions of its output driver. As one example, an aggregate output may be produced by passive summation of the individual phase comparator current outputs, and the overall output amplitude weighted or controlled by enabling or disabling phase comparators within the set, either individually (as one example, controlled by a thermometer code,) or in groups (as another example, controlled by a binary weighted code.)

Alternatively, FIG. 19D is one possible embodiment of a phase comparator that may function also as a phase interpolator. In such a scenario, the phase comparators 1113 may all receive a phase of a reference clock CkRef(M) and each phase comparator 1113 may receive a corresponding phase of the local oscillator signal CkPLL(0:N−1). In such embodiments, each phase comparator 1113 may include multiple XOR phase detectors connected in parallel (weights for each phase comparator 1113 not shown in FIG. 19D). For the purposes of the following example, assume each phase comparator element 1113 includes 32 XOR gates. If a total fixed number (e.g., 32) of XOR gates of between two adjacent phase comparators are enabled at a single time, one may interpolate between the two corresponding adjacent phases of the local oscillator signal. For example, if the two adjacent phases of the local oscillator signal are phases 000 and 090, then turning all 32 of XOR gates in the phase comparator 1113 receiving phase 000 and 0 of the XOR gates in phase comparator 1113 receiving phase 090, the local oscillator will lock phase 000 to the phase of reference clock. As XORs in the phase comparator 1113 receiving phase 000 are turned off and corresponding XORs in the phase comparator 1113 receiving phase 090 are turned on (maintaining the total number of enabled XORs at 32), the local oscillator gradually locks phases ranging from 0 to 90 degrees with respect to the received phase of the reference clock with 32 steps of phase resolution between adjacent phases. In some embodiments, the number of XOR gates enabled may not be fixed, but may be within a certain threshold to provide a linear phase interpolation relationship. Furthermore, various thermometer codes may be developed to map a phase interpolator control signal to bits of a thermometer code to enable/disable individual XOR elements in each phase comparator 1113. Furthermore, as XOR based phase comparators are configurable for providing current-mode outputs, the phase detector further acts as a charge pump circuit. Thus, in some embodiments, the phase comparator shown in 19D may incorporate (i) phase interpolation, (ii) phase comparison, and (iii) an integrated charge pump circuit.

Figure 20A:
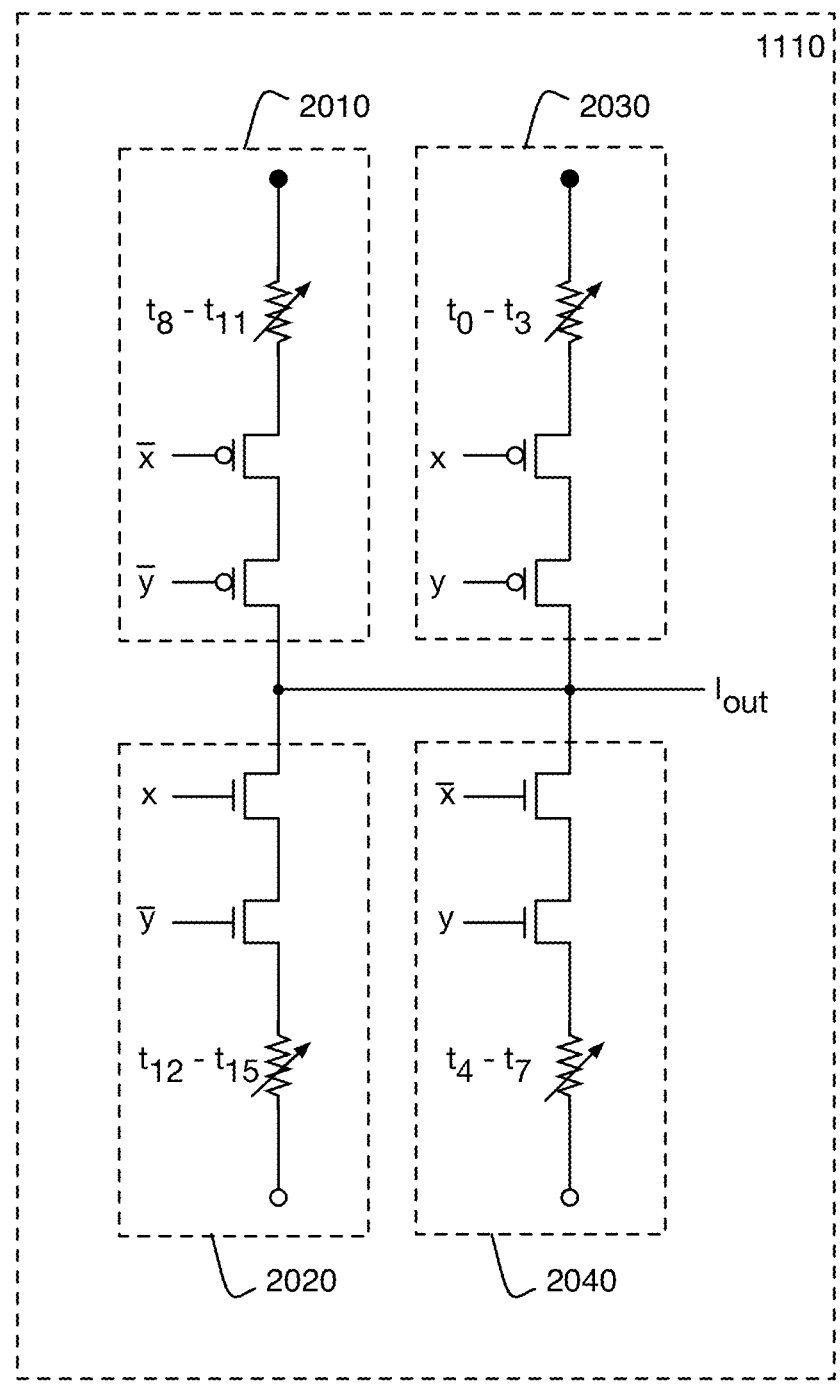
FIG. 20A illustrates an exemplary XOR phase comparator architecture, in accordance with some embodiments.
Figure 20B:
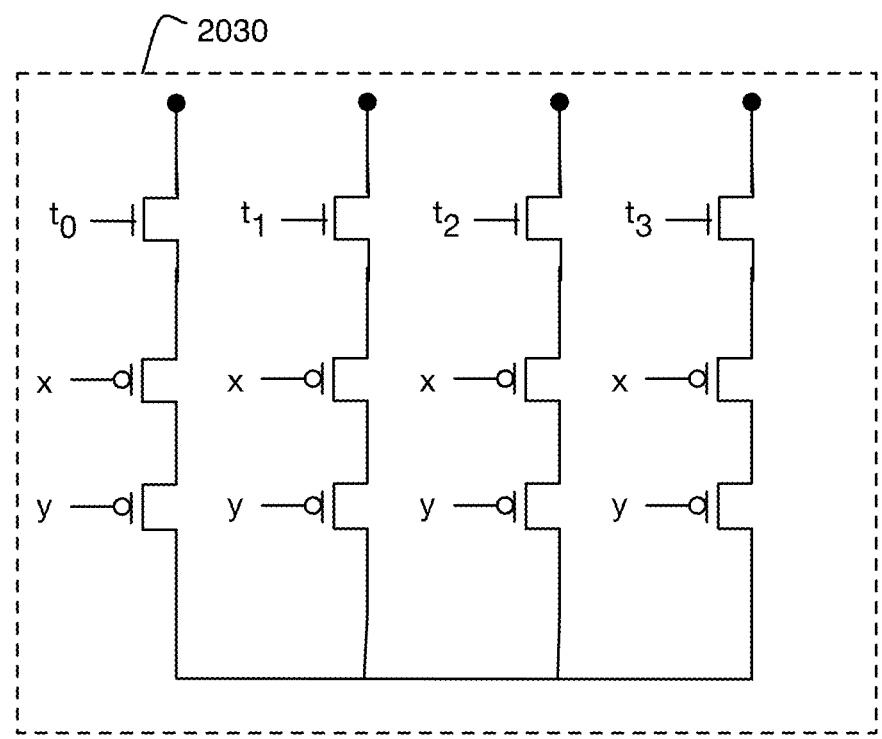
FIG. 20B illustrates an exemplary weighted branch of the XOR gate of FIG. 20A, in accordance with some embodiments.
Figure 21:
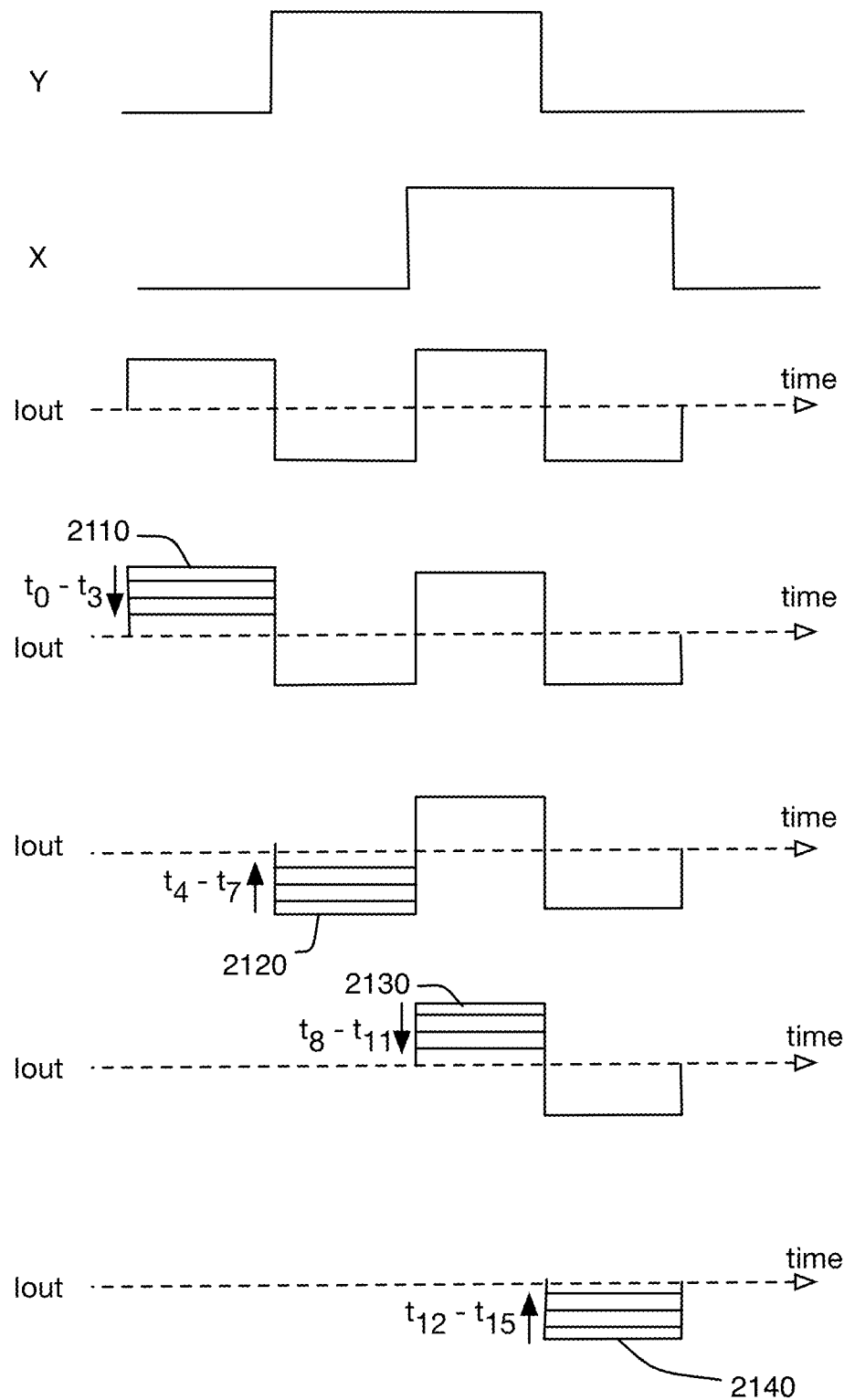
FIG. 21 illustrates a timing diagram of output currents Iout of an XOR phase comparator shown in FIG. 20, in accordance with some embodiments.

During high-speed simulation of that fourth embodiment, transient output variations were observed within the gate propagation time of the XOR phase detector element, that is, at a finer granularity than the overall behavior of the XOR gate as a whole. It was noted that an exclusive-OR function may be decomposed into distinct NOT-AND-OR logic elements as described by the well-known Boolean equation $(x \cdot \bar{y})+(\bar{x} \cdot y)$, and the observed behavior suggested that variations among the different current paths within the gate implementation were producing the observed variations. This lead to the embodiment of FIG. 20A, where the four signal paths 2010, 2020, 2030, 2040 are composed of series transistors forming conductive branches configured to respectively compute the logical cases $\bar{x} \cdot \bar{y}$, $x \cdot \bar{y}$, $\bar{x} \cdot y$, $x \cdot y$, each path further includes an adjustable or configurable impedance which may be a resistor, a current source/sink, or in some embodiments may be implemented as a scaling of transistor geometry to constrain current flow in that signal path. Such a geometry may include incorporating multiple parallel transistor branches, and the variable resistor shown may correspond to transistor switches enabling or disabling a given branch. Such an embodiment is shown in FIG. 20B. A timing diagram illustrating the output Iout resulting from inputs X and Y is shown in FIG. 21. A timing diagram illustrating the output Iout resulting from inputs X and Y is shown in FIG. 21.

Adjustment of the four signal path impedances by introducing path resistance, scaling transistor dimensions, or directly adjusting current flows may be used to control output amplitude within the overall response of the XOR gate as a whole, thus producing the desired weighing function. As one example, consider each signal path impedance in FIG. 20 as being composed of four parallel resistors each controlled by a transistor switch. In such a case, a portion of a weighting signal which may be a four-bit thermometer code $t_0$-$t_3$ (as one example offered without limitation) can enable four distinct levels of current flow within signal path 1920, which may be seen in FIG. 21 to adjust one segment 2110 of the overall output Iout. Continuing this example, $t_4$-$t_7$ adjusts segment 2120, $t_8$-$t_{11}$ adjusts segment 2130, and $t_{12}$-$t_{15}$ adjusts segment 2140. Although in some embodiments the weights of each of the four segments will be adjusted identically, this is not required. As examples, $t_0$-$t_3$ and $t_4$-$t_7$ may be configured to different values than $t_8$-$t_{11}$ and $t_{12}$-$t_{15}$ to provide increased overall adjustment granularity as previously described relative to FIG. 5. As another example, $t_0$-$t_3$ and $t_8$-$t_{11}$ may be configured to different values than $t_4$-$t_7$ and $t_{12}$-$t_{15}$ to intentionally introduce a DC offset at the output.

The capability to independently adjust the four segments of each XOR operation can also facilitate the previously-described matrix comparator operations. As one example, two XOR comparators as in FIG. 20 with outputs connected to a common summation node may be used to compare a reference clock with two local clock phases, as previously described. If interpolation control values a, b, c, d represent the weighting signals applied to the first XOR segments, and 1-*a*, 1-*b*, 1-*c*, 1-*d* represent the weighting signals applied to the second XOR segments, the common summation node result corresponds to an interpolation between the first and second local clock phase comparisons, with the interpolation control values permitting adjustment of the effective clock phase.

Alternatively, scaled transistors or explicit current source/sink circuits may be used instead of resistors to control current flow; as in the resistive example, different numbers of enabled and disabled parallel current paths may be used to adjust the overall output Iout. the portions of the weighting signal above collectively form the weighting signal $t_0$-$t_{15}$ for the corresponding partial phase comparator.

The adjustable or configurable elements described herein may be combined with or equivalently be substituted by comparable known art elements, including without limitation R-2R ladder structures controlled by transistor switches, resistive chain structures controlled by transistor switches, equal-value or binary-weighted resistors configured in series- or parallel-connected combination by transistor switches, and fixed and/or configurable current sources and current sinks.

Specific values and quantities described in examples are provided to facilitate explanation, without implying limitation.

Simulations

Figure 22:
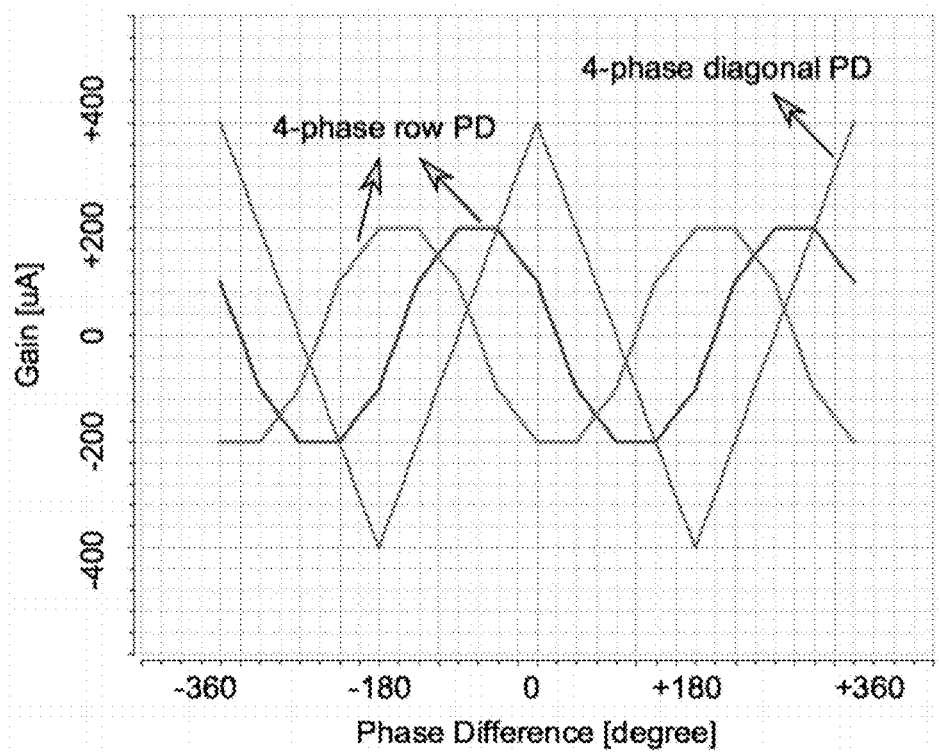
FIG. 22 is a simulated phase comparator response, in accordance with some embodiments.

The steady state response of two different types of phase comparators are shown in FIG. 22. In these simulations XOR based phase comparator cells have been utilized. The gain of a diagonal phase comparator versus input phase difference is very similar to a simple XOR phase comparator. The main difference between the two phase comparators is that error signal produced by a diagonal phase comparator is distributed in time. The row phase comparator, however, exhibits a different response. As can be seen, depending on which row of the matrix comparator has been selected, the response exhibits a different shift in time. FIG. 22 shows the response for two different cases.

An MCPLL (matrix phase comparator based CPLL) has been designed in a conventional 28-nm CMOS technology. A current steering architecture with $K_{VCO}{\approx}20$ GHz/V is selected for the VCO. A loop filter as shown in FIG. 24 is chosen to be R1=100 Ω in series to C1=20 pF with ICPC=100 μA. The reference clock frequency is 6.25 GHz with $N_{div}$=1. The XOR CPLL is based on 2R×2F architecture (comparing 2 reference phases with 2 feedback phases at every reference clock cycle). For the implemented MCPLL, a 2R×4F architecture has been chosen.

Figure 23:
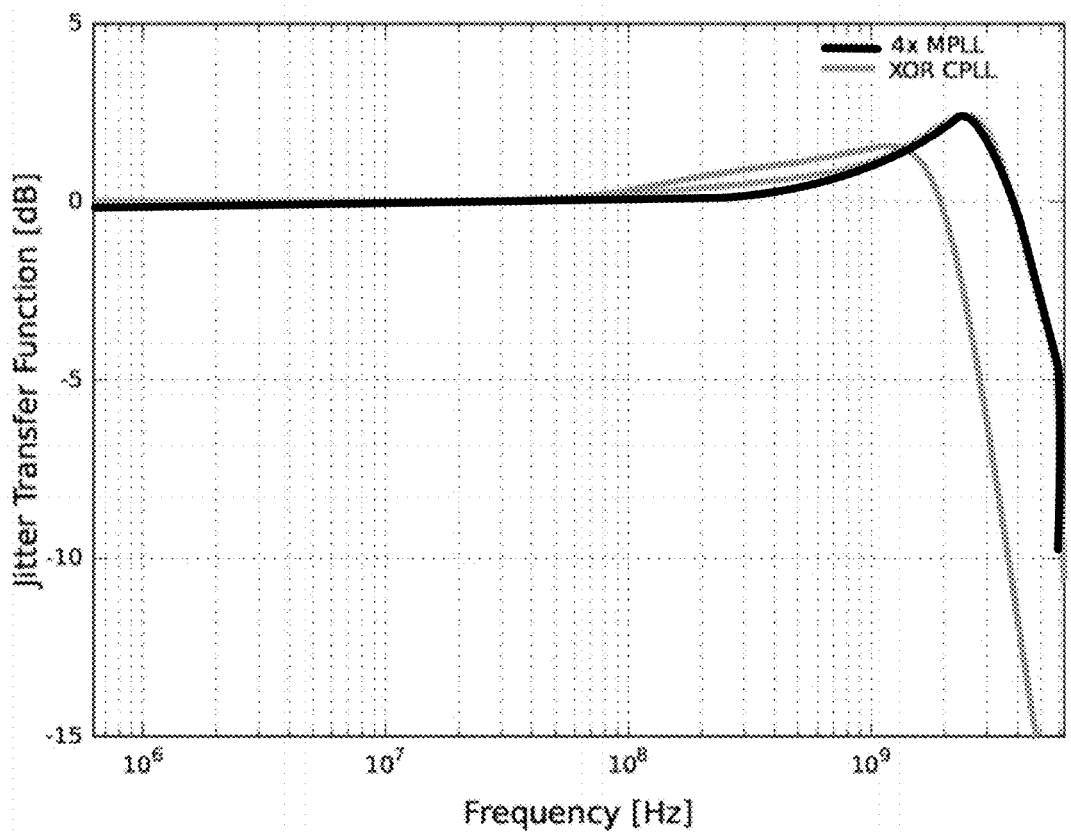
FIG. 23 is a simulation of a phase-locked loop bandwidth, in accordance with some embodiments.

FIG. 23 shows the transfer characteristics of the two PLLs simulated in transistor level. As shown, the input signal is sampled at 2fref, hence the system Nyquist rate is fref. Because of that, as depicted in FIG. 22, both PLLs have a null at fref=6.25 GHz. The parasitic pole of the VCO in addition to the parasitic pole at the output of CPC cause 1.2 and 2.4 dB peaking in CPLL and MPLL, respectively, for the two PLLs. It can be seen also that the MCPLL transfer characteristic stays closer to 0 dB between 100 MHz to 1.2 GHz. The cutoff frequency for the two PLLs are 2.48 (=40% fref) and 5.02 GHz (=80% of fref), respectively. Therefore, it can provide better jitter tracking. Moreover, MCPLL generates 55 fs of rms jitter, while jitter generation for CPLL is 79 fs rms. Due to higher BW, the phase noise of VCO in MCPLL is filtered out over a wider range and because of that this architecture exhibits considerably lower jitter generation, comparable to performance of LV VCO based PLLs.

Transmitter Embodiment

A further embodiment uses the PLL architecture of FIG. 1 to produce local clocks in a wire transmitter embodiment compatible with the previously described receiver embodiments. In this embodiment, a customer-supplied low frequency clock is provided to the PLL as a reference input 1018, with the internal VCO operating at a significantly higher frequency to support multiphase data preparation and wire signal output.

In one particular embodiment, the PLL provides a 40× clock multiplication from a 153.125 MHz reference clock to a 6.125 GHz VCO frequency. As with the earlier embodiments, a four stage differential ring oscillator 340 is used as a VCO, thus providing as many as eight distinct output phases (i.e. two differential polarities at each of four taps.) As the duty cycle of the external reference clock is not specified, only the falling edge is used for phase comparison using a known art phase and frequency comparator, with frequency divider 350 providing a 40:1 division of VCO frequency to produce local clocks suitable for comparison with the reference clock. As with the previously-described embodiments, the individual output weights of the various matrix comparison elements may be configured or adjusted to implement additional filtering behavior, introduce a phase lock offset, etc.

As in the earlier examples incorporating 2:1 divisors in the loop, the multiphase local clocks utilized with a matrix phase comparator must derive their output transition timing from the particular VCO phases they represent. Using the example of a four phase matrix comparison (with no limitation implied,) one embodiment incorporates four distinct divider chains clocked respectively by the four VCO phases, such that each divider chain's output transitions are temporally associated with its respective clock source. A second embodiment relies on a single divider chain to produce a comparison window or interval near each anticipated reference clock edge to be used for phase comparison. Within that window or interval, one edge derived from each VCO clock phase is phase compared to the reference clock edge, the resulting phase differences being weighted and summed as previously described. A further embodiment additionally utilizes known art finite state machine phase detectors to compare each local clock instance to the reference clock, operation of said state machines being enabled only during the comparison window or interval.

Clock Quality Improvement

As previously mentioned, matrix phase comparators may be used to provide Inter-VCO-phase comparison, as examples to detect and correct duty-cycle and quadrature mismatch errors (QME) and reduce VCO jitter.

Figure 25:
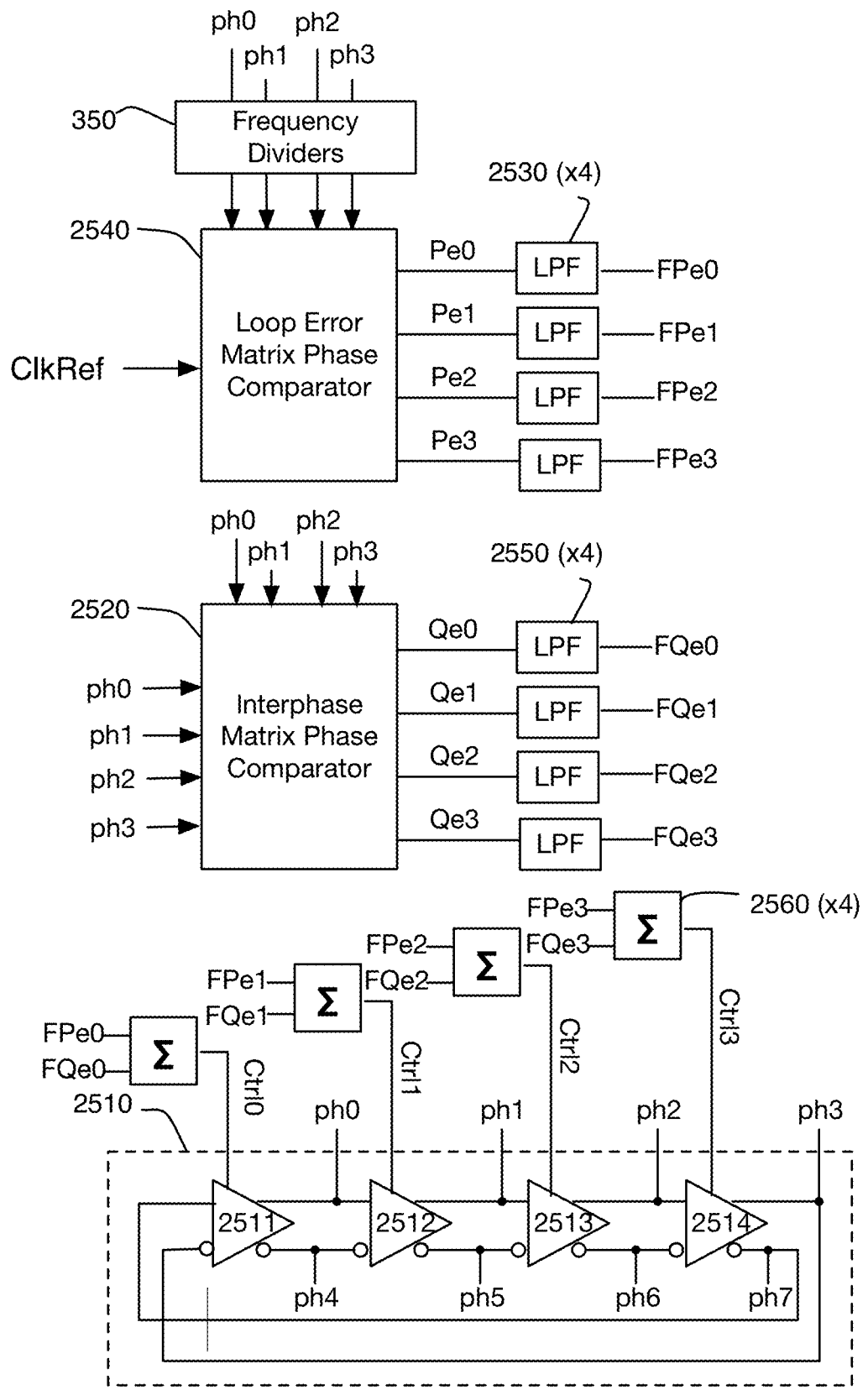
FIG. 25 is a block diagram of a voltage controlled oscillator controlled by a first matrix phase comparator measuring error relative to an external reference, and a second matrix phase comparator measuring error between local clock phases.

It is well understood that ring oscillators such as 2510 of FIG. 25 may exhibit propagation time variation between internal buffer elements 2511, 2512, 2513, 2514, resulting in undesirable timing variation between output taps, which in FIG. 25 are output phases ph0, ph1, ph2, ph3.

FIG. 25 is a block diagram, in accordance with some embodiments. As shown, FIG. 25 shows an interphase matrix phase comparator 2520 accepting multiple phases of the local oscillator signal ph0, ph1, ph2, ph3 produced by a local oscillator VCO 2510 to produce phase-specific quadrature error signals Qe0, Qe1, Qe2, Qe3. Each phase-specific quadrature error signal is produced by comparing a respective phase of the local oscillator signal to two or more other phases of the local oscillator signal using as a non-limiting example XOR matrix phase comparison elements. The resulting phase-specific quadrature error signals Qe0, Qe1, Qe2, Qe3 correlate to delay variations within ring oscillator delay stages 2511, 2512, 2513, and 2514 respectively. That is, each delay stage is adjusted by a phase-specific quadrature error signal associated with at least one of the phases generated by said delay stage. As described in previous examples, loop error matrix phase comparator 2540 is configured to generate a loop error signal between phases of the local oscillator signal ph0, ph1, ph2, ph3 and phases of a reference clock ClkRef. The loop error signals are representative of the loop phase error for the respective clock phases. As with the previous example of FIG. 10, frequency dividers 350 may be utilized in some embodiments to divide each of the local clock phases ph0, ph1, ph2, ph3 (as one example, using binary counters) before phase comparison 2520, allowing the PLL local clocks to operate at a predetermined multiple of the rate of ClkRef. In some embodiments, the loop error signal is an aggregate loop error signal, such as the aggregate loop error signal 1145 shown in FIG. 11B. In such an embodiment, the loop error matrix phase comparator may perform a full matrix comparison by comparing multiple phases of the local oscillator signal to multiple phases of the reference clock. Alternatively, the loop error matrix phase comparator may perform a diagonal comparison by comparing each phase of the local oscillator signal to a corresponding phase of the reference clock (e.g., phase 000 to phase 000, phase 045 to phase 045, etc.). The aggregate loop error signal may be provided to all delay stages of the local oscillator to adjust the delay stages in a uniform fashion. Such an adjustment may be referred to as a "coarse" or "global" adjustment. The phase-specific quadrature error signals are specific to the delay stage generating the corresponding phase of the local oscillator, and may thus provide a "fine" or "local" adjustment by individually adjusting each delay stage.

In embodiments where the phase error signals generated by loop error matrix phase comparator 2540 and those generated by interphase matrix phase comparator 2520 operate at different rates, the filters may have different cutoff frequencies. That is, as both the sampling interval and response time constant of the two error sources differ significantly, separate Low Pass Filter instances 2530 and 2550 may be applied to loop error signals and phase-specific quadrature error signals respectively, before the filtered error results are summed to produce combined phase error results Ctrl0, Ctrl1, Ctrl2, Ctrl3, or individually provided to the delay stages. In some embodiments, the cutoff frequencies and thus the loop time constants associated with filters 2530 and 2550 may differ significantly, as changes in quadrature error may generally be associated with thermal variations and other long-term circuit drift behaviors, thus warranting a very slow loop correction time constant. The loop and phase-specific quadrature error signals adjust the delay stages in ring oscillator 2510, the individual adjustments contributing to a reduction in duty-cycle and quadrature error among the phases of the local oscillator signal, and the collective adjustment maintaining overall loop lock to the reference clock signal. The exemplary use of four clock phases derived from a four stage ring oscillator is illustrative, with no limitation implied as to either number of clock phases or how they are generated. Similarly, embodiments may utilize single or multiple low pass filter instances located before or after error summation.

An alternative PLL embodiment incorporates a ring oscillator VCO in which both the supply currents and internal node capacitances are adjustable, as previously described herein. In such embodiments, supply currents may provide a coarse adjustment by being collectively adjusted in response to loop phase error, and internal node capacitances are finely adjusted individually in each stage in response to duty cycle and quadrature phase error. In a further embodiment, duty cycle and quadrature phase errors are made available to a control processor that periodically adjusts one or more internal node capacitances. In some embodiments, said control processor may be embodied in a programmable CPU executing a program, as a hardwired or programmable state machine, or as dedicated Boolean logic.

Figure 33:
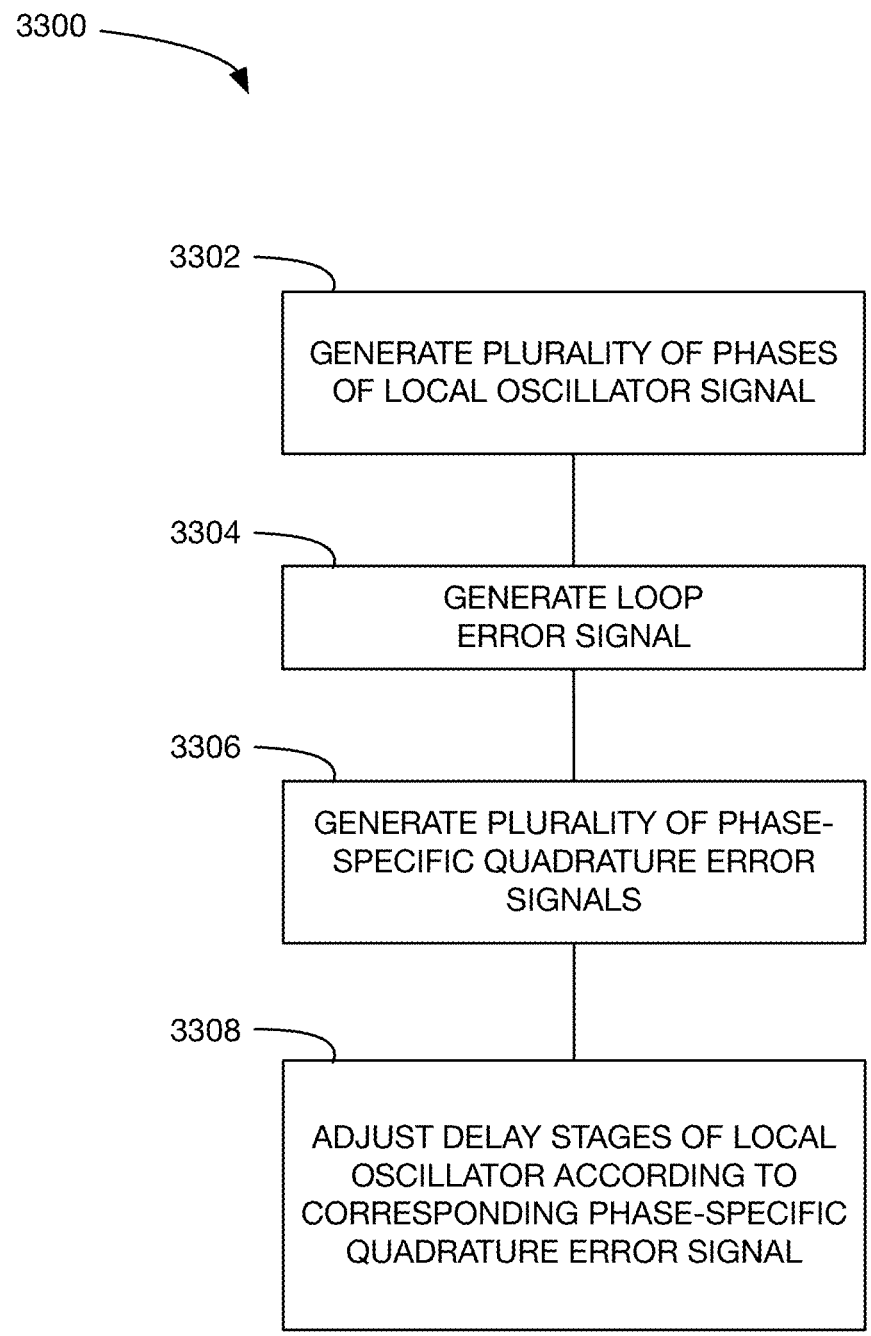
FIG. 33 is a flowchart of a method, in accordance with some embodiments.

FIG. 33 is a flowchart of a method 3300, in accordance with some embodiments. As shown, method 3300 includes generating 3302, at a plurality of delay stages of a local oscillator, a plurality of phases of a local oscillator signal. At step 3304, the plurality of phases of the local oscillator signal are provided to a loop error matrix phase comparator for a loop error signal based on a comparison of one or more phases of the local oscillator signal to one or more phases of a received reference clock. At step 3306, the plurality of phases of the local oscillator signal are provided to an interphase matrix phase comparator for generating a plurality of phase-specific quadrature error signals, each phase-specific quadrature error signal associated with a respective phase of the plurality of phases of the local oscillator signal, each phase-specific quadrature error signal based on a comparison of the respective phase to two or more other phases of the local oscillator signal. At step 3308, each delay stage is adjusted according to (i) a corresponding phase-specific quadrature error signal of the plurality of phase-specific quadrature error signals and (ii) the loop error signal.

In some embodiments, the loop error signal includes a plurality of phase-specific loop error signals, each phase-specific loop error signal associated with a respective phase of the plurality of phases of the local oscillator signal, and wherein generating each phase-specific loop error signal comprises comparing the respective phase of the local oscillator signal to one or more phases of the received reference clock. In such embodiments, generating each phase-specific loop error signal may include comparing the respective phase of the local oscillator signal to a corresponding phase of the received reference clock. In some embodiments, the method further includes providing each phase-specific loop error signal to a corresponding delay stage of the plurality of delay stages.

In some embodiments, the loop error signal is an aggregate loop error signal, and generating the aggregate loop error signal includes comparing all phases of the local oscillator signal to one or more phases of the received reference clock. In some embodiments, a full matrix comparison is made, while alternative embodiments may make a partial matrix comparison. In such embodiments generating an aggregate loop error signal, the aggregate loop error signal is provided to each delay stage in the plurality of delay stages in the local oscillator. Such embodiments allow the aggregate loop error signal to make a global (e.g., coarse) adjustment to the local oscillator, while local (e.g., fine) adjustments are made according to the phase-specific quadrature error signals.

In some embodiments, the method further includes providing the plurality of local oscillator signals to a frequency divider prior to providing the local oscillator signals to the loop error matrix phase comparator.

In some embodiments, the method further includes low-pass filtering the loop error signal and the plurality of phase-specific quadrature error signals, wherein the phase-specific quadrature error signals are filtered using a lower cutoff frequency than the loop error signal. In some embodiments, adjusting at least one delay stage includes adjusting an output node capacitance of the at least one delay stage. In some embodiments, adjusting at least one delay stage includes adjusting a supply current of the at least one delay stage.

Figure 26:
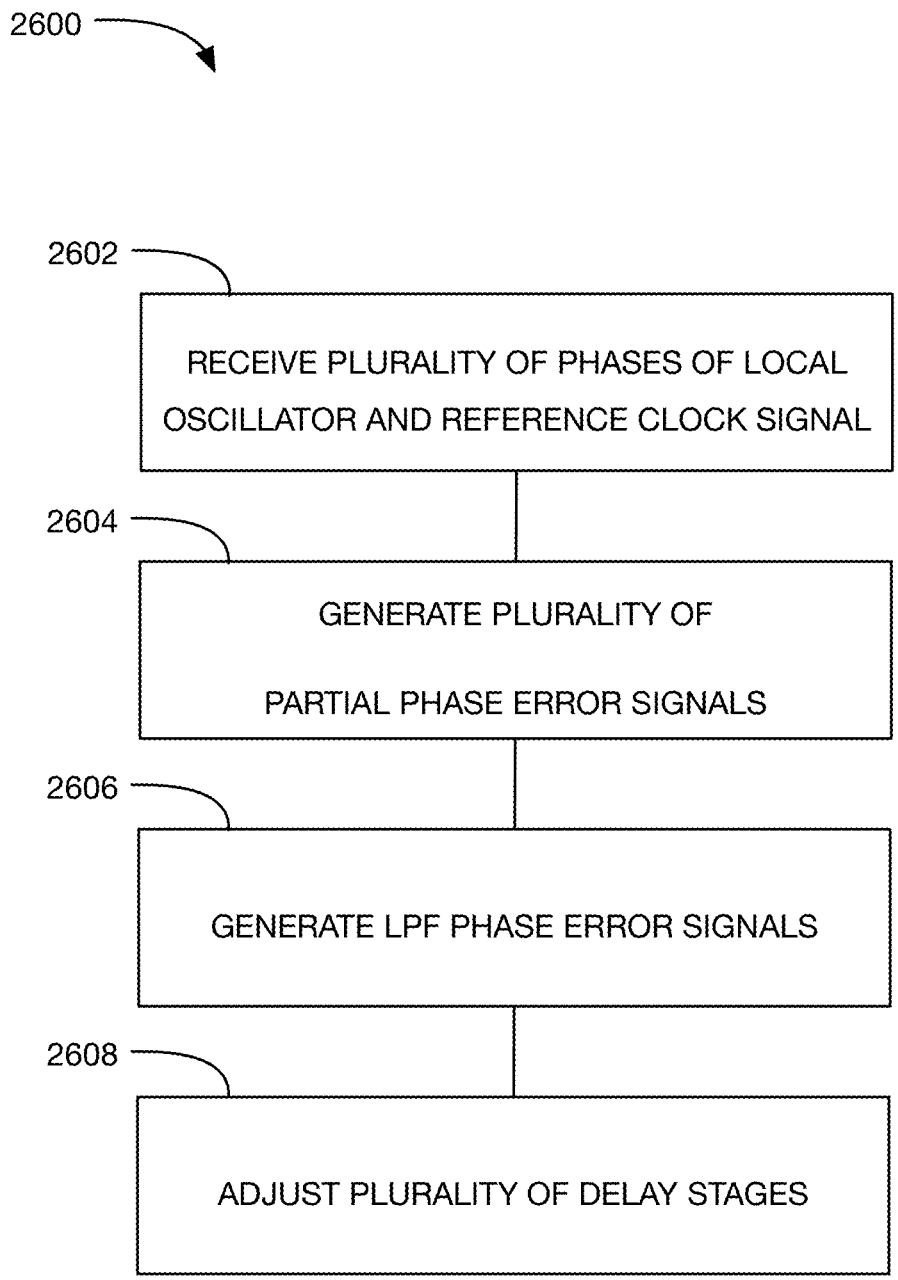
FIG. 26 is a flowchart of a method, in accordance with some embodiments.

FIG. 26 is a flowchart of a method 2600, in accordance with some embodiments. As shown, method 2600 includes receiving, at step 2602, a plurality of phases of a local oscillator ph0-3 and a reference clock signal $Clk_{Ref}$ at a matrix phase comparator (which may broadly encompass the combination of matrix phase comparators 2540 and 2520), and responsively generating, at step 2604, a plurality of partial phase error signals, the plurality of partial phase error signals comprising (i) quadrature phase error signals $Qe_{0-3}$ representing comparisons between the phases of the local oscillator and (ii) loop phase error signals $Pe_{0-3}$ representing comparisons between the plurality of phases of the local oscillator ph0-3 and the reference clock signal $Clk_{Ref}$. At step 2606, a plurality of low-pass filtered (LPF) quadrature phase error signals $FQe_{0-3}$ and a plurality of LPF loop phase error signals $FPe_{0-3}$ are generated. Finally, at step 2608, the method includes adjusting a plurality of delay stages 2511-2514 in a local oscillator 2510, each delay stage adjusted according to a corresponding LPF quadrature phase error signal and a corresponding LPF loop phase error signal, each delay stage generating a corresponding phase of the plurality of phases of the local oscillator.

In some embodiments, adjusting the plurality of delay stages includes adjusting a node capacitance of each delay stage according to the corresponding LPF quadrature phase error signal. In some embodiments, adjusting the plurality of delay stages includes adjusting a gate current of each delay stage according to the corresponding LPF loop phase error signal.

In some embodiments, adjusting each delay stage according to the corresponding LPF quadrature phase error signal and the corresponding LPF loop phase error signal includes generating an associated composite phase error signal Ctrl0-3 formed by summing the corresponding LPF quadrature phase error signal $FQe_{0-3}$ and the corresponding LPF loop phase error signal $FPe_{0-3}$.

In some embodiments, the method further includes filtering the quadrature phase error signals using filters 2550 having a first frequency response and filtering the loop phase error signals using filters 2530 having a second frequency response. In some embodiments, the first and second frequency responses are different.

In some embodiments, the plurality of phases of the local oscillator are received from a frequency divider 350. In some embodiments, the reference clock signal is received from a frequency divider (not shown).

In some embodiments, an apparatus includes a matrix phase comparator, depicted for example by a combination of matrix phase comparators 2520 and 2540, the matrix phase comparator configured to receive a plurality of phases of a local oscillator ph0-ph3 and a reference clock signal $Clk_{Ref}$, and to generate a plurality of partial phase error signals, the plurality of partial phase error signals comprising (i) quadrature phase error signals $Qe_{0-3}$ representing comparisons between the phases of the local oscillator ph0-ph3 and (ii) loop phase error signals Pe0-3 representing comparisons between the plurality of phases of the local oscillator ph0-ph3 and the reference clock signal $Clk_{Ref}$. In some embodiments, the apparatus further includes a summation circuit, including summers 2560, the summation unit configured to receive the plurality of partial phase error signals and to responsively generate a plurality of low-pass filtered composite phase error signals Ctrl0-3, each low-pass filtered composite phase error signal formed by a summation of a corresponding quadrature phase error signal and a corresponding loop phase error signal, and a local oscillator 2510 including a plurality of delay stages 2511-2514, each delay stage configured to receive a corresponding low-pass filtered composite phase error signal Ctrl0-3 and to responsively generate a corresponding phase of the plurality of phases of the local oscillator.

In some embodiments, the apparatus further includes a control processor (not shown) configured to receive the low-pass-filtered composite phase error signals from the summation circuit and to periodically provide the low-pass filtered composite phase error signals to the local oscillator.

In some embodiments, the summation circuit includes a plurality of low-pass-filters (LPF). In some embodiments, the plurality of LPF includes a first set of LPFs having a first frequency response and a second set of LPFs having a second frequency response, the first and second sets of LPFs configured to receive the quadrature and loop phase error signals respectively, and to generate LPF quadrature and loop phase error signals, respectively. In some embodiments, each low-pass filtered composite phase error signal is formed based on a summation of a corresponding LPF quadrature phase error signal and a corresponding LPF loop phase error signal. In some embodiments, the summation circuit is configured to generate each low-pass filtered composite phase error signal by filtering the summation of the corresponding quadrature phase error signal and the corresponding loop phase error signal.

In an alternative embodiment, an apparatus includes the matrix phase comparator configured to receive a plurality of phases of a local oscillator and a reference clock signal, and to generate a plurality of partial phase error signals, the plurality of partial phase error signals comprising (i) quadrature phase error signals representing comparisons between the phases of the local oscillator and (ii) loop phase error signals representing comparisons between the plurality of phases of the local oscillator and the reference clock signal, a plurality of filters configured to receive the plurality of partial phase error signals, and to responsively generate a plurality of low-pass filtered (LPF) quadrature phase error signals and a plurality of LPF loop phase error signals, and a local oscillator including a plurality of delay stages, each delay stage configured to receive a corresponding LPF quadrature phase error signal configured to adjust a corresponding node capacitance of the delay stage and a corresponding LPF loop phase error signal configured to adjust a corresponding gate current of the delay stage.

In some embodiments, an internal node capacitance of each delay stage is adjusted according to the corresponding LPF quadrature phase error signal. In some embodiments, a gate current of each delay stage is adjusted according to the corresponding LPF loop phase error signal.

In some embodiments, the plurality of filters includes a first set of LPFs having a first frequency response and a second set of LPFs having a second frequency response, the first and second sets of LPFs configured to receive the quadrature and loop phase error signals respectively. In some embodiments, the first and second frequency responses are different.

In some embodiments, the apparatus further includes a control processor configured to receive the LPF quadrature and loop phase error signals, and to provide the LPF quadrature and loop phase error signals periodically to the plurality of delay stages.

Combined PI and PFD

Figure 27:
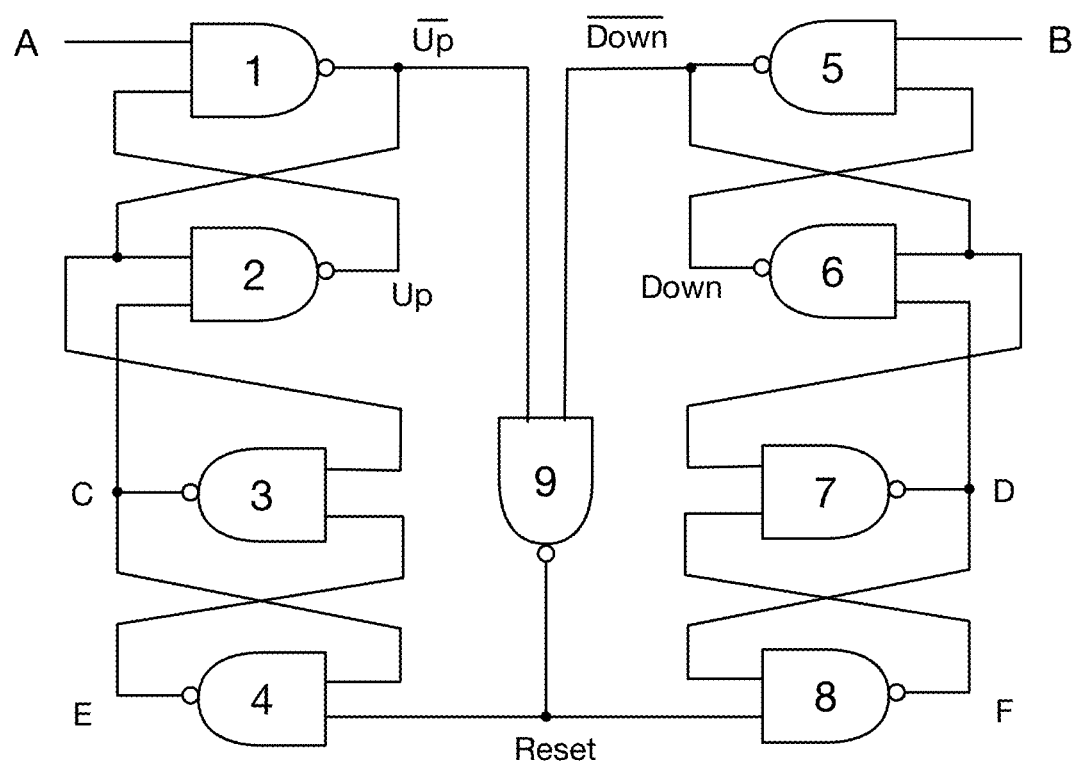
FIG. 27 is a diagram of a NAND implemented phase-frequency detector (PFD), in accordance with some embodiments.
Figure 30:
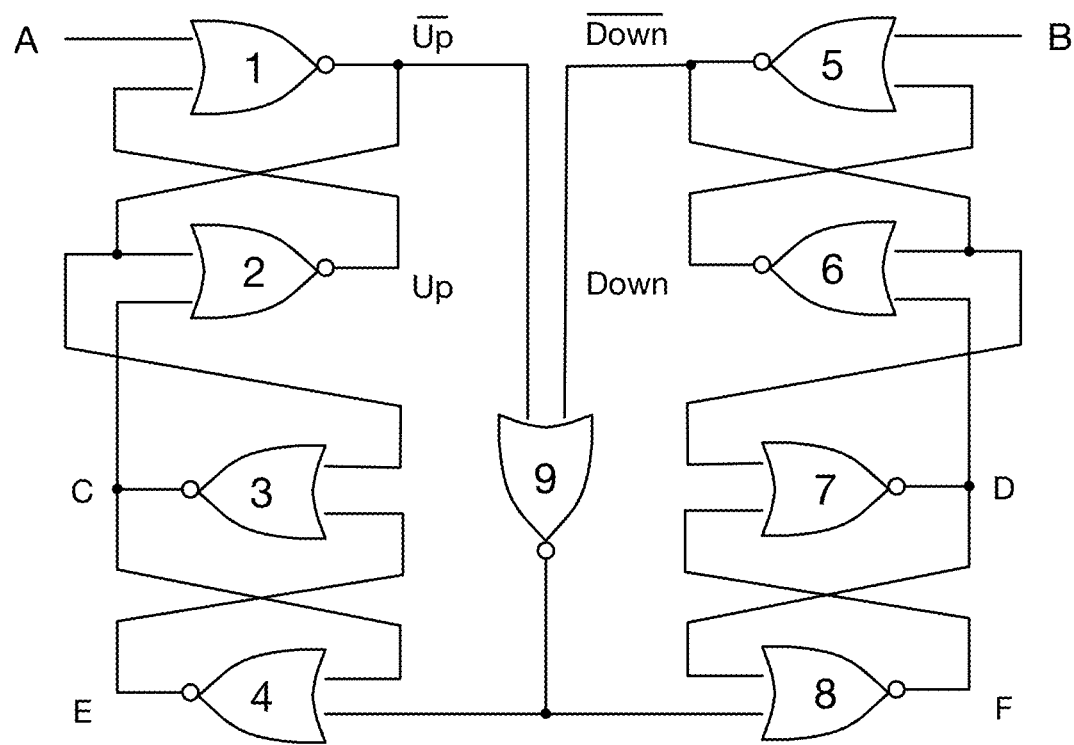
FIG. 30 is a diagram of a NOR implemented PFD, in accordance with some embodiments.
Figure 31:
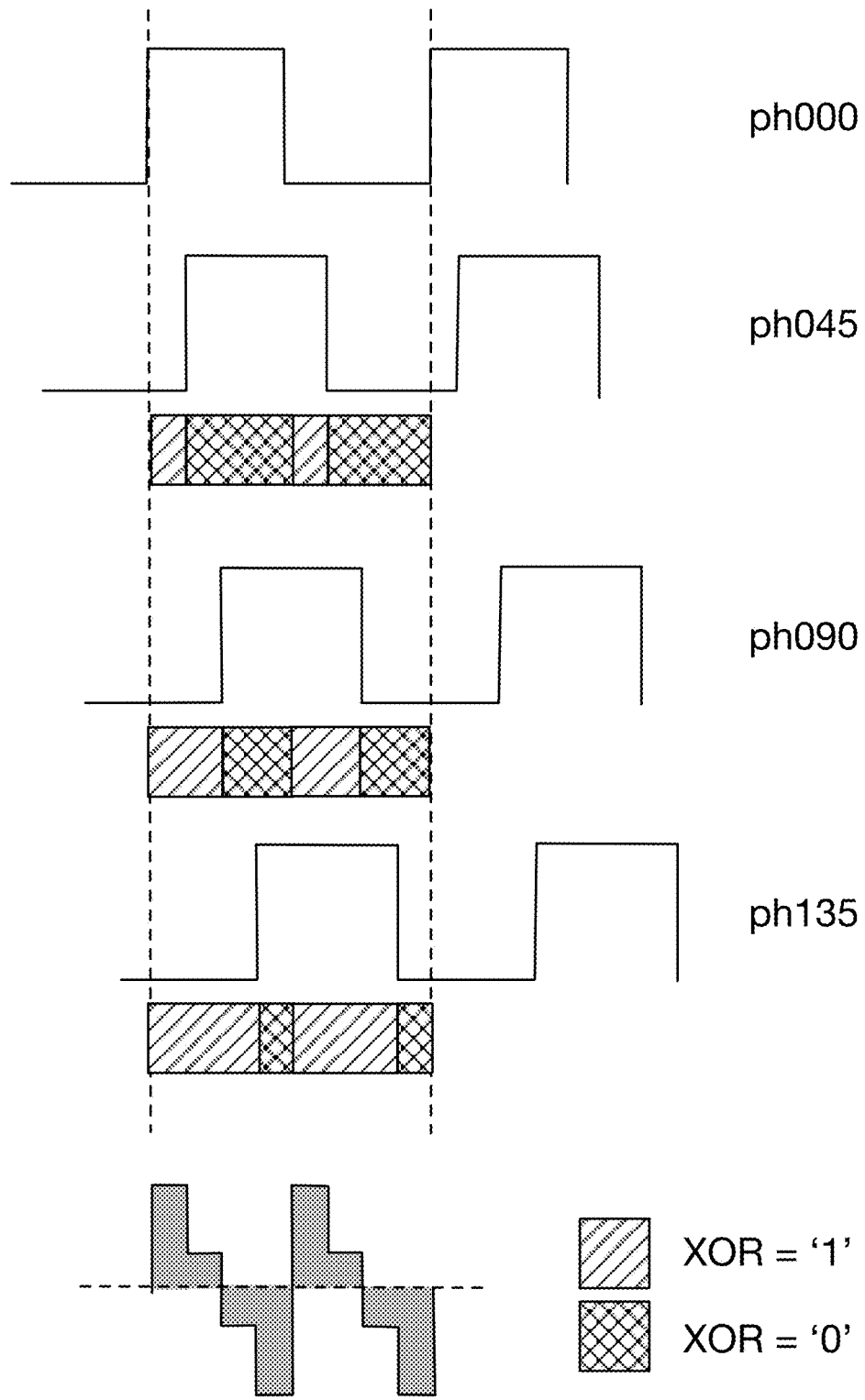
FIG. 31 is a timing diagram of an interphase comparison between phases of a local oscillator signal in a locked condition, in accordance with some embodiments.
Figure 32:
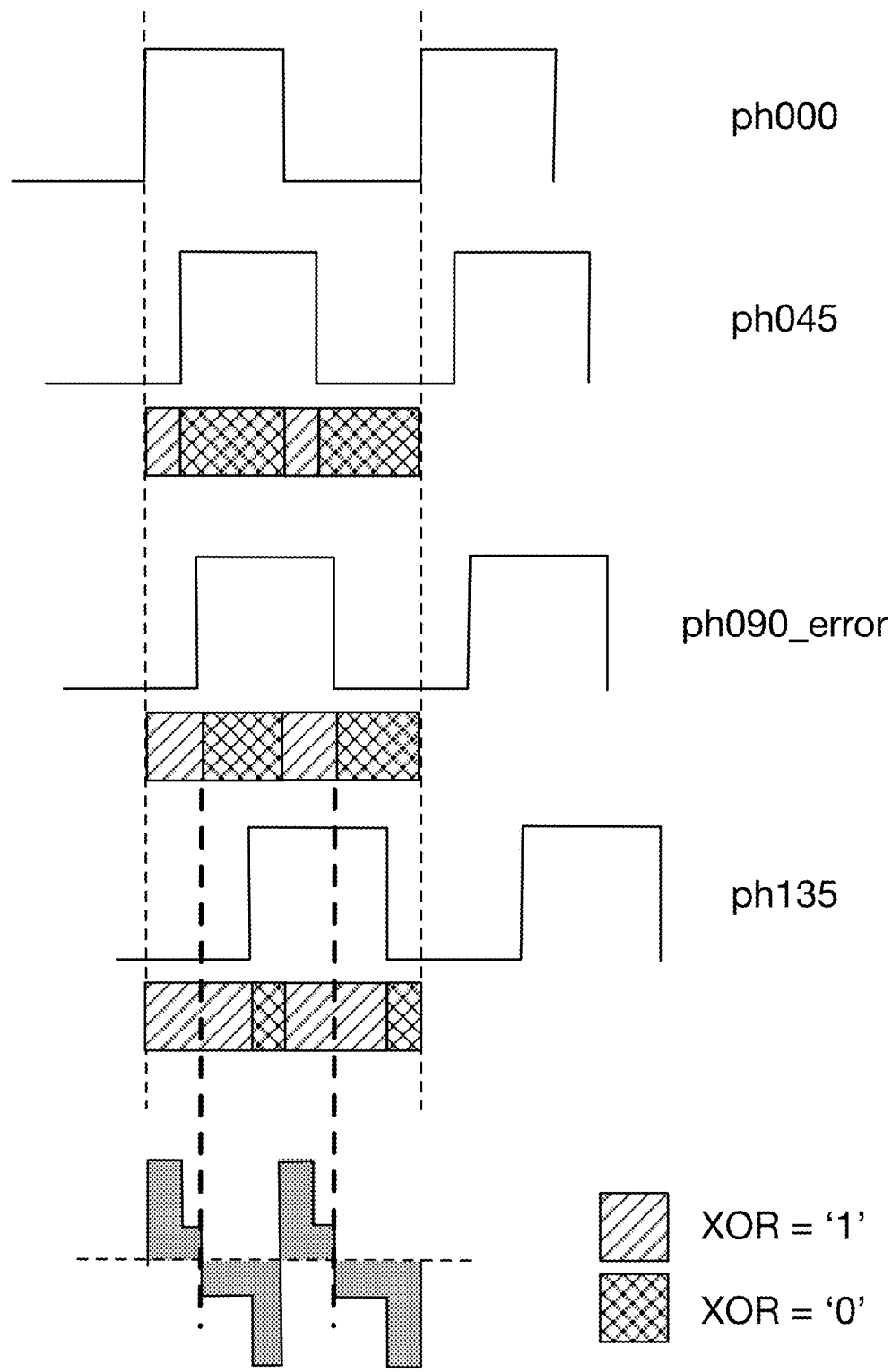
FIG. 32 is a timing diagram of an interphase comparison between phases of a local oscillator signal in a non-locked condition, in accordance with some embodiments.

Described below is an alternative embodiment that utilizes a PFD with an integrated phase interpolator. Such embodiments may be advantageous, as PIs may consume significant amounts of power, as well as introduce additional delay and/or jitter into a system. FIG. 27 is a diagram of a conventional NAND PFD configured to receive a phase of the reference clock $Clk_{Ref}$ at node A and phases of the local oscillator signal $CK_{DIV}$ at node B. It should be noted that local oscillator feedback clocks $CK_{DIV}$ correspond to the phases of the local oscillator ph0-ph3 described above. In some embodiments, the NANDs 1 and 5 may have integrated phase interpolators. In some embodiments, the durations for which the UP or DOWN output of the NAND PFD shown in FIG. 27 is high until the DOWN or UP signal goes high is indicative of a magnitude of the phase error between the signals provided at inputs A and B. Thus, while interphase comparisons (e.g., phase 045 of the local oscillator signal compared to phase 000 of the local oscillator signal) may provide constant large error results, other interphase comparisons may provide equal-but-opposite error results that effectively cancel out in a locked condition. For example, a first comparison between ph045 and ph000 may provide a large "late" indication, while a second comparison between ph045 and ph090 may provide a large "early" indication, the two errors cancelling out. If the first comparison produces a higher magnitude error result than the second comparison, then a quadrature error may exist and the delay stages of the local oscillator may be updated accordingly. It should be noted that while FIGS. 27 and 30 show NAND and NOR based PFDs, respectively, other magnitude-indicative phase detectors may be used as well, such as an XOR phase comparator. FIG. 31 illustrates the outputs of three XOR type magnitude-indicative phase detectors for comparisons of phase 000 to phases 045, 090, and 135. As shown, in a lock condition, the duration of the three XORs being '1' vs '0' averages to be zero. The average is illustrated by the shaded waveform at the bottom of the figure. As shown, the integral of the shaded waveform is 0, and thus the system is in a locked condition. If one of the phases where early or late, then a quadrature mismatch would indicate a non-zero average error. Such a scenario is illustrated in FIG. 32. FIG. 32 is a similar timing diagram, however phase 090 has an error and is transitioning too early. As shown, the erroneous phase 090 causes the integral of the shaded waveform to be non-zero. After low-pass filtering, the phase-specific quadrature error signal produced by the interphase matrix comparator would provide a DC signal having a negative value. The phase-specific quadrature error signal may be used for adjusting the delay stage generating phase 000 to increase frequency in order to advance the rising edge of phase 000. Such an increase in frequency would be detected by the loop error signal, which in some embodiments may slow down all of the delay stages uniformly. Similar measurements are made on the other phases of the local oscillator signal until the local oscillator reaches a locked condition.

Figure 28:
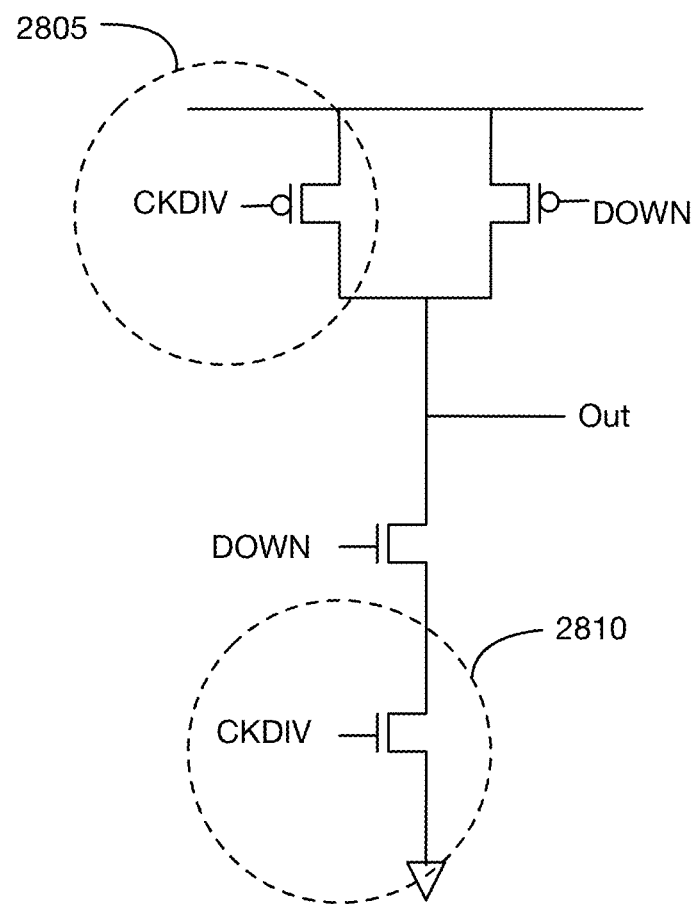
FIG. 28 is a diagram of a transistor-level NAND gate with an integrated phase interpolator (PI), in accordance with some embodiments.
Figure 29A:
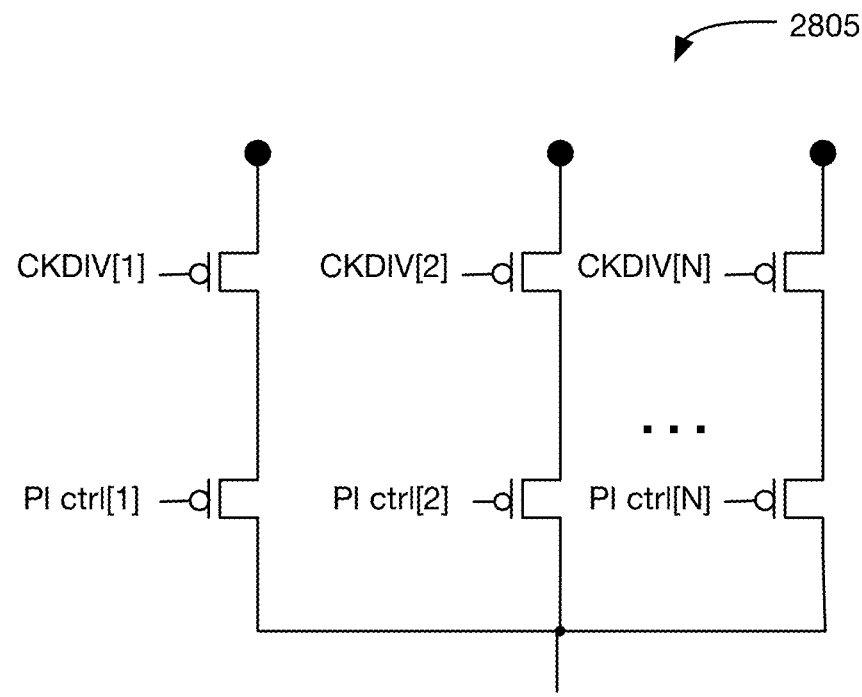
FIGS. 29A and 29B are schematics of PIs integrate into NMOS and PMOS transistor branches, respectively, in accordance with some embodiments.
Figure 29B:
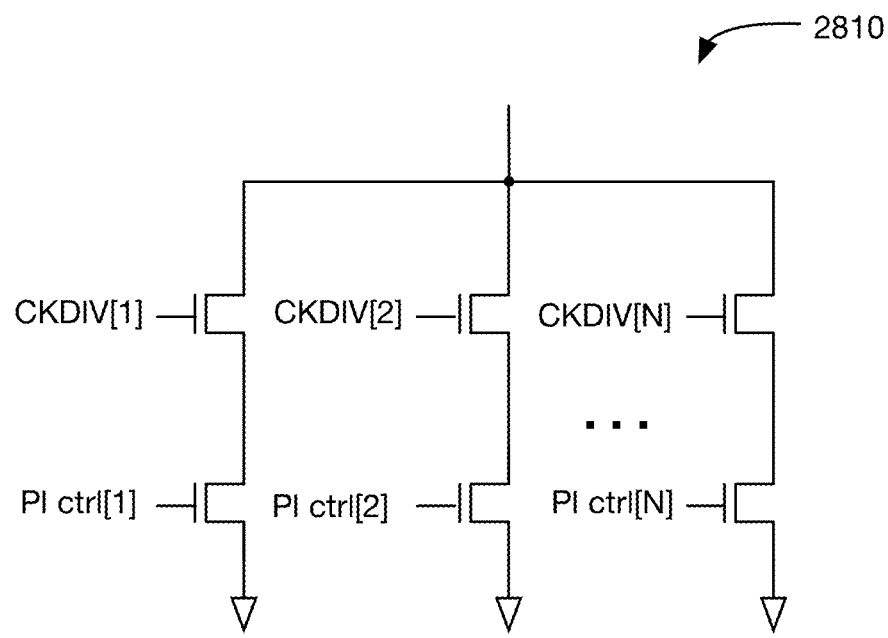

FIG. 28 is a transistor implementation of a NAND gate, in accordance with some embodiments, that may replace one or both of NAND gates 1 and 5 shown in FIG. 27. As with the earlier example of FIG. 7, replacement of both NAND gates helps to maintain consistent parasitic load characteristics and thus operational symmetry. The signals CKDIV and DOWN in FIG. 28 correspond to the NAND gate 5 inputs in FIG. 27; the comparable signals when FIG. 28 replaces NAND gate 1 of FIG. 27 are CKREF and UP. As shown, the NAND gate replacement may also include integrated PIs for branches 2805 and 2810 in one or both NAND gate replacement instances. FIGS. 29A and 29B illustrate such substitution within a replacement for NAND gate 5 branches 2805 and 2810, respectively, in accordance with some embodiments. As shown, PMOS branch 2805 includes a first row of parallel transistors, each transistor configured to receive a respective local oscillator phase. Further, there is a row of transistors configured to receive a series of PI control signals, one example being PI ctrl[1:16], each such signal weighing its associated local oscillator phase, the summation of all such weighted signals representing an output signal having an interpolated phase between the local oscillator phases. As in the previous phase interpolation examples of FIGS. 5, 6A/6B, 7A/7B, etc. the PI control signals are analog values, in the illustrated embodiment of FIG. 28, each such control signal being generated by the Digital to Analog conversion of sixteen digital bits, thus the labeling notation PIctrl[1:16]. Again, as in the previous examples no limitation is implied, either in the means of generating phase control signals, nor the effective resolution or control range of such generation.

As shown, each pair of adjacent phases has opposing NMOS and PMOS transistors for receiving each PI control signal, providing an inverse relationship with regards to the amount contributed by each phase. A similar configuration for an NMOS branch is shown in 2810. In some embodiments, a similar concept may be implemented using a NOR style PFD, as shown in FIG. 30.

Alternative Embodiments

The clock signal received from MIC5 in FIG. 2 after being transported over two dedicated clock wires could just as easily be received from, as one example MIC4, having been transported as one subchannel of the vector signaling code also carrying the data. This method of embedding the clock in a vector signaling code subchannel is described in [Shokrollahi II] and [Holden III]. All of the described clock embedding embodiments therein may be beneficially combined with the PLL and timing control mechanisms described herein, without limitation.

Similarly, known methods of communicating a clock signal using edge transitions of the data lines may be combined with the PLL and timing control mechanisms described herein. In particular, vector signaling codes with guaranteed transition density over time, such as taught by [Shokrollahi I] are amenable to such combination.

The invention claimed is:
1. A method comprising:
obtaining a plurality of phases of a local oscillator signal;
generating a plurality of phase-specific quadrature error signals, each phase-specific quadrature error signal generated as a summation of a plurality of interphase comparison signals formed as interphase comparisons between a respective phase of the local oscillator signal to two or more other phases of the plurality of phases of the local oscillator signal; and
providing each phase-specific quadrature error signal to a control input of a respective delay stage in a plurality of cascaded delay stages, the phase-specific quadrature error signal adjusting a delay value of the respective delay stage in accordance with a non-zero average error in the phase-specific quadrature error signal.

2. The method of claim 1, further comprising generating a loop error signal in response to adjusting the delay value of the respective delay stage, the loop error signal formed by comparing a reference clock signal to one or more phases of the local oscillator signal.

3. The method of claim 2, wherein the loop error signal comprises a plurality of phase-specific loop error signals, each phase-specific loop error signal associated with a corresponding phase of the plurality of phases of the local oscillator signal, and wherein generating each phase-specific loop error signal comprises comparing the corresponding phase of the local oscillator signal to one or more phases of the reference clock signal.

4. The method of claim 3, wherein generating each phase-specific loop error signal comprises comparing the corresponding phase of the local oscillator signal to a single corresponding phase of the reference clock signal.

5. The method of claim 3, further comprising providing each phase-specific loop error signal to a corresponding delay stage of the plurality of delay stages.

6. The method of claim 2, wherein the loop error signal is an aggregate loop error signal, and wherein generating the aggregate loop error signal comprises comparing all phases of the local oscillator signal to one or more phases of the reference clock signal.

7. The method of claim 6, further comprising providing the aggregate loop error signal to each delay stage in the plurality of delay stages in the local oscillator.

8. The method of claim 1, wherein the plurality of interphase comparison signals are current mode outputs generated using logic XOR gates.

9. The method of claim 1, wherein adjusting the delay value of the respective delay stage comprises adjusting an output node capacitance of the respective delay stage.

10. The method of claim 1, wherein adjusting the delay value of the respective delay stage comprises adjusting a supply current of the respective delay stage.

11. An apparatus comprising:
an interphase matrix comparator configured to receive a plurality of phases of a local oscillator signal and to responsively generate a plurality of phase-specific quadrature error signals, each phase-specific quadrature error signal generated as a summation of a plurality of interphase comparison signals formed as interphase comparisons between a respective phase of the local oscillator signal to two or more other phases of the plurality of phases of the local oscillator signal; and
a local oscillator comprising a plurality of delay stages configured to generate the plurality of phases of the local oscillator signal, the local oscillator configured to receive each phase-specific quadrature error signal at a respective delay stage of the plurality of delay stages, each phase-specific quadrature error signal configured to adjust a delay value of the respective delay stage responsive to a non-zero average error in the phase-specific quadrature error signal.

12. The apparatus of claim 11, further comprising a loop error matrix comparator configured to generate a loop error signal in response to an adjustment of the delay value of the respective delay stage, the loop error signal formed by comparing a reference clock signal to one or more phases of the local oscillator signal.

13. The apparatus of claim 12, wherein the loop error signal comprises a plurality of phase-specific loop error signals, each phase-specific loop error signal associated with a corresponding phase of the plurality of phases of the local oscillator signal, and wherein the loop error matrix comparator is configured to compare the corresponding phase of the local oscillator signal to one or more phases of the reference clock signal to generate each phase-specific loop error signal.

14. The apparatus of claim 13, wherein the loop error matrix comparator is configured to compare the corresponding phase of the local oscillator signal to a single corresponding phase of the reference clock signal to generate each phase-specific loop error signal.

15. The apparatus of claim 13, wherein each phase-specific loop error signal is provided to a corresponding delay stage of the plurality of delay stages.

16. The apparatus of claim 12, wherein the loop error signal is an aggregate loop error signal, and wherein the loop error matrix comparator is configured to compare all phases of the local oscillator signal to one or more phases of the reference clock signal to generate the aggregate loop error signal.

17. The apparatus of claim 16, wherein the loop error matrix comparator is further configured to provide the aggregate loop error signal to every delay stage in the plurality of delay stages in the local oscillator.

18. The apparatus of claim 11, wherein the interphase matrix comparator comprises a plurality of logic XOR gates configured to generate the plurality of interphase comparison signals as current mode outputs.

19. The apparatus of claim 11, wherein the phase-specific quadrature error signal is configured to adjust an output node capacitance of the respective delay stage to adjust the delay value of the respective delay stage.

20. The apparatus of claim 11, wherein the phase-specific quadrature error signal is configured to adjust a supply current of the respective delay stage to adjust the delay value of the respective delay stage.

* * * * *